(12) United States Patent
Nagase et al.

(10) Patent No.: US 6,605,854 B2
(45) Date of Patent: Aug. 12, 2003

(54) SCHOTTKY DIODE WITH BUMP ELECTRODES

(75) Inventors: Hiroyuki Nagase, Ryuuou (JP); Shuichi Suzuki, Ichikawadaimon (JP); Masaki Otoguro, Kofu (JP); Yasuharu Ichinose, Ryuuou (JP); Teruhiro Mitsuyasu, Ryuuou (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/046,988

(22) Filed: Jan. 17, 2002

(65) Prior Publication Data
US 2002/0102804 A1 Aug. 1, 2002

(30) Foreign Application Priority Data

Feb. 1, 2001 (JP) .................. 2001-025118
Dec. 13, 2001 (JP) .................. 2001-379966

(51) Int. Cl.[7] ............................. H01L 27/095
(52) U.S. Cl. ................ 257/476; 257/480; 257/602; 257/737
(58) Field of Search ................ 257/476, 480, 257/602, 737, 778

(56) References Cited

U.S. PATENT DOCUMENTS 5,258,640 A * 11/1993 Hsieh et al. ............ 257/471
6,008,527 A * 12/1999 Kasahara ............... 257/656
2002/0121672 A1 * 9/2002 Bollig et al. ............ 257/480

FOREIGN PATENT DOCUMENTS

JP       2000-150918       5/2000

OTHER PUBLICATIONS

"Total Electronics Parts Handbook," edited by Electronic Industries Associate of Japan, issued by Denpa Shimbunsha, May 20, 1984, p. 179 (with English translation).

* cited by examiner

Primary Examiner—Richard Elms
Assistant Examiner—Christian D. Wilson
(74) Attorney, Agent, or Firm—Miles & Stockbridge P.C.

(57) ABSTRACT

The package size of a diode is made smaller. On the element forming face of a semiconductor substrate having a $p^-$-type conductive type, after a hyper-abrupt $p^+n^+$ junction of a $p^+$-type diffusion layer, an $n^+$-type hyper-abrupt layer, an $n^-$-epitaxial layer, an n-type low resistance layer and an $n^+$-type diffusion layer is formed, an anode electrode is formed on the top of the $p^+$-type diffusion layer and a cathode electrode is formed on the top of the $n^+$-type diffusion layer. Thereafter, electrode bumps are formed on the top of the anode electrode and the cathode electrode to thereby manufacture a small diode that can be facedown bonded onto a mounting board.

20 Claims, 60 Drawing Sheets

SCHOTTKY DIODE WITH BUMP ELECTRODES

BACKGROUND OF THE INVENTION

The present invention relates to a semiconductor device and a manufacturing method thereof. In particular, the present invention relates to an effective technique to be applied to make the outer shape of a semiconductor device smaller and thinner.

In recent years, mobile communication equipment such as digital cellular phones or the like, and high-speed data communication equipment, and the like have been required to be small, thin and lightweight, low power consumption, a high frequency, and multi bands. For this reason, a high-frequency module such as an antenna switch module and a voltage controlled oscillator module and the like constituting a key component in the above-mentioned mobile communication equipment and high-speed data communication equipment and the like has been smaller, thinner and more lightweight. For the purpose of improving the high-frequency characteristic, plural high-frequency modules have been combined.

In response to reduction in the size of the high-frequency module, various diodes including a variable capacitance diode, a PIN diode, a Schottky diode used in the high-frequency module are required to be small. In the conventional package of these diodes, for example, there is prepared a lead frame having leads in which each anode side and each cathode side are paired and are opposite to each other; a back electrode of a semiconductor chip on which a diode element is formed is adhered to an inner end portion (tab) of each lead in the anode side or the cathode side; a front electrode of the semiconductor chip and an inner end portion (post) of the other lead opposite to each lead described above is connected by wire bonding using an Au (gold) wire; and the semiconductor chip, the wire and the pair of leads described above are resin-sealed with a resin material to provide a resin package. In this manner, in the conventional diode, one electrode is formed on the front face of the semiconductor chip and the other electrode is formed on the back face of the semiconductor chip, and the front electrode of the semiconductor chip is connected to each lead by a wire.

These above-mentioned diode construction is described in, for example, "Total Electronic Parts Handbook", p.179, edited by Electronic Industries Association of Japan which is issued by Denpa Shimbun-sha on May 20, 1984.

SUMMARY OF THE INVENTION

The present inventors have found that the above-mentioned diode has the following problems.

That is, when the front electrode of the semiconductor chip on which a diode element is formed and the post side of the lead are connected by wire bonding, such a wire loop shape that a wire is expanded upward is formed. Further, since the semiconductor chip, the wire and the leads are resin-sealed, there arise such a problem that the wire with a wire loop shape, the leads connected to the wire, and the resin used for resin sealing hinder a package size reduction in a height (thickness) direction and the plane size of the package.

To solve the above-mentioned problems, for example, measures for reducing the thickness of the diode package can be considered by reducing the thickness of the semiconductor chip, the thickness of the resin and the height of the wire loop shape. However, a manufacturing facility must be improved to enhance the processing accuracy of respective materials, and cost required to update the manufacturing facility is reflected on the manufacturing cost of the diode. Therefore, there arises such a problem that it is difficult to make the diode package small at low cost.

In the above-mentioned diode, since the front electrode of the semiconductor chip and the post side of each lead are connected by wiring bonding using a wire, it is difficult to reduce inductance of the wire and each lead and to lower the capacitance between the leads that are paired. For this reason, there arises such a problem that the conventional diode described above limits reduction of loss during operation in a high-frequency region.

As an invention for reducing the cost and size of the diode, there is the invention disclosed in Japanese Patent Laid-Open No. 2000-150918. In this reference cited, an opening hole portion, is formed which reaches to an n-type semiconductor substrate as a lower layer portion, from these surface of a semiconductor chip on which a diode element is formed, and then, in the inside of the opening hole portion, an extraction electrode (cathode electrode) extending from the above-mentioned n-type semiconductor substrate to the surface of the semiconductor chip is formed. This discloses a diode technique in which, together with a front electrode (anode electrode) electrically connected to a p-type semiconductor region that is an upper layer portion, both the anode and cathode electrodes are formed on the same surface of the semiconductor chip, and both the anode electrode and the cathode electrode are facedown bonded without using any wires and leads.

In the case where the semiconductor chip is mounted by facedown bonding using the diode technique described in the above reference cited, the connection stats of mounting cannot be confirmed. Therefore, it can be considered to employ a so-called self-alignment mounting method which automatically corrects each connection position of both the above-mentioned anode and cathode electrodes by the surface tension of solder melted. Here, the diode is mounted by connecting both anode and cathode electrodes to the mounting board by means of solder. In the case where the solder shapes or the soldering areas to be formed on both the anode and cathode electrodes are different, it has been found that the surface tensions of the solders melted in both the electrodes are different in strength and the diode chip is upright, so that a phenomenon is caused in which one of the electrodes may be removed from the mounting board. In the technique described in the above reference cited, however, recognition of such a phenomenon and consideration thereto have not been made.

In the above publication, improvement of the high-frequency characteristic of the diode is not described.

An object of the present invention is to provide a technique for reducing the package size of a semiconductor device at low cost.

Another object of the present invention is to provide a technique for reducing loss during operation in the high-frequency region of the semiconductor device.

A further object of the present invention is to provide a technique for preventing mounting failure of a semiconductor device mounted by facedown bonding.

The foregoing and other objects and novel characteristics of the present invention will be apparent from the description of the present specification and the accompanying drawings.

An overview of the representative inventions disclosed in this application will be briefly described as follows.

In other words, the present invention includes:

(a) a diode having a cathode electrode and an anode electrode over one main surface of a semiconductor substrate; and (b) said cathode electrode having a plane area larger than the anode electrode.

In addition, the present invention includes:

(a) a diode having a cathode electrode and an anode electrode over one main surface of a semiconductor substrate;

(b) a plurality of electrode bumps which is connected to the cathode electrode and the anode electrode, respectively, and which is provided on said one main surface; and (c) said plurality of electrode bumps which is symmetrically arranged in said one main surface of the semiconductor substrate.

Further, the present invention includes the steps of: preparing a semiconductor substrate having one main surface and the other main surface opposite thereto and having a first conductive type epitaxial layer; selectively forming, in said epitaxial layer, a region extending from said one main surface to said other main surface; selectively forming, in said epitaxial layer, a second conductive type high-density region extending from said one main surface into said epitaxial layer and separated from said first conductive type high-density region; forming a cathode electrode electrically connected to said first conductive type high-density region and an anode electrode electrically connected to said second conductive type high-density region in such a state as to be insulated from each other; and forming electrode bumps electrically connected to the cathode electrode and electrode bumps electrically connected to the anode electrode.

DETAILED DESCRIPTION OF THE PREFERRED EMBODIMENTS

Embodiments of the present invention will be described below in detail based on the drawings. Through all the drawings for explaining the embodiments, members having the same function are indicated by the same numerals, and the repeated explanation thereof will be omitted.

First Embodiment

A semiconductor device of a first embodiment is a variable capacitance diode used in an antenna switch module such as mobile communication equipment and high-speed data communication equipment, or a high-frequency module such as a voltage controlled oscillator module and the like, and can be used at the time of being mounted on a mounting board by Facedown bonding.

Figure 1:
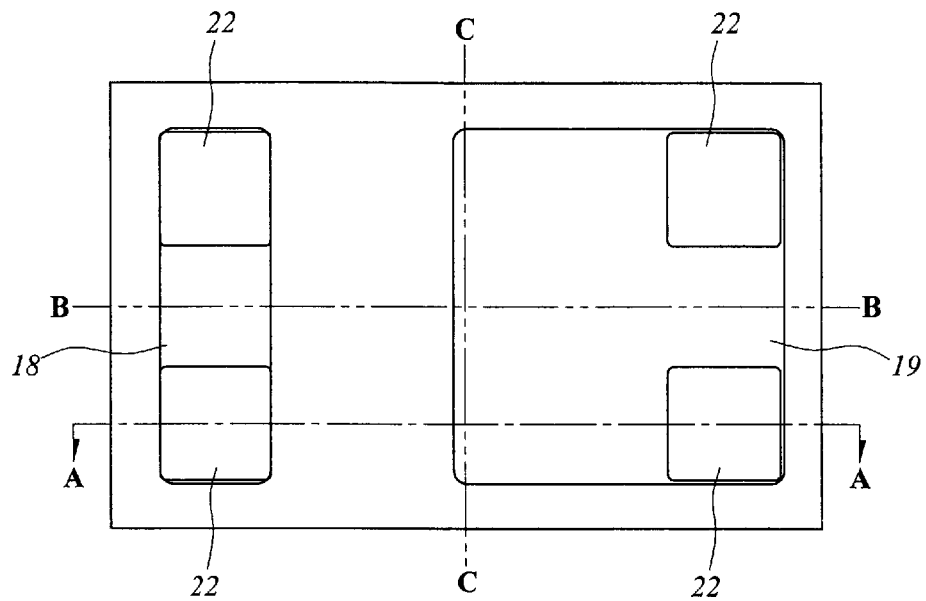
FIG. 1 is a plan view showing an essential part of a semiconductor device that is a first embodiment of the present invention.
Figure 2:
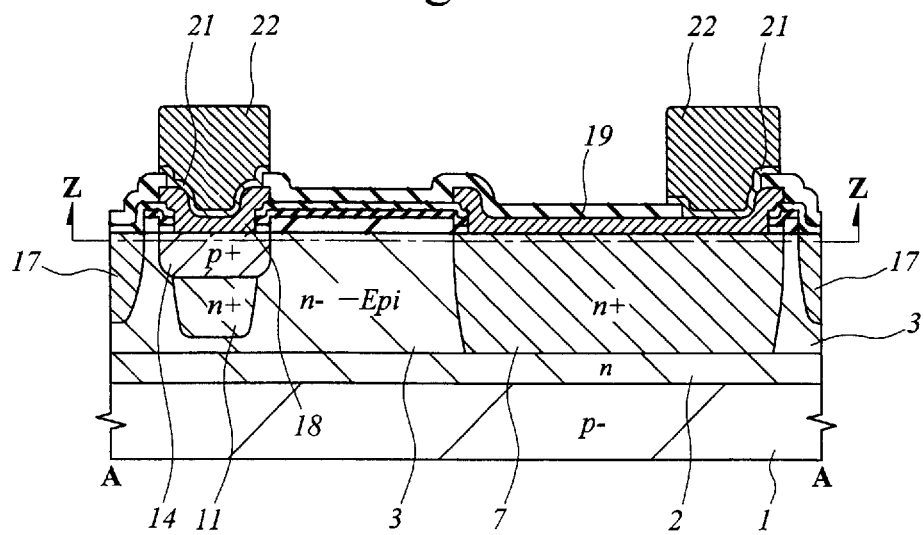
FIG. 2 is a cross-sectional view showing an essential part of the semiconductor device taken along line A—A of FIG. 1.
Figure 3:
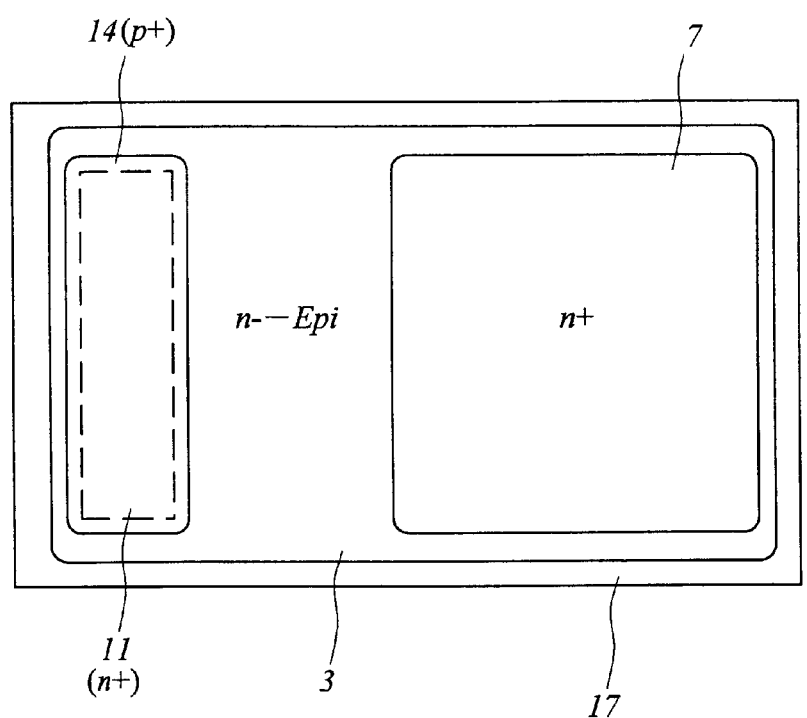
FIG. 3 is a plan view showing an essential part of the semiconductor device taken along line Z—Z of FIG. 2.

FIG. 1 is a plan view showing the variable capacitance diode of the first embodiment. FIG. 2 is a cross-sectional view taken along line A—A of FIG. 1. FIG. 3 is a plan view taken along line Z—Z of FIG. 2.

On the main surface (element forming face) of a semi-conductor substrate (semiconductor substratum) 1 having a p$^-$-type conductive type, an n-type (a first conductive type) low resistance layer 2 (semiconductor layer) is formed. An n$^-$-type epitaxial layer 3 (a first semiconductor layer) is formed on the top of the n-type low resistance layer 2. On the n$^-$-type epitaxial layer 3, an n$^+$-type diffusion layer (cathode (high-density) region) 7 (a second semiconductor layer), an n$^+$-type hyper-abrupt layer 11 (a third semiconductor layer), a channel stopper layer 17, and a p$^+$-type (a second conductive type) diffusion layer (anode (high-density) region) 14 (a fourth semiconductor layer) are formed. The n$^+$-type diffusion layer 7 reaches to the surface of the n-type low resistance layer 2 from the surface of the n$^-$-type epitaxial layer 3. The p$^+$-type diffusion layer 14, the n$^+$-type hyper-abrupt layer 11, then$^-$-type epitaxial layer 3, the n-type low resistance layer 2, and the n$^+$-type diffusion layer 7 form a hyper-abrupt p$^+$n$^+$ junction. The distance between the n$^+$-type diffusion layer 7 and the p$^+$-type diffusion layer 14 is larger than the thickness of the n$^-$-type epitaxial layer 3. This can prevent a yield phenomenon between the n$^+$-type diffusion layer 7 and the p$^+$-type diffusion layer 14 from occurring.

An anode electrode 18 (a second electrode) coming in contact with the p$^+$-type diffusion layer 14 is formed on the top of the p$^+$-type diffusion layer 14. A cathode electrode 19 (a first electrode) coming in contact with the n$^+$-type diffusion layer 7 is formed on the top of the n$^+$-type diffusion layer 7. The anode electrode 18 and the cathode electrode 19 are formed of a metal film such as an aluminum (Al) alloy or W (tungsten) or the like.

The contact area of the cathode electrode 19 and the n$^+$-type diffusion layer 7 is constituted to be as large as possible in comparison with that of the anode electrode 18 and the p$^+$-type diffusion layer 14. In other words, by obtaining the cathode electrode wider (larger) possible than the anode electrode within the limited chip size, the high-frequency resistance is lowered to improve the high-frequency characteristic of the diode.

On the top of the anode electrode 18 and the cathode electrode 19, each electrode bump 22 is formed via an under bump metal 21 made of a Ti (titanium)—Pd (palladium) film.

The electrode bumps 22 are disposed in four corners of one main surface of the semiconductor chip on which the variable capacitance diode of the first embodiment is formed, and are symmetrically arranged relative to line B—B (see FIG. 1) and line C—C (see FIG. 1), respectively. In other words, the electrode bumps 22 are symmetrically arranged in a vertical and horizontal directions on the main surface of the semiconductor chip on which the variable capacitance diode of the first embodiment is formed. The four electrode bumps 22 have the same top surface shape and the same area. Respective heights from the back face of the semiconductor substrate 1 to the top surface of the four electrode bumps 22 are all the same. A term "the same" described herein includes an error or the like such as a production error of a manufacturing apparatus used for forming the electrode bumps 22. Each area of the electrode bump 22 on the main surface (plane) of the semiconductor substrate 1 is relatively smaller than an area of the cathode area 19.

In the variable capacitance diode of the first embodiment shown in FIGS. 1 to 3, a pair of leads and a bonding wire (hereinafter, referred to simply as a wire) which electrically connect the front electrode (anode electrode) of the semiconductor chip and the lead are not used. In the case where such a variable capacitance diode of the first embodiment is directly mounted on the mounting board by facedown bonding, sealing with, for example, a resin material or the like is not made. In addition, in the variable capacitance diode of the first embodiment, the thickness of the semiconductor substrate 1 can be optionally processed according to the specifications. For this reason, the variable capacitance diode of the first embodiment can be smaller in a height direction (a thickness direction of the semiconductor substrate 1) and in a plane direction than the conventional diode.

In the variable capacitance diode of the first embodiment, no use of wires and leads are required. It is unnecessary to consider influence on inductance and capacitance caused in the wires and leads. Therefore, by using the variable capacitance diode of the first embodiment, the inductance and capacitance caused during high-frequency operation can be reduced. This can reduce loss caused by the inductance and capacitance and enhance a high-frequency characteristic within several GHz band. Such a variable capacitance diode of the first embodiment is advantageous when used for high frequency, and is particularly effective when used for a high-frequency module.

In the variable capacitance diode of the first embodiment, the four electrode bumps 22 having the same top surface shape and the same area are symmetrically arranged in the vertical and horizontal directions on one main surface of the semiconductor chip. This can prevent difference of the surface tension caused by solder melted in the respective electrode bumps 22 from occurring when the variable capacitance diode of the first embodiment is mounted on the mounting board by a self-alignment mounting method. In other words, it is possible to prevent occurrence of mounting failure due to a phenomenon caused by the surface tension difference, the phenomenon being such that one of the electrodes is removed from the mounting board.

Figure 4:
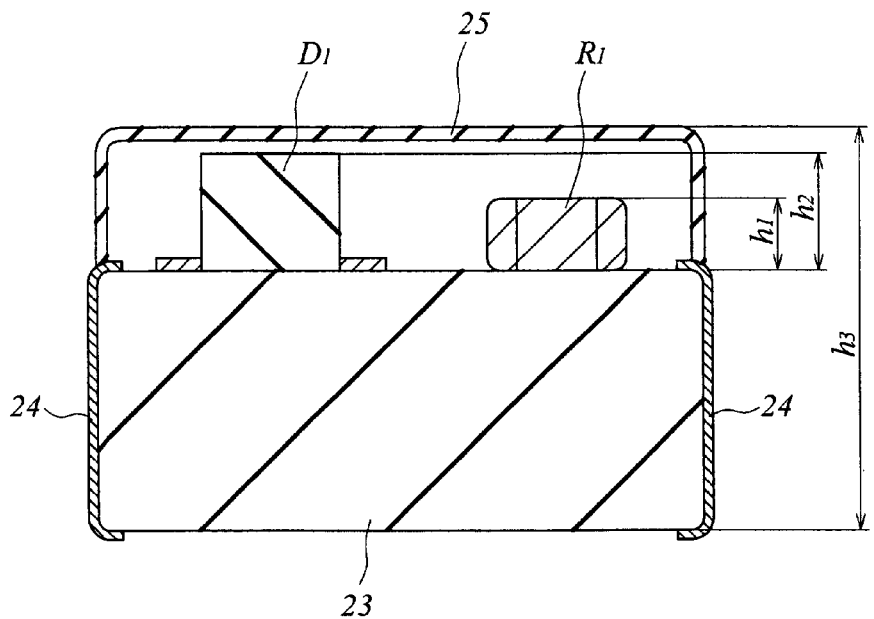
FIG. 4 is a cross-sectional view showing an essential part of a high-frequency module when the conventional diode and chip resistor are mounted on a mounting board.
Figure 5:
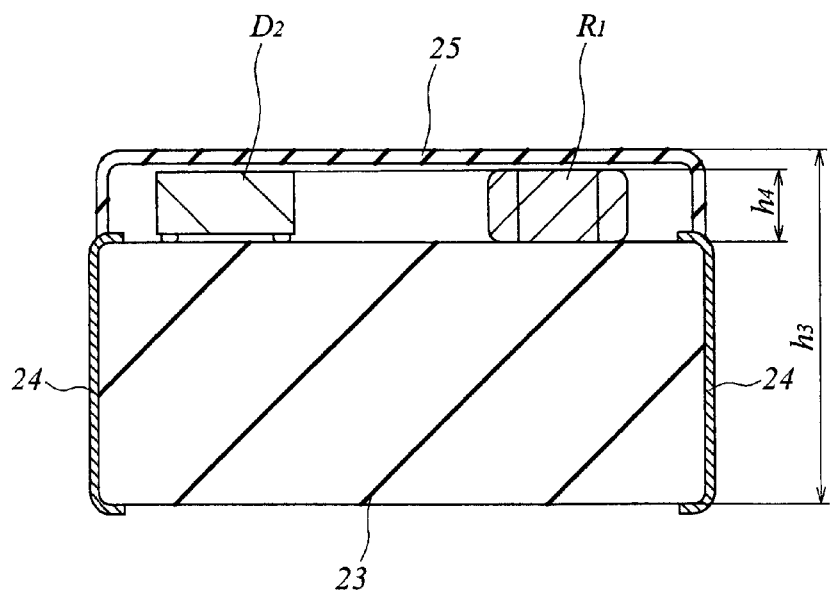
FIG. 5 is a cross-sectional view showing an essential part of a high-frequency module when the semiconductor device shown in FIGS. 1 to 3 and a chip resistor are mounted on a mounting board.

Thereupon, the present inventors have compared the case where the conventional variable capacitance diode is mounted on a mounting board to form a high-frequency module, with the case where the variable capacitance diode $D_2$ of the first embodiment is mounted on a mounting board by facedown bonding to form a high-frequency module. FIG. 4 is a cross-sectional view showing an essential part of the high-frequency module in which the conventional variable capacitance diode $D_1$ is mounted on a mounting board 23. FIG. 5 is a cross-sectional view showing an essential part of the high-frequency module in which the variable capacitance diode $D_2$ of the first embodiment is mounted on the mounting board 23. These variable capacitance diodes $D_1$ and $D_2$ are electrically connected to an electrode terminal 24 via a wiring line (not shown) formed on the surface or in the inside of the mounting substrate. Herein, the variable capacitance diodes $D_1$ and $D_2$ have the same characteristic. A chip resistor $R_1$ having a height $h_1$ of about 0.3 mm is mounted on the mounting board 23. The chip resistor $R_1$ and the electrode terminal 24 are electrically connected via a wiring line (not shown) formed on the surface or in the inside of the mounting substrate. The mounting face of such a mounting board 23 is covered with a shielding case 25.

In the case where the conventional variable capacitance diode $D_1$ is manufactured according to the specifications of the above-mentioned high-frequency module, a height $h_2$ thereof is about 0.55 to 0.6 mm. A height $h_3$ of the high-frequency module (the height from the lower surface of the mounting board 23 to the upper surface of the shielding case 25) is about 1.8 mm. In the case of the variable capacitance diode $D_2$ of the first embodiment, in which has the same characteristic as the variable capacitance diode $D_1$, a height $h_4$ thereof is about 0.3 mm and can have almost the same as the height $h_1$ of the chip resistor $R_1$. In other words, the variable capacitance diode $D_2$ of the first embodiment can be smaller in the height direction than the conventional variable capacitance diode $D_1$ having the same characteristic. As a result, the height $h_3$ of the high-frequency module equipped with the variable capacitance diode $D_2$ can also have about 1.8 mm or less, and so the high-frequency module can become small in the height direction.

In the conventional variable capacitance diode, by the influence on deformation diameter of the wire when the wire is bonded to the front electrode (anode electrode), diameter of the front electrode cannot be below the deformation diameter of the wire. For this reason, a pn junction area of the diode cannot be smaller than a size of the deformation diameter of the wire, and thereby the junction capacitance of the pn junction portion is difficult to make small. Further, since the pn junction area of the diode cannot be smaller than a size of the deformation diameter of the above-mentioned wire, a mounting area of the diode is difficult to make small, and mounting using the lead is a factor in hindering reduction in the mounting area.

In the variable capacitance diode of the first embodiment, the pn junction area of the diode can be optionally set because the wire is not used. According to experiments conducted by the present inventors, the conventional variable capacitance diode $D_1$ shown in FIG. 4 has, in two dimensions, a vertical side of about 0.8 to 0.6 mm and a horizontal side of about 1.4 to 1.6 mm while the variable capacitance diode $D_2$ of the first embodiment shown in FIG. 5 has, in two dimensions, a vertical side of about 0.5 mm or less and a horizontal side of about 1 mm. Moreover, since the variable capacitance diode $D_2$ of the first embodiment requires no wires and leads, the mounting area thereof can be smaller than that of the conventional variable capacitance diode. In other words, the high-frequency module equipped with both the variable capacitance diode $D_2$ of the first embodiment shown in FIG. 5 and other elements such as chip resistor and chip capacitor and the like can be made smaller not only in the height direction but also in the plane direction.

As described above, since the high-frequency module equipped with the variable capacitance diode of the first embodiment can be made smaller, plural high-frequency modules manufactured individually can be formed as one collected high-frequency module. In other words, when the one collected high-frequency module is used to manufacture mobile communication equipment or high-speed data communication equipment or the like, a housing thereof can be made smaller. Since plural high-frequency modules are collected, the number of parts can be reduced and the manufacturing cost of the mobile communication equipment or the high-speed communication equipment can be decreased.

By adopting one collected high-frequency module, it is possible to shorten the length of the wiring line which is formed in the inside or on the surface of the mounting board and which is electrically connected to the variable capacitance diode. In other words, without considering a variation in individual characteristic of the high-frequency module, it is possible to optimize the characteristic of the high-frequency module by altering or modifying only the inside of the high-frequency module. Since the length of the above-mentioned wiring line can be shortened, the high-frequency module can be made smaller and have higher performance.

However, the above-mentioned mobile communication equipment, for example, the cellular phone tends to increase liquid crystal displays thereof without changing each housing size thereof. In the case where the high-frequency module equipped with the above-mentioned variable capacitance diode of the first embodiment is fitted into mobile communication equipment, use of the above-mentioned high-frequency module formed by collecting plural high-frequency modules can increase respective sizes of the liquid crystal displays without changing each housing size.

Figure 6:
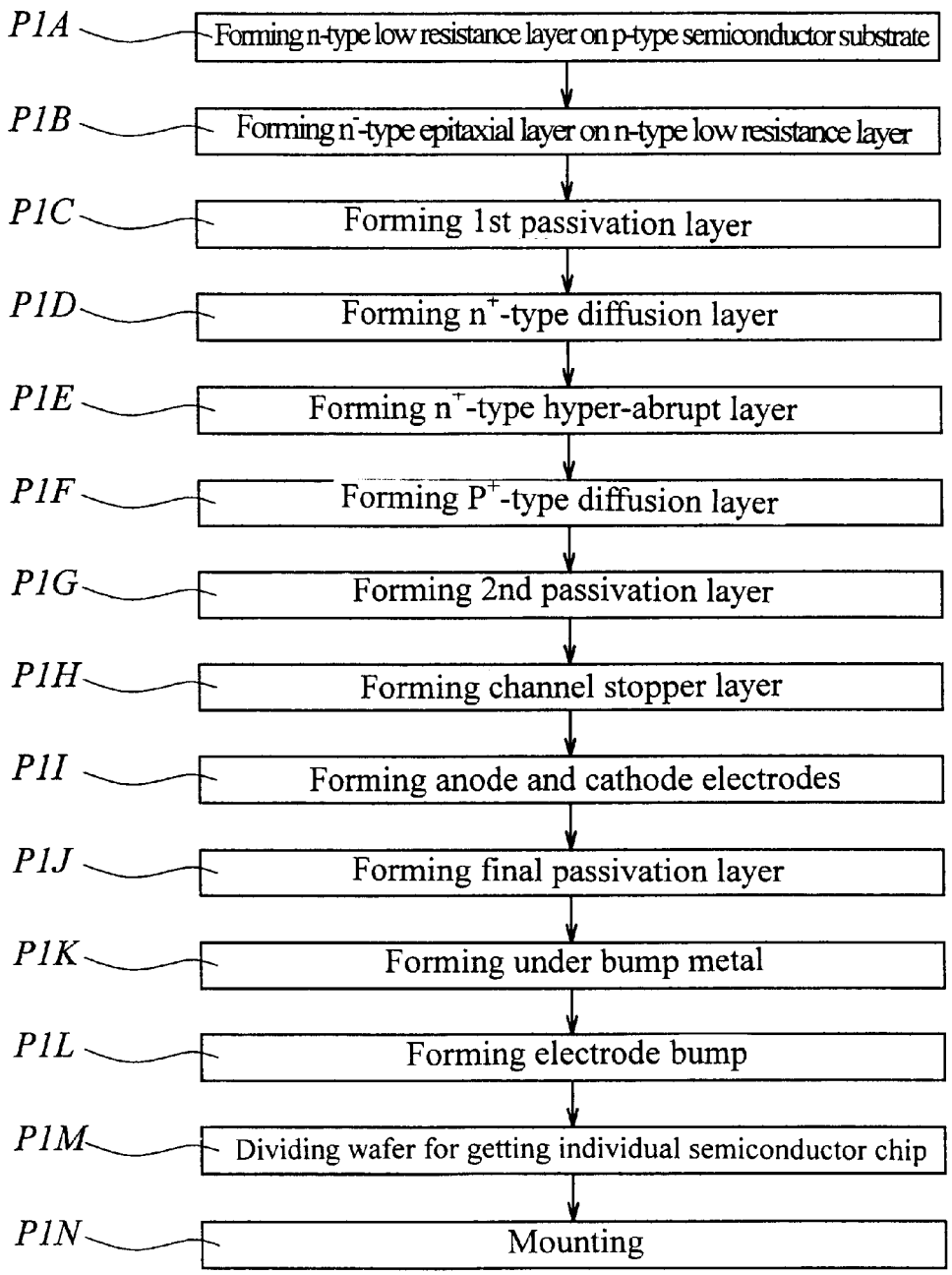
FIG. 6 is a manufacturing flowchart for explaining a manufacturing method of the semiconductor device shown in FIGS. 1 to 3.

FIG. 6 is a manufacturing flowchart showing one example of a manufacturing process of the variable capacitance diode that is the above-mentioned first embodiment. According to the manufacturing flowchart, a manufacturing method of the variable capacitance diode that is the first embodiment will be described hereinbelow.

In step P1A, arsenic (As) ions that are n-type impurities are doped into the semiconductor substrate 1 made of a single crystal silicon having a p-type conductive type arid a resistivity of about 10 cm. At this time, the doping amount of As ions is, for example, about $1 \times 10^{16}/cm^2$. Subsequently, the As ions doped into the semiconductor substrate 1 are diffused by subjecting the p-type semiconductor substrate 1 to an anneal treatment of about 1100° C. to form an n-type low resistance layer 2. Since As has a higher solid solubility in the semiconductor substrate 1 than other n-type impurities, the case of doping As can reduce the resistance of the n-type low resistance layer 2 in comparison with the case of doping other n-type impurities.

In the conventional diode, since the semiconductor substrate corresponds to the n-type low resistance layer 2 described above, the n-type semiconductor substrate is used. In manufacturing the n-type semiconductor substrate, As is doped when an ingot is manufactured as an n-type semiconductor substrate. Therefore, an As density is varied in the ingot, and thereby it is difficult to control the resistivity of the n-type semiconductor substrate. Since the As density is varied in the ingot, a portion is limited which can be taken out as an n-type semiconductor substrate from the ingot, and the other portions are wasteful so that this has been cause of increase in the manufacturing cost of the n-type semiconductor substrate.

In the variable capacitance diode of the first embodiment, as described above, As ions are doped into the p-type semiconductor substrate 1 to perform an anneal treatment, and thereby the n-type low resistance layer 2 is formed. For this reason, the resistivity of the n-type low resistance layer 2 can be easily controlled. When an ingot is manufactured as the semiconductor substrate 1, doping As is not required. Therefore, similarly to manufacturing of the n-type semiconductor substrate used in the above-mentioned vertical type diode, it is possible to prevent waste of the ingot manufactured as the semiconductor substrate 1. For this reason, the manufacturing cost of the variable capacitance diode of the first embodiment can be reduced.

Figure 7:
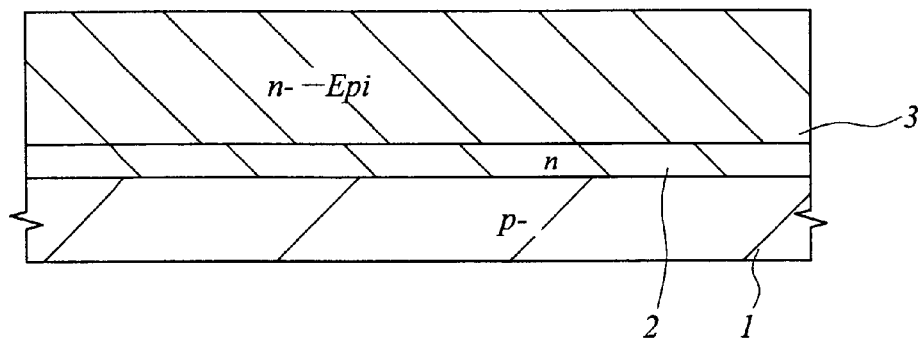
FIG. 7 is a cross-sectional view showing an essential part for explaining a manufacturing method of the semiconductor device shown in FIGS. 1 to 3.

In step P1B, a vapor-phase growth method is used to form an n-type epitaxial layer 3 on the n-type low resistance layer 2 (FIG. 7). This $n^-$-type epitaxial layer 3, for example, has a film thickness of about 3 $\mu$m and a resistivity of about 0.5 $\Omega$cm.

In step P1C, for example, a thermal oxidation method is used to form a silicon dioxide film 4 (a first insulating film), which has a film thickness of about 550 nm, on the surface of the $n^-$-type epitaxial layer 3. Next, a photolithograph resist layer 5 (a first masking layer) is formed on the silicon dioxide film 4. The silicon dioxide film 4 is etched by using the photolithograph resist layer 5 as a mask to form an opening part 6 for forming an $n^+$-type diffusion layer 7 in a next step.

In step P1D, a through film (not shown) for implanting ions is formed on the surface of the $n^-$-type epitaxial layer 3 exposed from the bottom of the opening part 6. Therefore, n-type impurities (for example, P (phosphorus)) are doped into the $n^-$-type epitaxial layer 3 exposed from the bottom of the opening part 6, by using the photolithograph resist layer 5 as a mask. At this time, for example, the doping amount of n-type impurities is about $1 \times 10^{16}/cm^2$. Then, a heat treatment of about 1100° C. is subjected to the semiconductor substrate 1 to diffuse the n-type impurities, and thereby to form the $n^+$-type diffusion layer 7 reaching to the n-type low resistance layer 2.

In forming the above-mentioned $n^+$ type diffusion layer 7, an area of the $n^+$-type diffusion layer 7 (the opening part 6) is designed to be as large as possible, in comparison with an area of a portion in which an anode electrode 18 to be formed in a later step contacted comes in contact with a $p^+$-type diffusion layer 14 (see FIG. 2), within a range of a size of the semiconductor chip (semiconductor substrate 1) on which the variable capacitance diode of the first embodiment is formed. This can reduce the contact resistance of the cathode electrode 19 and the $n^+$-type diffusion layer 7. In the case of using the variable capacitance diode of the first embodiment in a high-frequency module, a high-frequency resistance of the high-frequency module is in inverse proportion to the contact area of the cathode electrode 19 and the $n^+$-type diffusion layer 7. Therefore, by increasing the contact area as large as possible. The high-frequency resistance can be reduced.

Figure 8:
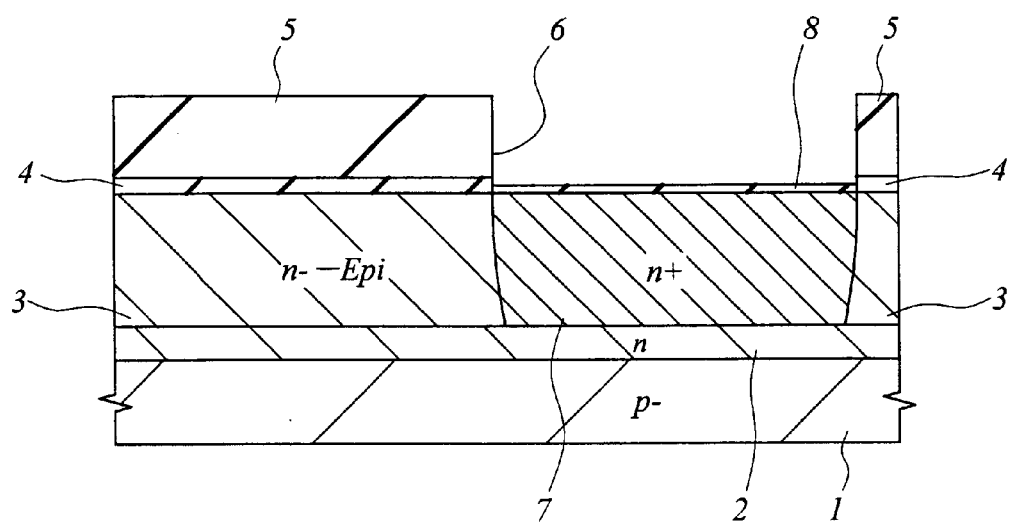
FIG. 8 is a cross-sectional view showing an essential part during a manufacturing process of the semiconductor device subsequent to FIG. 7.

Next, a silicon dioxide film 8 is formed on the surface of the $n^+$-type diffusion layer 7 by a thermal oxidation method (FIG. 8).

Then, the photolithograph resist layer 5 used for forming the n-type diffusion layer 7 is removed. Thereafter, in step P1E, a photolithograph resist layer 9 (a second masking layer) is formed on the semiconductor substrate 1. The silicon dioxide film 4 is etched by using the photolithograph resist layer 9 as a mask to form an opening part 10 for forming an $n^+$-type hyper-abrupt layer 11 to be formed in a next step.

Figure 9:
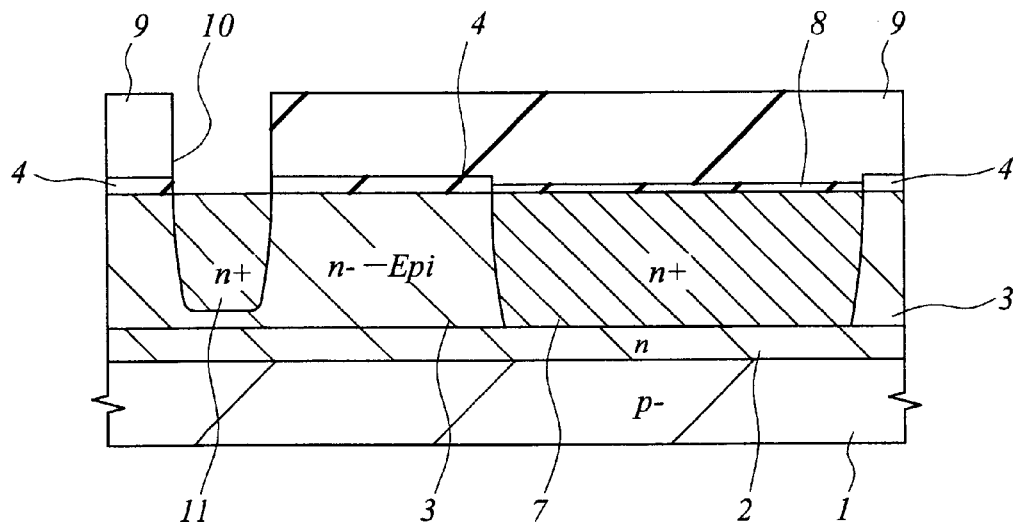
FIG. 9 is a Cross-sectional view showing an essential part during a manufacturing process of the semiconductor device subsequent to FIG. 8.

Then, a through film (not shown) for implanting ions is formed on the surface of the $n^-$-type epitaxial layer 3 exposed from the bottom of the opening part 10. Thereafter, by using the above-mentioned photolithograph resist layer as a mask, n-type impurities (for example, P (phosphorus)) are doped into the $n^-$-type epitaxial layer 3 exposed from the bottom of the opening part 10. At this time, the doping amount of n-type impurities is, for example, about $6 \times 10^{13}/cm^2$. A heat treatment of about 1000° C. is subjected to the semiconductor substrate 1 to diffuse the n-type impurities, and thereby to form the $n^3$-type hyper-abrupt layer 11 (FIG. 9).

Next, the photolithograph resist layer 9 used for forming the $n^+$-type hyper-abrupt layer 11 is removed. Therefore, in step P1F, a photolithograph resist layer 12 (a third masking layer) is formed over the semiconductor substrate 1. The silicon dioxide film 4 is etched by using the photolithograph resist layer 12 as a mask to form an opening part 13 for forming the $p^+$-type diffusion layer 14 to be formed in a next step.

Then, a through film (not shown) for implanting ions is formed on the surface of the $n^+$-type hyper-abrupt layer 11 exposed from the bottom of the opening part 13. Therefore, p-type impurities (for example. B (boron)) are doped into the $n^+$-type hyper-abrupt layer 11 exposed from the bottom of the opening part 13 by using the above-mentioned photolithograph resist layer 12 as a mask. At this time, the doping amount of p-type impurities is, for example, about $2 \times 10^{15}/cm^2$. Then, the semiconductor substrate 1 is subjected to an anneal treatment to diffuse the p-type impurities and thereby to form the $p^-$-type diffusion layer 14. This can form the hyper-abrupt $p^+n^+$ junction of the $p^+$-type diffusion layer 14, the $n^+$-type hyper-abrupt layer 11, the $n^-$-type epitaxial layer 3, the n-type low resistance layer 2, and the $n^+$-type diffusion layer 7.

In forming the above-mentioned $n^+$-type diffusion layer 7, the $n^+$-type hyper-abrupt layer 11 and the $p^+$-type diffusion layer 14, the distance between the $n^+$-type diffusion layer 7 and the $p^+$-type diffusion layer 14 is designed to be larger than the thickness of the $n^-$-type epitaxial layer 3. Moreover, at reverse bias to the hyper-abrupt $p^+n^+$ junction, a length of the depletion layer extending in a horizontal direction from the $p^+$-type diffusion layer 14 assumed from the impurities density of the $n^-$-type epitaxial layer 3 is designed to be as short as possible within such a range as not to shorten the distance between the $n^+$-type diffusion layer 7 and the $p^+$-type diffusion layer 14. The distance between the $n^+$-type diffusion layer 7 and the $p^+$-type diffusion layer 14 is, for example, about 0.5 mm. This can reduce the diffusion resistive value of the hyper-abrupt $p^+n^+$ junction part. Pressure resistance of the hyper-abrupt $p^+n^+$ junction part in the horizontal direction can be larger than the pressure resistance thereof in the vertical direction. In other words, it is possible to prevent deterioration in the characteristic of the variable capacitance diode of the first embodiment.

Figure 10:
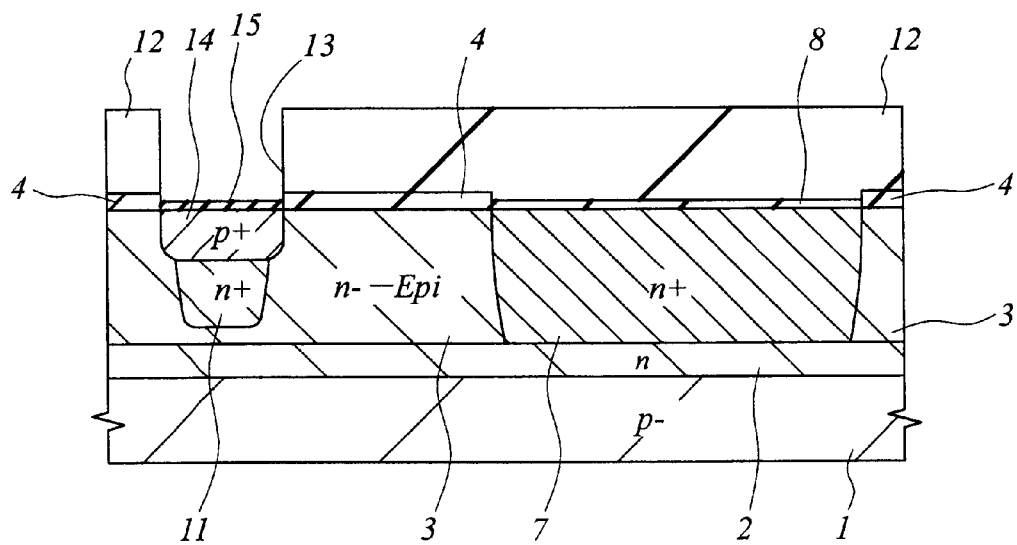
FIG. 10 is a cross-sectional view showing an essential part during a manufacturing process of the semiconductor device subsequent to FIG. 9.

A silicon dioxide film 15 is formed on the surface of the above-mentioned p-type diffusion layer 14 by a thermal oxidation method (FIG. 10).

Figure 11:
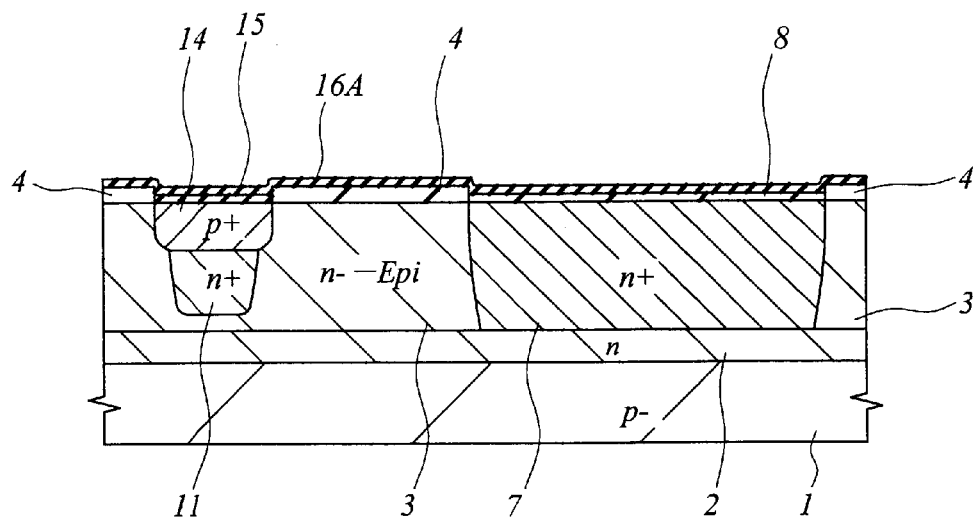
FIG. 11 is a cross-sectional view showing an essential part during a manufacturing process of the semiconductor device subsequent to FIG. 10.

Next, a photolithograph resist layer 12 used for forming the above-mentioned $p^+$-type diffusion layer 14 is removed. Therefore, in step P1G, a silicon dioxide film 16A is formed over the semiconductor substrate 1 by a thermal oxidation method (FIG. 11).

Then, the silicon dioxide film 16A is etched by using the photolithograph resist layer (not shown) as a mask, and an opening part is formed to form a channel stopper layer 17 over the peripheral portion of the semiconductor chip (the semiconductor substrate 1) on which the variable capacitance diode of the first embodiment is formed. Thereafter, by using the above-mentioned photolithograph resist layer as a mask, for example, P is doped from the opening part to form the channel stopper layer 17.

Figure 12:
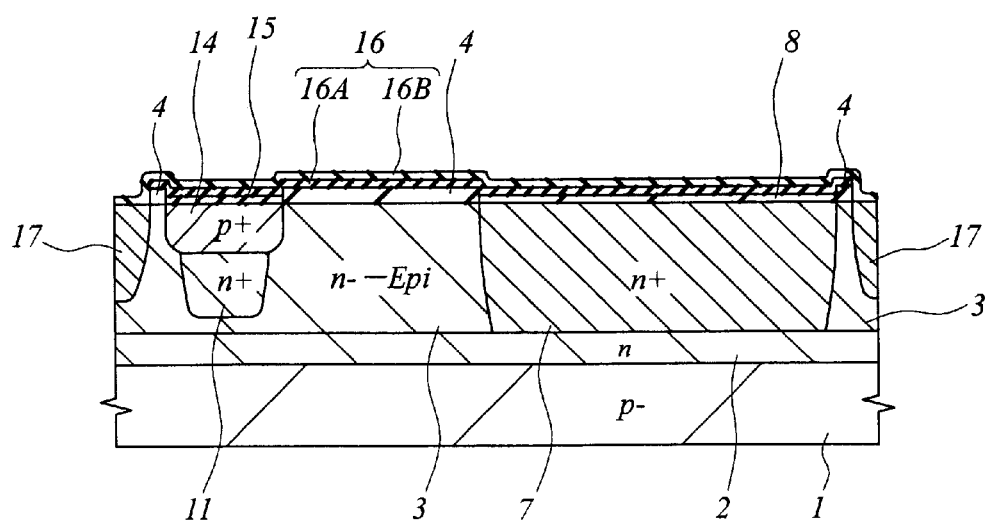
FIG. 12 is a cross-sectional view showing an essential part during a manufacturing process of the semiconductor device subsequent to FIG. 11.

Next, the photolithograph resist layer used for forming the channel stopper layer 17 is removed. Thereafter, in step P1H, a PSG (Phospho Silicate Glass) film 16B is deposited by, for example, a CVD method to thereby form a 2nd passivation layer 16 made of the silicon dioxide film 16A and the PSG film 16B (FIG. 12).

Figure 13:
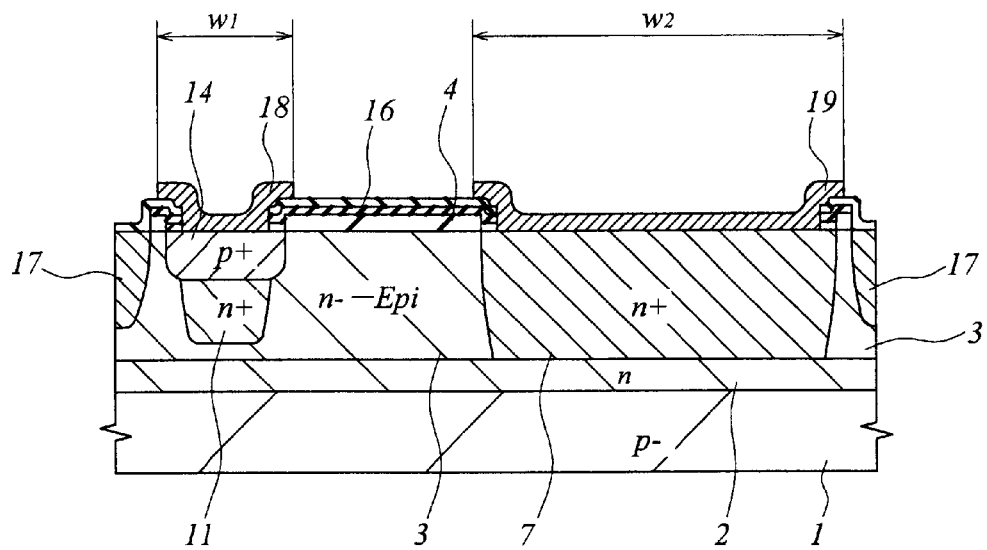
FIG. 13 is a cross-sectional view showing an essential part during a manufacturing process of the semiconductor device subsequent to FIG. 12.

Next, in step P1I, the 2nd passivation layer 16 is etched by using the photolithograph resist layer (not shown) as a mask to form an opening part reaching to the $p^+$-type diffusion layer 14 and an opening part reaching to the $n^+$-type diffusion layer 7. The photolithograph resist layer is removed, and thereafter a metal film of an aluminum (Al) alloy or W (tungsten) or the like is deposited over the semiconductor substrate 1 by, for example, a sputtering method. The Al film is patterned to form both the anode electrode 18 electrically connected to the $p^+$-type diffusion layer 14 and the cathode electrode 19 electrically connected to the $n^+$-type diffusion layer 7 (FIG. 13). Herein, for example, a length $w_1$ of the anode electrode 18 in the horizontal direction is about 0.07 mm, and a length $w_2$ of the cathode electrode 19 in the horizontal direction is about 0.42 mm.

Figure 14:
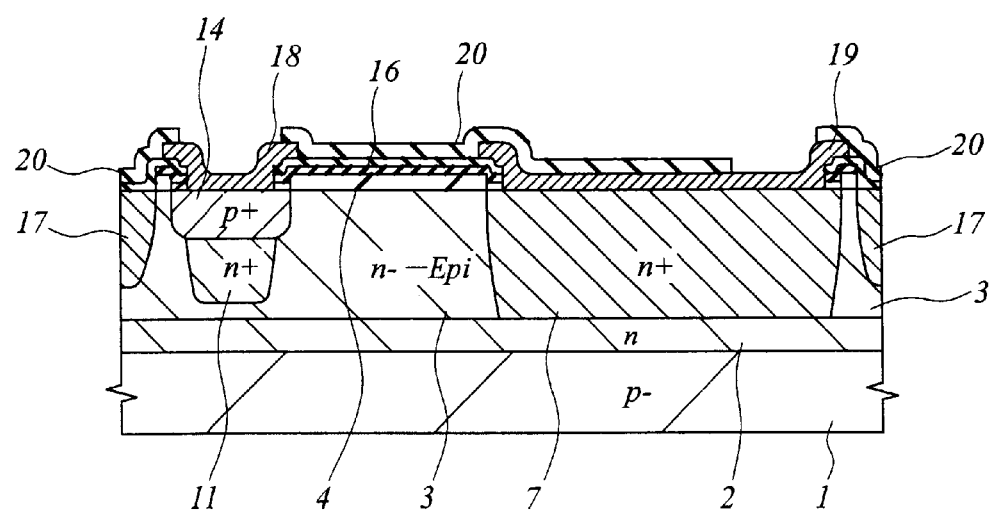
FIG. 14 is a cross-sectional view showing an essential part during a manufacturing process of the semiconductor device subsequent to FIG. 13.

Next, in step P1J, a silicon nitride ($Si_3N_4$) film is deposited over the semiconductor substrate 1 by a CVD method. The silicon nitride film is etched by using the photolithograph resist layer (not shown) as a mask, to form a final passivation film 20 (FIG. 14).

Figure 15:
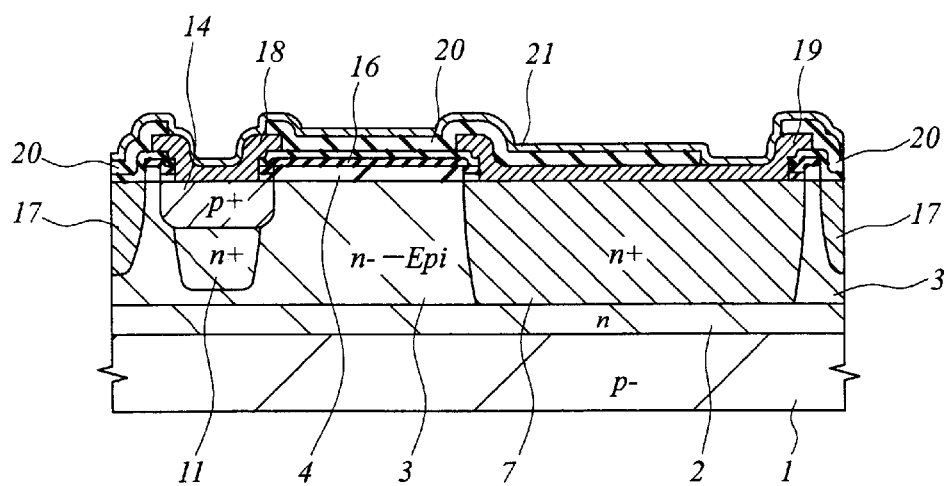
FIG. 15 is a cross-sectional view showing an essential part during a manufacturing process of the semiconductor device subsequent to FIG. 14.

Next, in step P1K, for example, a Ti—Pd film is evaporated over the semiconductor substrate 1 to form an under bump metal 21 (FIG. 15). A photolithograph resist layer is coated on the under bump metal. The photolithograph resist layer is selectively opened to form a region for forming each electrode bump 22. In step P1L, each electrode bump 22 is formed in the region for forming each electrode bump 22. A material of each electrode bump 22 is selected according to a material of each electrode formed in a position for mounting the variable capacitance diode of the first embodiment. For, example, when the electrode of the mounting position is of gold (Au), a copper (Cu) film is deposited, by a plating method, in the region for forming each electrode bump 22, and then a gold (Au) film is deposited on the surface of the copper film by a plating method to form each electrode bump 22. Otherwise, after a nickel (Ni) film is deposited by a plating method, a gold film may be deposited on the surface of the nickel film by a plating method. Further, in the case where the electrode located in the mounting position is formed by solder, each electrode bump 22 may be formed by solder.

Therefore, in step P1M, both the photolithograph resist layer located in a region other than the region in which each electrode bump 22 described above is formed, and the under bump metal 21 are removed. Then, the semiconductor substrate 1 is separated into individual semiconductor chips by dicing to form the variable capacitance diode of the first embodiment shown in FIGS. 1 to 3. Moreover, in step P1N, the variable capacitance diode of the first embodiment is mounted on the mounting board by facedown bonding to manufacture the high-frequency module shown in FIG. 5.

Figure 16A:
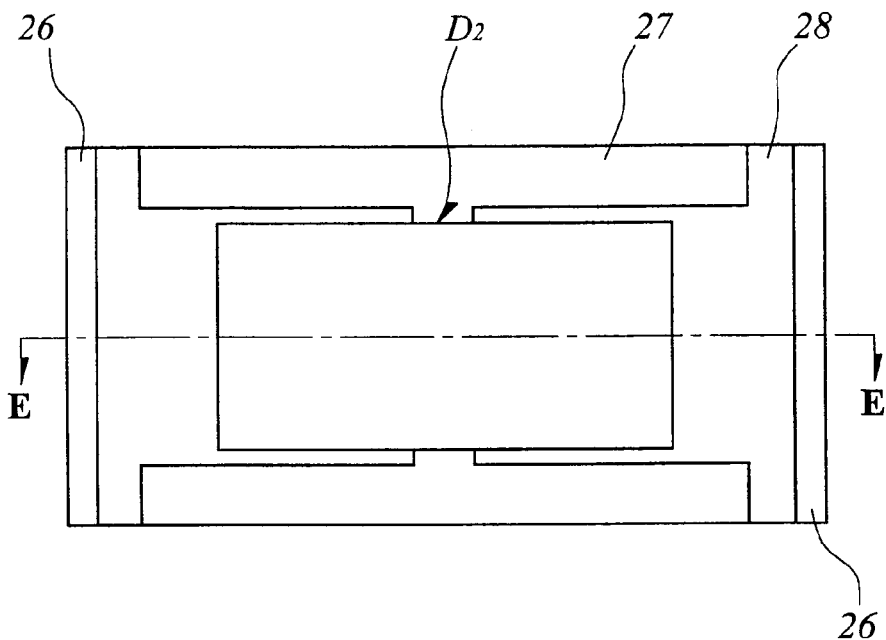
FIG. 16A is a plan view showing the case where the semiconductor device shown in FIGS. 1 to 3 is resin-sealed.
Figure 16B:
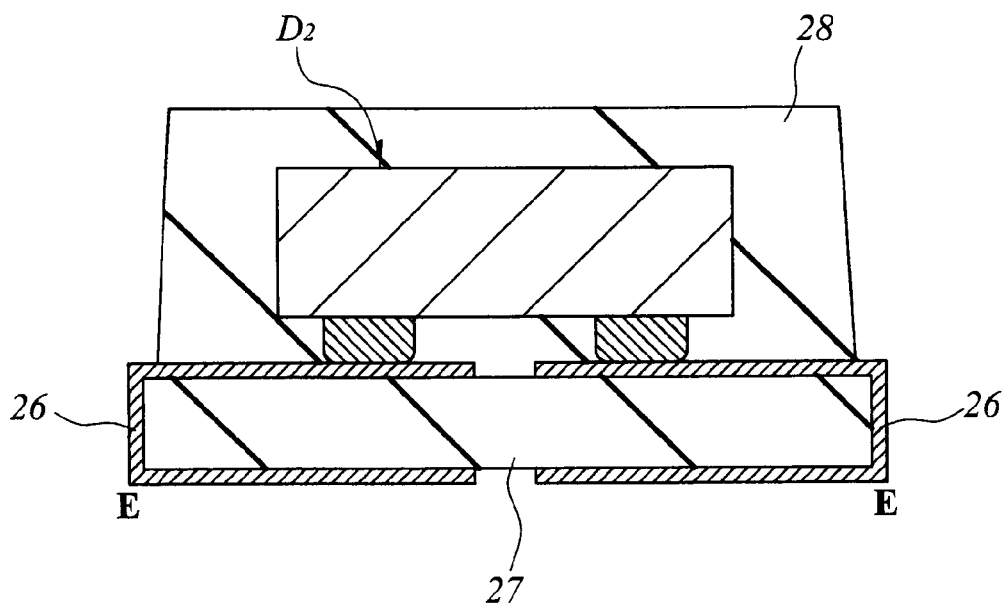
FIG. 16B is a cross-sectional view taken along line E—E of FIG. 16A.

However the variable capacitance diode of the first embodiment can be also used as a resin sealing type diode. FIGS. 16A and 16B show a resin package formed by, for example, electrically connecting a board 27, which is made of glass epoxy or ceramic and on the surface of which an outer electrode 26 is formed, to the variable capacitance diode $D_2$ of the first embodiment by facedown bonding, and then, by resin-sealing the variable capacitance diode $D_2$ located in the top of the board 27 by an epoxy resin material 28. FIG. 16A is a plan view thereof and FIG. 16B is a cross-sectional view taken along line E—E of FIG. 16A.

In the case where the package (resin sealing type diode) shown in FIGS. 16A and 16B have the same characteristic as the conventional variable capacitance diode $D_1$ (see FIG. 4), the package size can be almost equal to or less than 0.5 mm (length)×1.0 mm (width)×0.5 mm (height). In other words, the variable capacitance diode of the first embodiment, even when disposed in a resin-sealed package, can be made smaller than the conventional variable capacitance diode.

Further, in the case where the variable capacitance diode of the first embodiment is used as a resin-sealing type diode, since an outer electrode 26 is formed on the side face of the package, a solder fillet can be formed in the case of mounting by using solder and thereby the mounting reliability is enhanced.

Moreover, the above-mentioned resin-sealing type diode may be used to manufacture the high-frequency module as shown in FIG. 5.

Second Embodiment

A semiconductor device of a second embodiment is a PIN diode used in a high-frequency module such as an antenna switch module or the like. The antenna switch module includes mobile communication equipment and high-speed data communication equipment and the like. The PIN diode can be used by being mounted on a mounting board by means of facedown bonding similar to the variable capacitance diode of the first embodiment described above.

Figure 17:
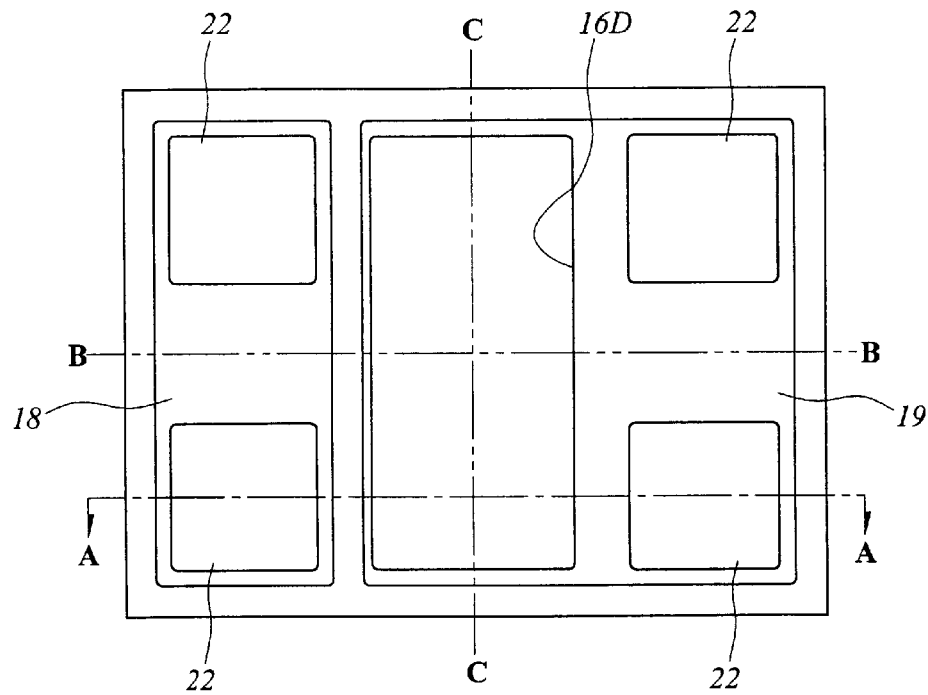
FIG. 17 is a plan view showing an essential part of a semiconductor device that is a second embodiment of the present invention.
Figure 18:
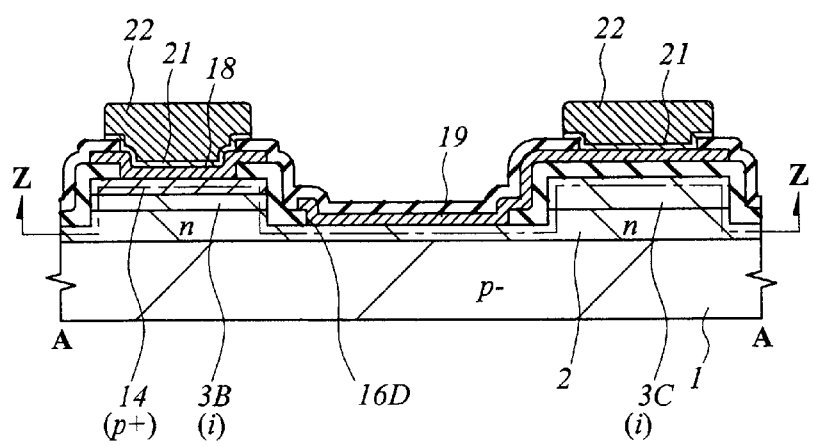
FIG. 18 is a cross-sectional view showing an essential part of the semiconductor device taken along line A—A of FIG. 17.
Figure 19:
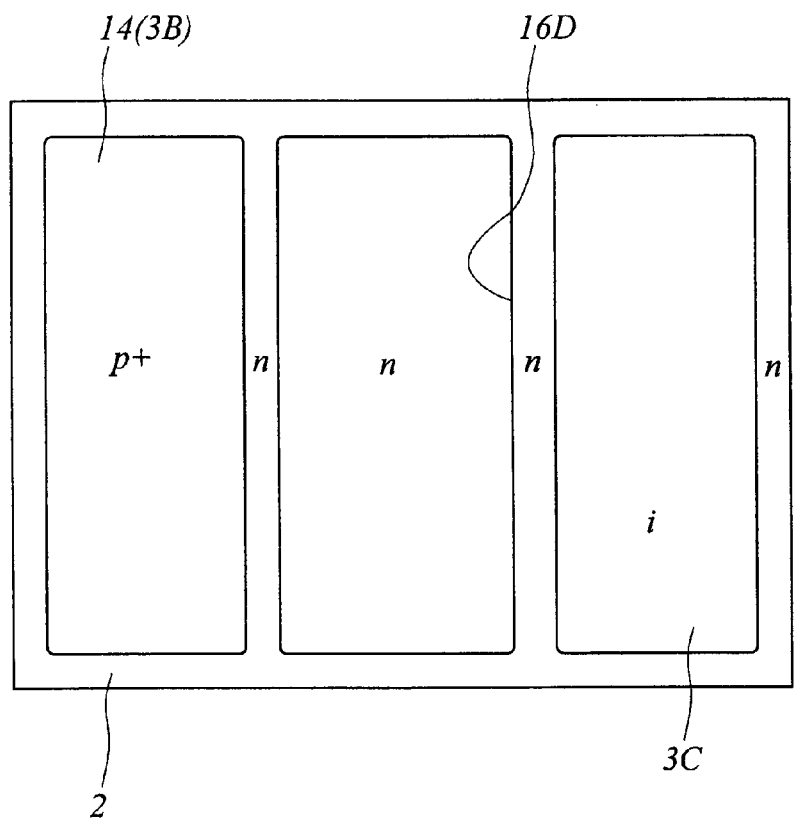
FIG. 19 is a plan view showing an essential part of the semiconductor device taken along line Z—Z of FIG. 18.

FIG. 17 is a plan view showing the PIN diode of the second embodiment. FIG. 18 is a cross-sectional view taken along line A—A of FIG. 17. FIG. 19 is a plan view taken along line Z—Z of FIG. 18.

On a main surface (element forming face) of a semiconductor substrate 1 having a p-type conductive type, an n-type (a first conductive type) low resistance layer (cathode region) 2 (semiconductor layer) is formed. On the top of the n-type low resistance layer 2, intrinsic epitaxial layers 3B (a sixth semiconductor layer) and 3C (a seventh semiconductor layer) are formed. On the top of the epitaxial layer 3B, a $p^+$-type (a second conductive type) diffusion layer 14 (a fourth semiconductor layer ($p^+$-type region)) is formed. The p+-type diffusion layer 14, the epitaxial layer 3B, and the n-type low resistance layer 2 form pin junction of the PIN diode in the second embodiment.

In the PIN diode of the second embodiment, there are no equivalents for the n+-type diffusion layer 7 (see FIG. 8) and the n+-type hyper-abrupt layer 11 (see FIG. 9) formed in the variable capacitance diode of the first embodiment by a thermal treatment process. For this reason, even if the n-type impurities are diffused by the thermal treatment process, it is possible to prevent the intrinsic epitaxial layers 3B and 3C from being contaminated by the n-type impurities. This can prevent a characteristic of the PIN diode of the second embodiment from being deteriorated.

An anode electrode 18 (a second electrode) is formed on the top of the p+-type diffusion layer 14. A cathode electrode 19 (a first electrode) is electrically connected to the n-type low resistance layer 2 in an opening part 16D (a second opening part) of a region (a second region) between the epitaxial layers 3B and 3C, and extends on the top of the epitaxial layer 3C.

Electrode bumps 22 are formed over the top of the anode electrode 18 via an under bump metal 21. Further, the electrode bumps 22 formed in a region other than the top of the anode electrode 18 are electrically connected to the cathode electrode 19 via the under bump metal 21 over the top of the epitaxial layer 3C.

Similarly to the variable capacitance diode of the first embodiment described above, even in the second embodiment, the electrode bumps 22 are disposed in four corners of one main surface of a semiconductor chip on which the PIN diode is formed, and are symmetrically arranged with respect to line B—B (see FIG. 17) and line C—C (see FIG. 17). Namely, the electrode bumps 22 are symmetrically arranged in a vertical and horizontal directions on the main surface of the semiconductor chip on which the PIN diode of the second embodiment is formed. Each of the four electrode bumps 22 has the same top surface shape and the same area. The heights from the back face of the semiconductor substrate 1 to respective top surfaces of the four electrode bumps 22 are all the same. A term "the same" herein includes an error such as a production error and the like occurring in a manufacturing apparatus used for forming the electrode bumps 22. Each area of the electrode bumps 22 disposed over the main surface (plane) of the semiconductor substrate 1 is relatively smaller than an area of the cathode electrode 19.

In the PIN diode of the second embodiment shown in FIGS. 17 and 18, similarly to the variable capacitance diode shown in FIGS. 1 to 3 in the first embodiment, no wires and leads are used. In the PIN diode of the second embodiment, the thickness of the semiconductor substrate 1 can be optionally processed according to specifications thereof. For this reason, the PIN diode of the second embodiment can be made smaller in a height direction thereof than the conventional diode.

In addition, in the PIN diode of the second embodiment, similarly to the variable capacitance diode in the first embodiment, since no wires and leads are used, it is unnecessary to consider inductance and capacitance caused by wires and the leads. In other words, it is possible to reduce the inductance and capacitance during high-frequency operation of a high-frequency module using the PIN diode of the second embodiment. This can reduce loss caused by the inductance and capacitance to enhance a high-frequency characteristic thereof within a several GHz band.

Further, in the PIN diode of the second embodiment, similarly to the variable capacitance diode in the first embodiment, the four electrode bumps 22 each having the same top surface shape and the same area are symmetrically arranged in the vertical and horizontal directions on one main surface of the semiconductor chip. This can prevent surface tension difference caused by solder melted in the electrode bumps 22 from occurring at the time of mounting the PIN diode of the second embodiment on the mounting board by a self-alignment mounting method. In other words, it is possible to prevent occurrence of a phenomenon caused by the surface tension difference, the phenomenon being such that one of electrodes is removed from the mounting board.

Figure 20:
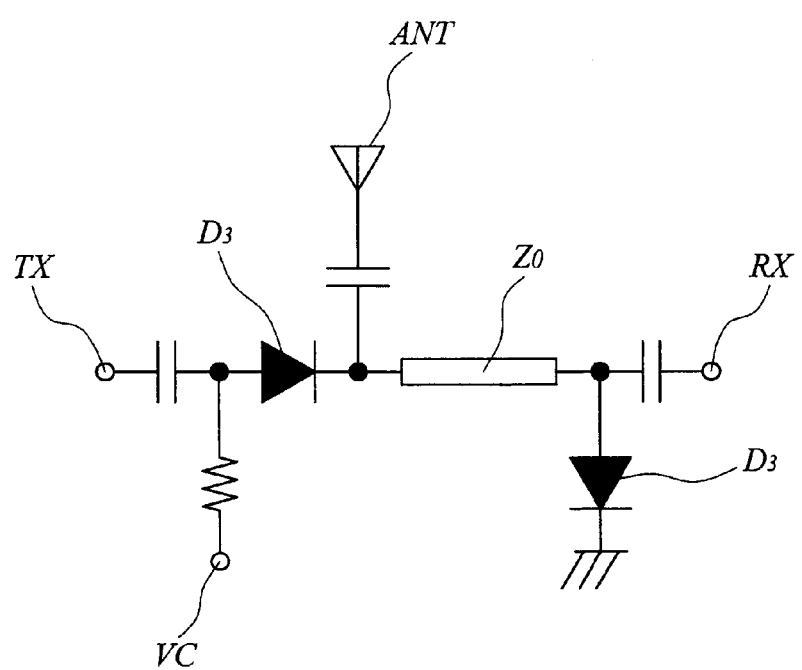
FIG. 20 is a circuit diagram showing an antenna switch circuit constructed by using the semiconductor device shown in FIGS. 17 to 19.

FIG. 20 is a circuit diagram of the case where the PIN diode of the second embodiment is used for an antenna switch circuit.

In the antenna switch circuit shown in FIG. 20, an antenna ANT is used to be common to both a transmitting circuit (not shown) connected to a terminal TX and a receiving circuit (not shown) connected to a terminal RX.

In the antenna switch circuit shown in FIG. 20, a switching current is input from a terminal VC at transmission and a PIN diode $D_3$ is turned on. A micro-strip-line $Z_0$ has the same as an antenna impedance so that impedance matching with the receiving circuit is attained at reception. The line length thereof is set to be about ¼ times the transmission wavelength. At reception, the switching current being input from the terminal VC is cut to turn off the PIN diode $D_3$, and thereby the transmitting circuit is separated from the antenna.

Figure 21:
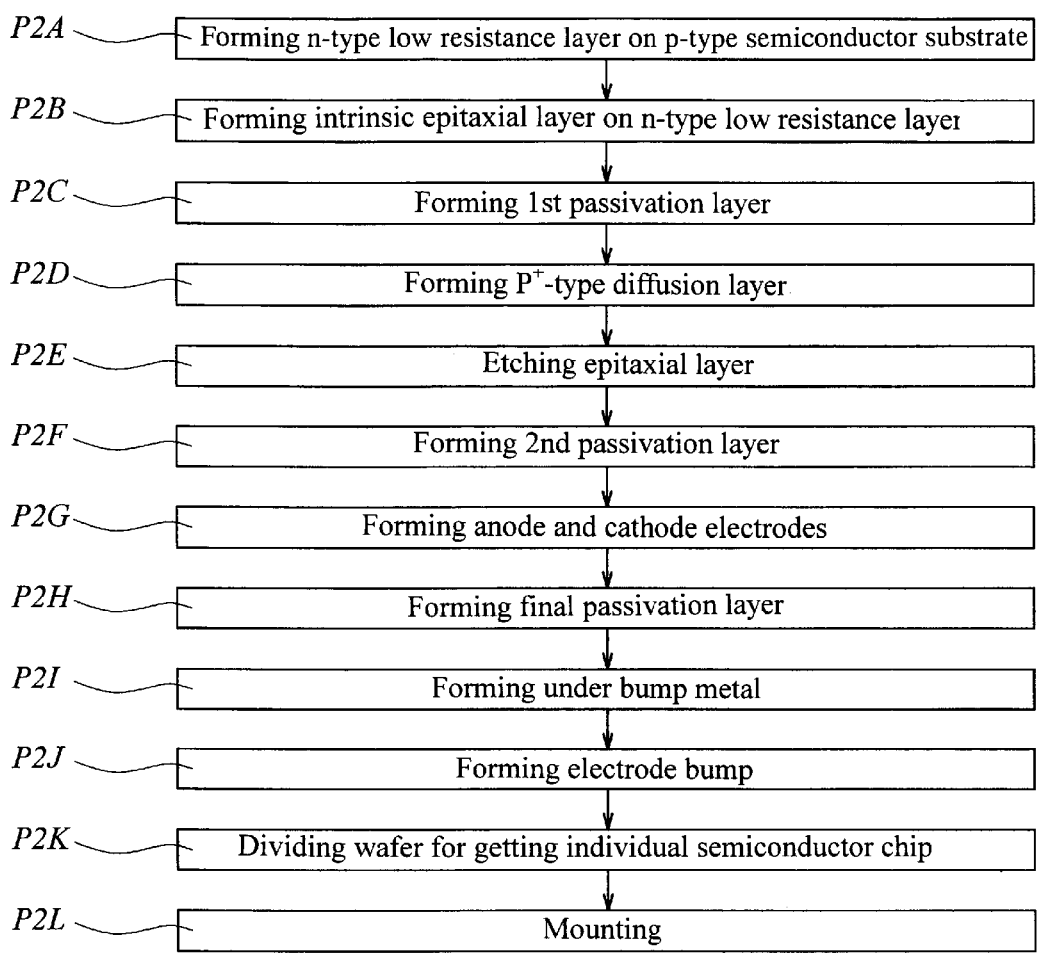
FIG. 21 is a manufacturing flowchart for explaining a manufacturing method of the semiconductor device shown in FIGS. 17 to 19.

FIG. 21 is a manufacturing flowchart showing one example of a manufacturing process of the PIN diode that is the second embodiment described above. According to the flowchart, a manufacturing method of the PIN diode of the second embodiment will be described hereinbelow.

Step P2A is the same as step P1A shown in FIG. 6 in the first embodiment.

Figure 22:
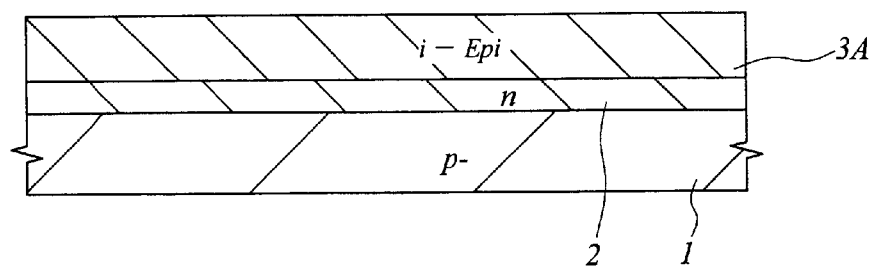
FIG. 22 is a cross-sectional view showing an essential part for explaining a manufacturing method of the semiconductor device shown in FIGS. 17 to 19.

Thereafter, in step P2B, an intrinsic epitaxial layer 3A (a fifth semiconductor layer) used as an i layer of a pin junction is formed on the n-type low resistance layer 2 by means of a vapor-phase growth method (FIG. 22). The intrinsic epitaxial layer 3A has, for example, a film thickness of about 20 µm and a resistivity of about 500 Ωcm.

In the PIN diode, as described in "Microwave Semiconductor Applied Engineering", pp.50 to 52, written by Joseph F. White and issued by QC Shuppan on Dec. 1, 1985, if it is assumed that w is the thickness of the i layer, $\mu_{AP}$ is an effective average speed of electrons and holes, τ is life time of carriers in the i layer, I is a bias current, and R is ON-state resistance of the PIN diode, then there is a relational expression of $$R = w^2/(2 \cdot \mu_{AP} \cdot \tau \cdot I).$$

The ON-state resistance R of the PIN diode increases in proportion to the square of the thickness w of the i layer. In the PIN diode of the second embodiment, based on the relational expression and the characteristic of a PIN diode to be manufactured, the film thickness of the epitaxial layer 3A is set to reduce the ON-state resistance of the PIN diode.

Next, in step P2C, a silicon dioxide film 4 (a first insulating film) having a film thickness of about 550 nm is formed on the surface of the epitaxial layer 3A, for example, by using a thermal oxidation method. The silicon dioxide film 4 is etched by using the photolithograph resist layer as a mask to form an opening part for forming the p+-type diffusion layer 14 to be formed in a next step.

Figure 23:
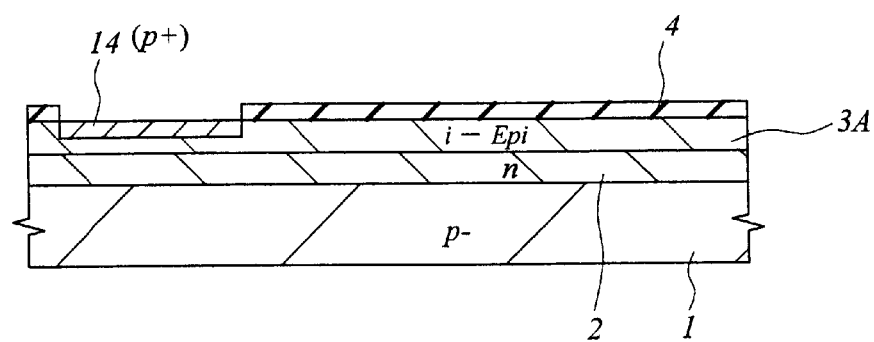
FIG. 23 is a cross-sectional view showing an essential part during a manufacturing process of the semiconductor device subsequent to FIG. 22.

Then, in step P2D, B (boron) ions are doped into the epitaxial layer 3A from the above-mentioned opening part by using a polyboron film (PBF). The semiconductor substrate 1 is subjected to a thermal treatment at about (1050° C. Thereby, the doped B is diffused to form the p⁺-type diffusion layer 14 (FIG. 23).

Figure 24:
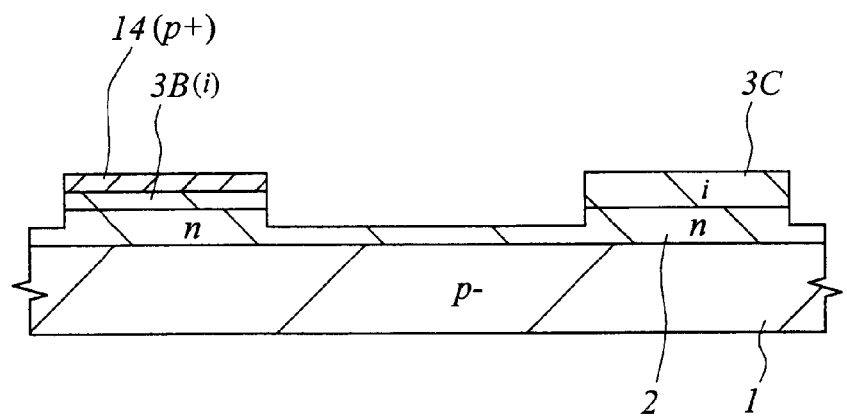
FIG. 24 is a cross-sectional view showing an essential part during a manufacturing process of the semiconductor device subsequent to FIG. 23.

Next, the silicon dioxide film 4 is removed. Thereafter, in step P2E, the epitaxial layer 3A is etched by plasma-etching using the photolithograph resist layer as a mask to selectively leave the epitaxial layer 3A (FIG. 24). In the left epitaxial layer 3A, the epitaxial layer 3A located under the p⁺-type diffusion layer 14 is an epitaxial layer 3B. The region (a first region) separated from the p⁺-type diffusion layer 14 is an epitaxial layer 3C. This can form pin junction (PIN diode element) of the p⁺-type diffusion layer 14, the epitaxial layer 3B, and the n-type low resistance layer 2. It is also possible to form a region (the epitaxial layer 3C) for forming the electrode bumps 22 (see FIG. 18) electrically connected to the cathode electrode 19 (see FIG. 18). Further, the region (the epitaxial layer 3B and the p⁺-type diffusion layer 14) in which the anode region 18 (see FIG. 18) is formed, is electrically separated from the region (the epitaxial layer 3C) in which the electrode bumps 22 electrically connected to the cathode electrode 19 are formed.

Next, in step P2F, a silicon dioxide film is formed over a semiconductor substrate 1 by a thermal oxidation method. A PSG (Phosphor Silicate Glass) film is deposited on the top of the silicon dioxide film by, for example, a CVD method to form an 2nd passivation layer 16 (a first insulating film) comprising a silicon dioxide film and a PSG film.

Figure 25:
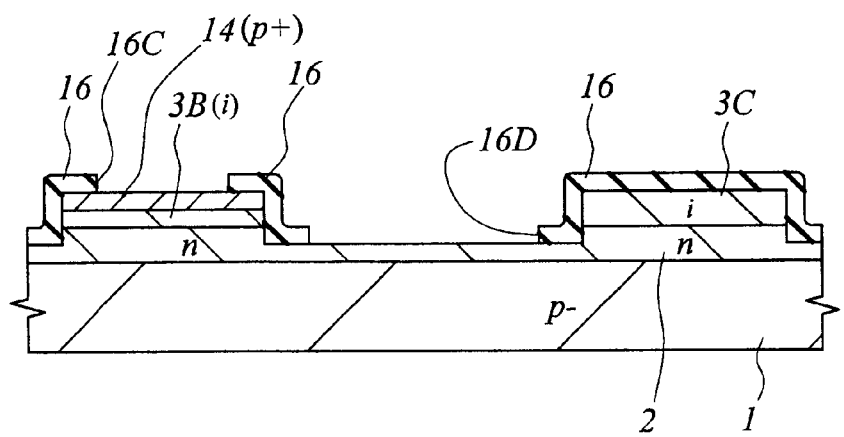
FIG. 25 is a cross-sectional view showing an essential part during a manufacturing process of the semiconductor device subsequent to FIG. 24.

Next, the 2nd passivation layer 16 is etched by using the photolithograph resist layer (not shown) as a mask to form an opening part 16C (a first opening part) reaching the p⁺-type diffusion layer 14 and an opening part 16D reaching an n-type low resistance layer 2 (FIG. 25).

In forming the above-mentioned opening parts 16C and 16D, an opening area of the opening part 16D is designed to be as large as possible in comparison with an opening area of the opening part 16C within a range of the size of the semiconductor chip (the semiconductor substrate 1) on which the PIN diode of the second embodiment is formed. This can reduce the contact resistance of the cathode electrode 19 formed in a later step and electrically connected to the n-type low resistance layer 2 in the opening part 16D and of the n-type low resistance layer 2. In the case of using the PIN diode of the second embodiment in a high-frequency module, the high-frequency resistance of the high-frequency module is in inversely proportion to the contact area (the opening area of the opening part 16C) of the anode electrode 18 and the n-type low resistance layer 2. Therefore, the contact area can be made as large as possible to reduce the high-frequency resistance.

Figure 26:
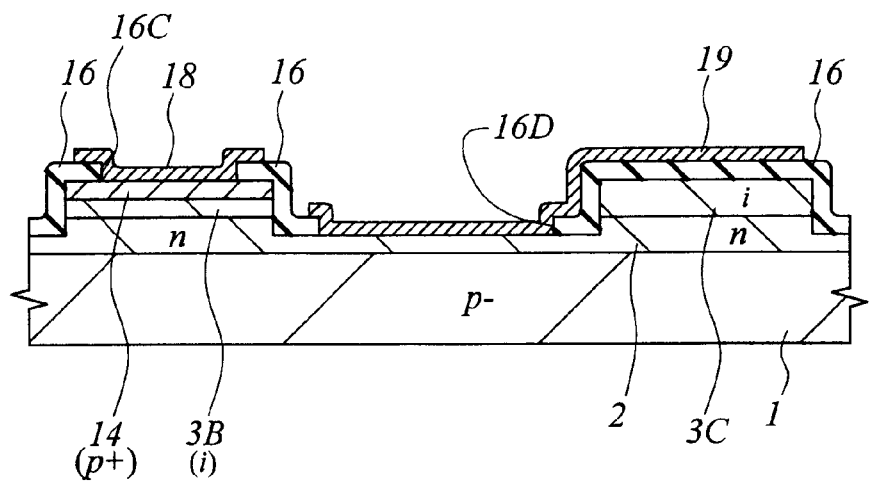
FIG. 26 is a cross-sectional view showing an essential part during a manufacturing process of the semiconductor device subsequent to FIG. 25.

Next, in step P2G, a metal film such as an aluminum (Al) alloy or W (tungsten) or the like is deposited over the semiconductor substrate 1 by, for example, a sputtering method. Subsequently, the Al film is patterned to form both the anode electrode 18 electrically connected to the p⁺-type diffusion layer 14 in the opening part 16C and the cathode electrode 19 electrically connected to the n-type low resistance layer 2 in the opening part 16D (FIG. 26). At this time, the space between the anode electrode 18 and the cathode electrode 19 is made as small as possible within such a range that the rated voltage of the PIN diode of the second embodiment is maintained.

As described above, the cathode electrode 19 is directly connected to the n-type low resistance layer 2 in the opening part 16D, and extends to the 2nd passivation layer 16 over the top of the epitaxial layer 3C. For this reason, n-type impurities are introduced into the epitaxial layer 3C to simplify this step in comparison with the case of forming an extraction layer for electrically connecting the n-type low resistance layer 2 and the cathode electrode 19 on the top of the epitaxial layer 3C. In the second embodiment, since the extraction layer is not formed, it is possible to prevent the intrinsic epitaxial layer 3C from being contaminated by the n-type impurities.

Figure 27:
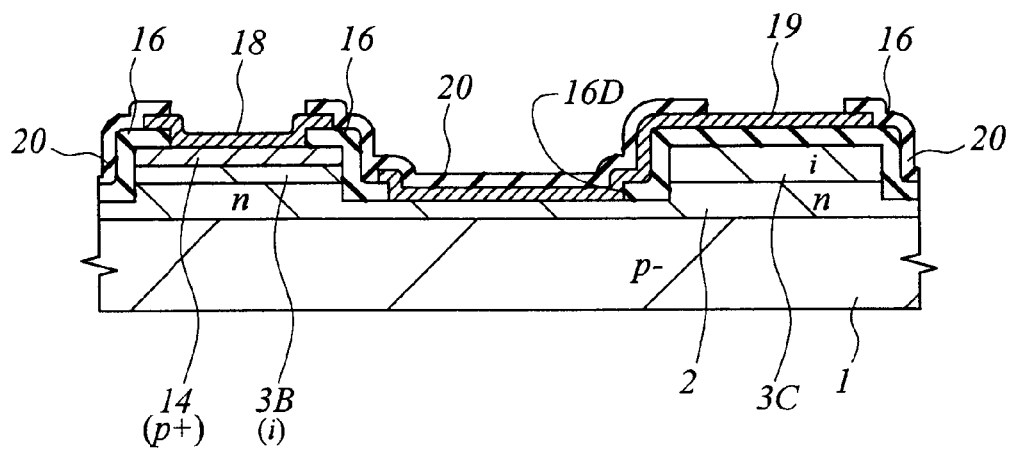
FIG. 27 is a cross-sectional view showing an essential part during a manufacturing process of the semiconductor device subsequent to FIG. 26.

Next, in step P2H, a silicon nitride ($Si_3N_4$) film is deposited over the semiconductor substrate 1 by, for example, a CVD method. The silicon nitride film is etched by using the photolithograph resist layer (not shown) as a mask to form a final passivation film 20 (FIG. 27).

Figure 28:
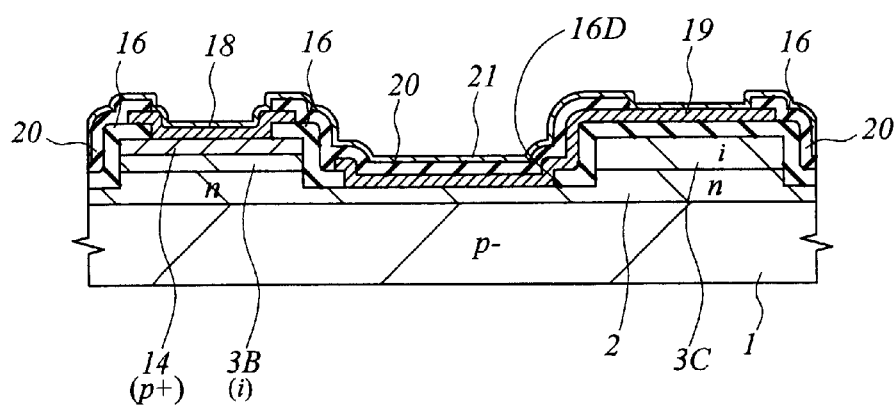
FIG. 28 is a cross-sectional view showing an essential part during a manufacturing process of the semiconductor device subsequent to FIG. 27.

Next, in step P2I, for example, a Ti—Pd film is evaporated over the semiconductor substrate 1 to form an under bump metal 21 (FIG. 28). A photolithograph resist layer is coated onto the under bump metal. The photolithograph resist layer is selectively opened to form regions for forming the electrode bumps 22. Then, in step P2J, the electrode bumps 22 are formed in the regions for forming the electrode bumps 22. A material of the electrode bumps 22 is selected according to a material of an electrode formed in a position for mounting the PIN diode of the second embodiment, similarly to the variable capacitance diode of the first embodiment. For example, when the electrode in the mounting position is of gold (Au), a copper (Cu) film is deposited in the regions for forming the electrode bumps 22 by a plating method. Thereafter, a gold (Au) film is deposited on the surface of the copper film by a plating method to form the electrode bumps 22. Otherwise, after a nickel (Ni) film is deposited by a plating method, a gold film may be formed on the surface of the nickel film by a plating method and thereby the electrode bumps may be formed. Further, in the case where the electrode in the mounting position is formed by solder, the electrode bumps 22 can be formed by solder.

Thereafter, in step P2K, both the photolithograph resist layer located in a region other than the regions in which the electrode bumps 22 are formed and the under bump metal 21 are removed. Thereafter, the semiconductor substrate 1 is separated into individual semiconductor chips by dicing to form the PIN diode of the second embodiment shown in FIGS. 17 to 19. Further, in step P2L, the PIN diode of the second embodiment is mounted on the mounting board by facedown bonding, and thereby a high-frequency module can be manufactured.

Similarly to the case of explanation made by using FIGS. 16A and 16B in the first embodiment, even the PIN diode of the second embodiment can be used as a resin-sealing type diode.

Third Embodiment

A semiconductor device of a third embodiment has two PIN diode elements formed in one package by separating a pin-junction forming region in the PIN diode of the second embodiment. Other members and constructions thereof are the same as those of the PIN diode of the second embodiment, and therefore the description of similar members and constructions will be omitted.

Figure 29:
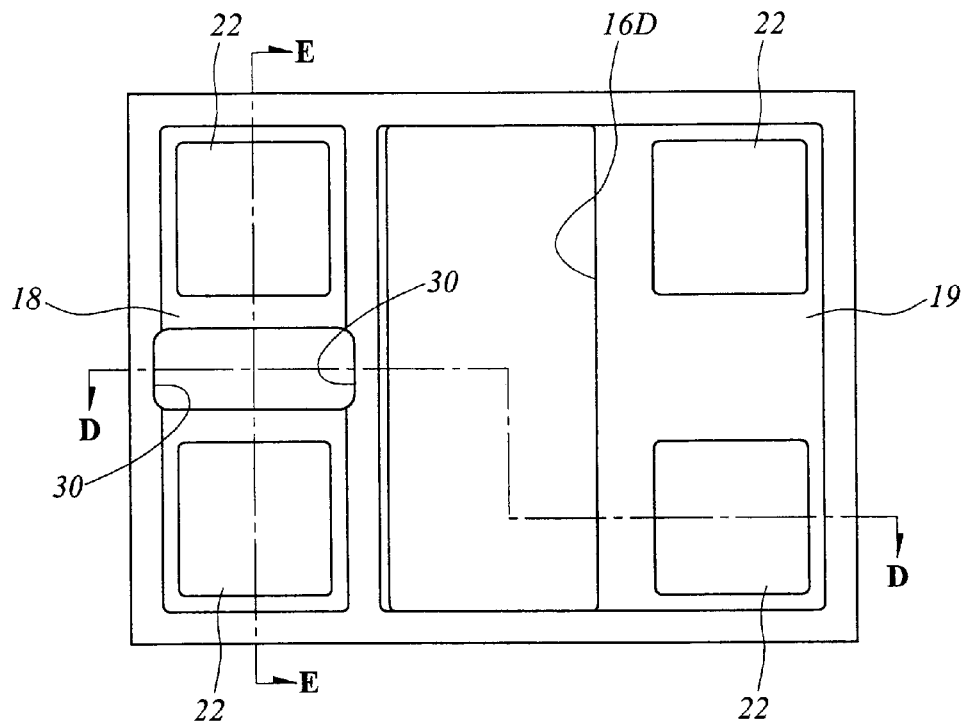
FIG. 29 is a plan view showing an essential part of a semiconductor device that is a third embodiment of the present invention.
Figure 30:
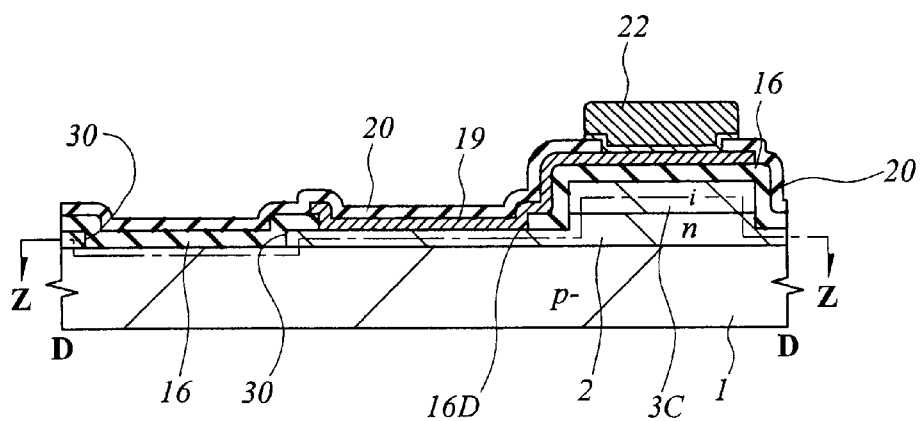
FIG. 30 is a cross-sectional view showing an essential part of the semiconductor device taken along line D—D of FIG. 29.
Figure 31:
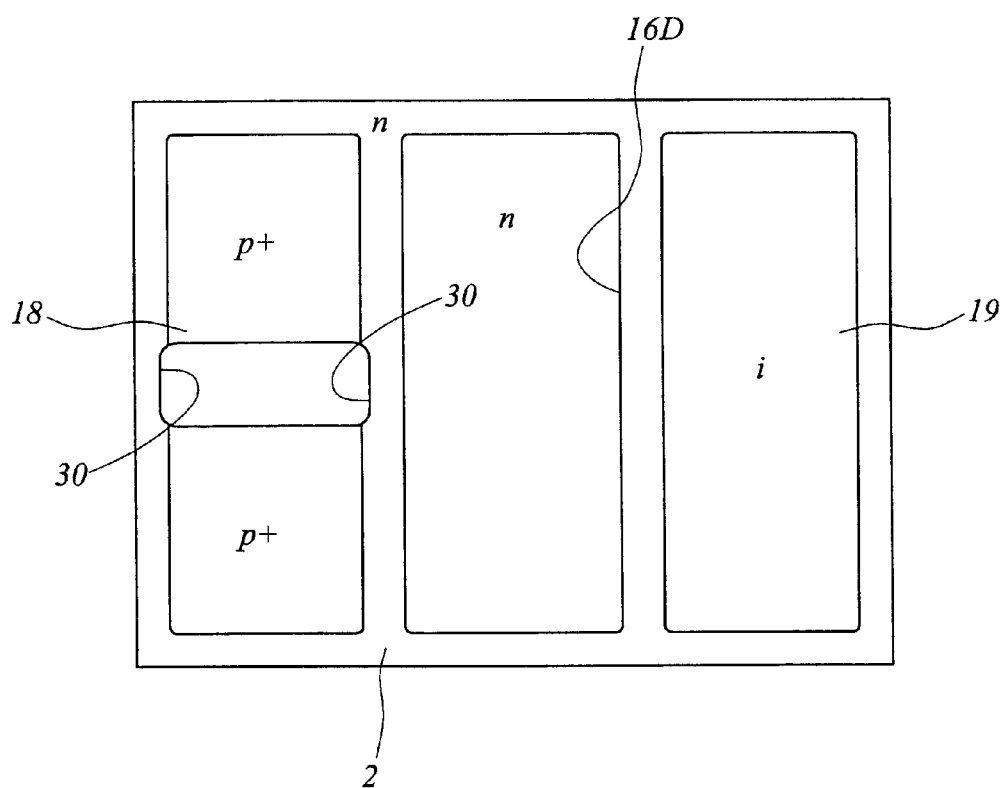
FIG. 31 is a plan view showing an essential part of the semiconductor device taken along line Z—Z of FIG. 30.
Figure 32:
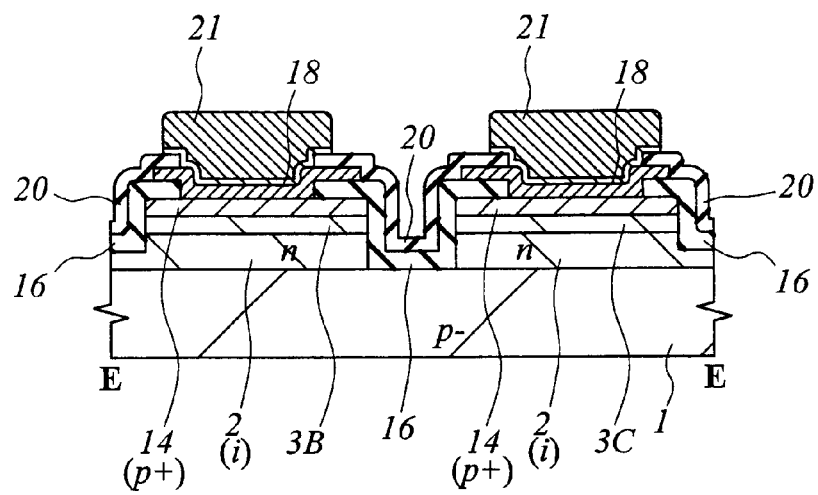
FIG. 32 is a cross-sectional view showing an essential part of the semiconductor device taken along line E—E of FIG. 29.

FIG. 29 shows a plan view showing the PIN diode of the third embodiment. FIG. 30 is a cross-sectional view taken along line D—D of FIG. 29. FIG. 31 is a plan view taken along line Z—Z of FIG. 30. FIG. 32 is a cross-sectional view taken along line E—E of FIG. 29.

Figure 33:
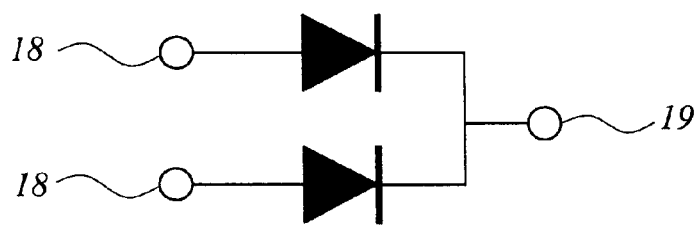
FIG. 33 is a connection diagram of a diode element that the semiconductor device shown in FIGS. 29 to 32 has.

In the PIN diode of the third embodiment, an n-type low resistance layer 2, an intrinsic epitaxial layer 3B and a p⁺-type diffusion layer 14 that form the pin junction (PIN diode element) are electrically separated by a groove 30. In other words, in the PIN diode of the third embodiment, the groove 30 (a first groove part) is formed, and thereby a PIN diode can be formed in which the cathode sides of two PIN diode elements as shown in FIG. 33 are electrically connected in a package having the same size as the package of the PIN diode of the second embodiment. Thus, in the case of forming a high-frequency module using the PIN diode of the third embodiment, the size of the high-frequency module can be made smaller than the case of the first and second embodiments. The housing of mobile communication equipment or high-speed communication equipment or the like manufactured by using the high-frequency module can be also made smaller.

Figure 34:
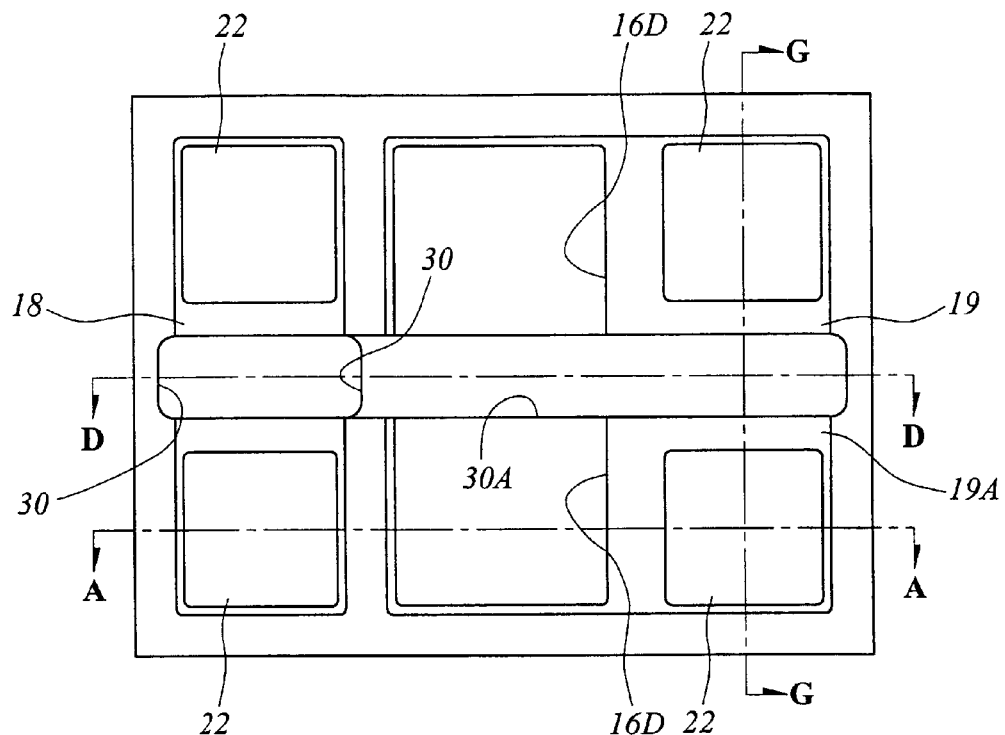
FIG. 34 is a plan view showing an essential part of another semiconductor device that is a third embodiment of the present invention.
Figure 35:
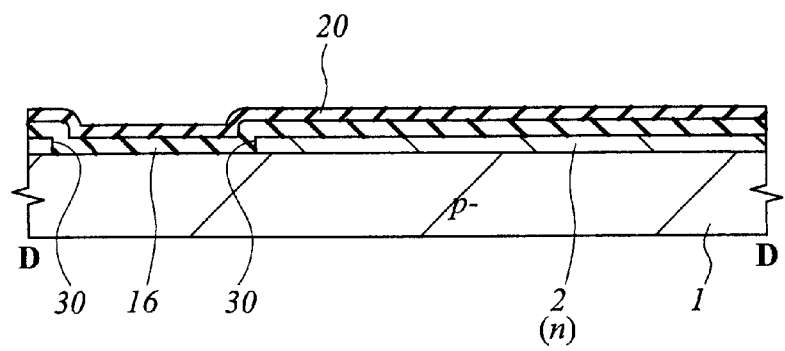
FIG. 35 is a cross-sectional view showing an essential part of the semiconductor device taken along line D—D of FIG. 34.
Figure 36:
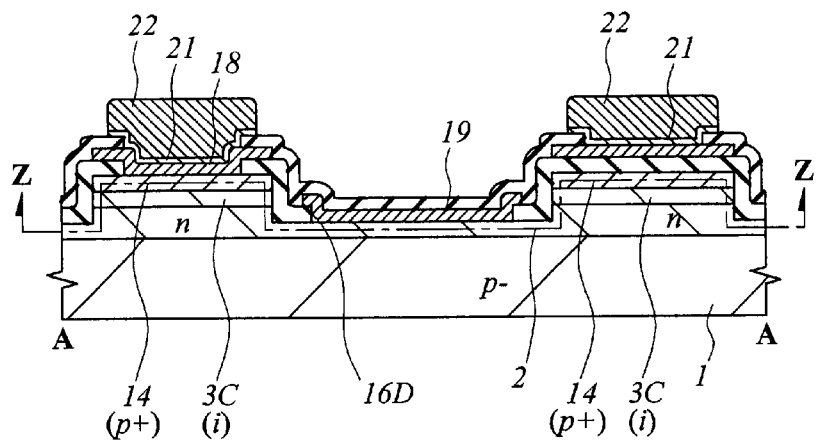
FIG. 36 is a cross-sectional view showing an essential part of the semiconductor device taken along line A—A of FIG. 34.
Figure 37:
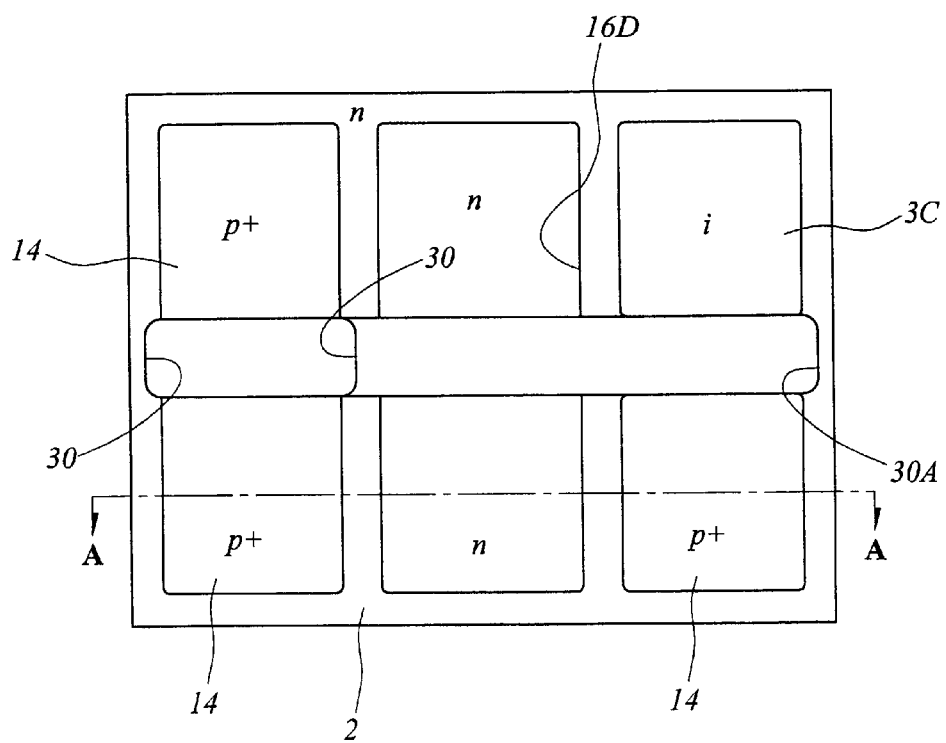
FIG. 37 is a plan view showing an essential part of the semiconductor device taken along line Z—Z of FIG. 36.
Figure 38:
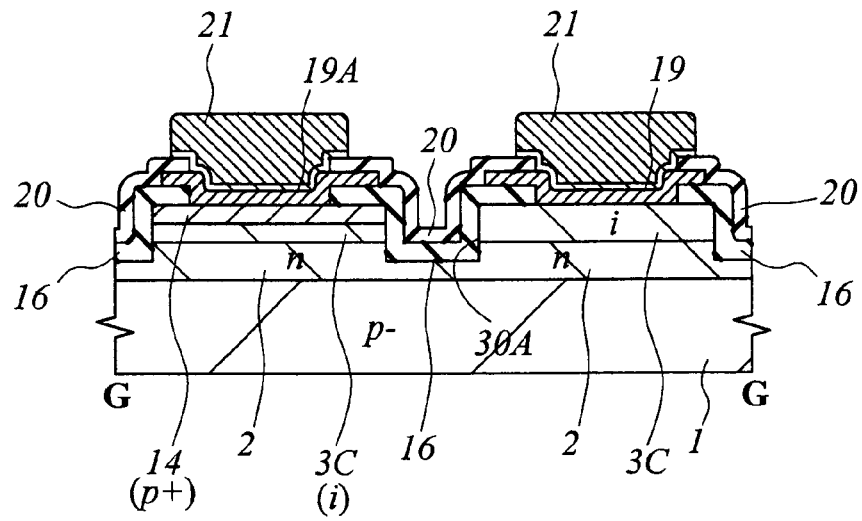
FIG. 38 is a cross-sectional view showing an essential part of the semiconductor device taken along line G—G of FIG. 34.

Three PIN diode elements can be also formed in one package. FIG. 34 is a plan view showing one example of the case of forming three PIN diode elements. FIG. 35 is a cross-sectional view taken along line D—D of FIG. 34. FIG. 36 is a cross-sectional view taken along line A—A of FIG. 34. FIG. 37 is a plan view taken along line Z—Z of FIG. 36. FIG. 38 is a cross-sectional view taken along line G—G of FIG. 34.

As shown in FIG. 34, the cathode electrode 19 shown in FIG. 29 is divided into two by a groove 30A (a second groove part), in which one of them is an anode electrode 19A. PIN diode elements are formed under the anode electrode 19A, and thereby three PIN diode elements can be formed in one package.

Figure 39:
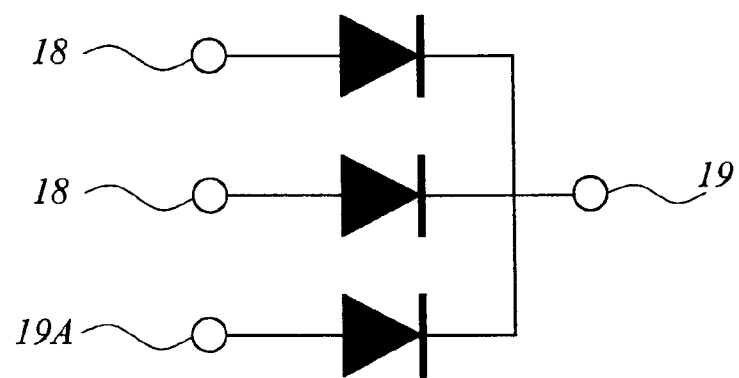
FIG. 39 is a connection diagram of a diode element that the semiconductor device shown in FIGS. 34 to 38 has.

As shown in FIGS. 36 to 38, under the anode electrode 19A, is formed a p$^+$-type diffusion layer 14 similar to the p$^+$-type diffusion layer 14 shown in FIG. 32 on the top of an intrinsic epitaxial layer 3C. The p$^+$-type diffusion layer 14, the epitaxial layer 3C and the n-type low resistance layer 2 can form a third PIN diode element, in addition to two PIN diode elements described by using FIGS. 29 to 32. At this time, as shown in FIG. 39, the respective cathode sides of these three PIN diode elements are electrically connected.

Fourth Embodiment

A semiconductor device of a fourth embodiment is a Schottky barrier diode used in a high-frequency signal detection circuit such as mobile communication equipment and high-speed data communication equipment and the like. It is possible to use the Schottky barrier diode too by mounting it on a mounting board by facedown bonding, similarly to the variable capacitance diode of the first embodiment and the PIN diodes of the second and third embodiments.

Figure 40:
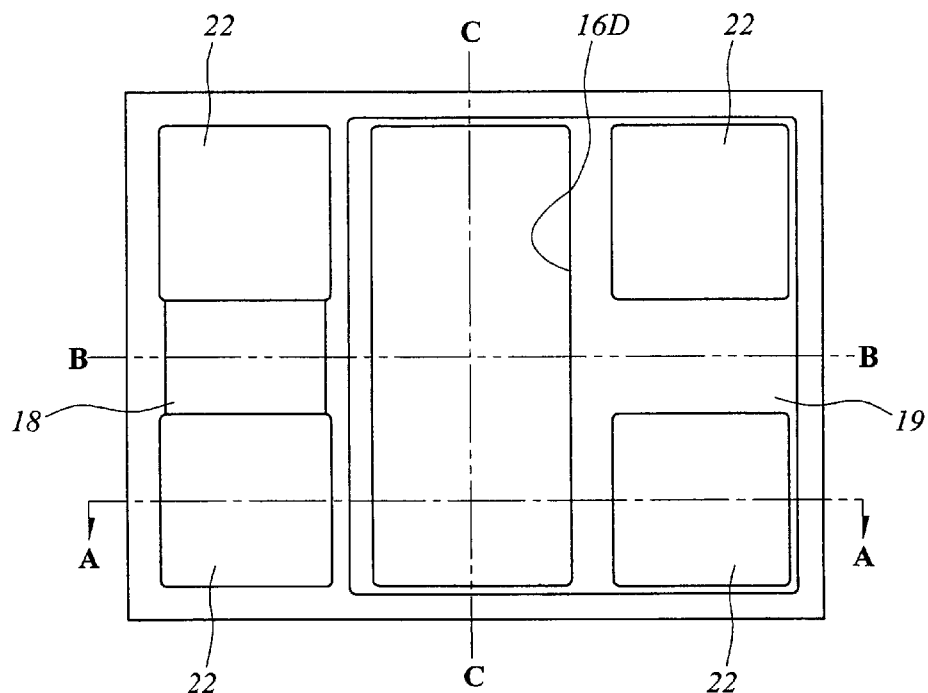
FIG. 40 is a plan view showing an essential part of a semiconductor device that is a fourth embodiment of the present invention.
Figure 41:
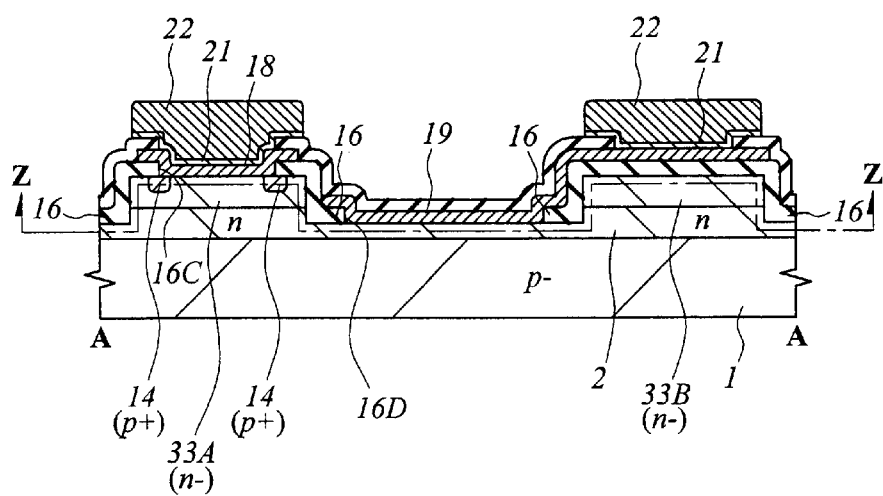
FIG. 41 is a cross-sectional view showing an essential part of the semiconductor device taken along line A—A of FIG. 40.
Figure 42:
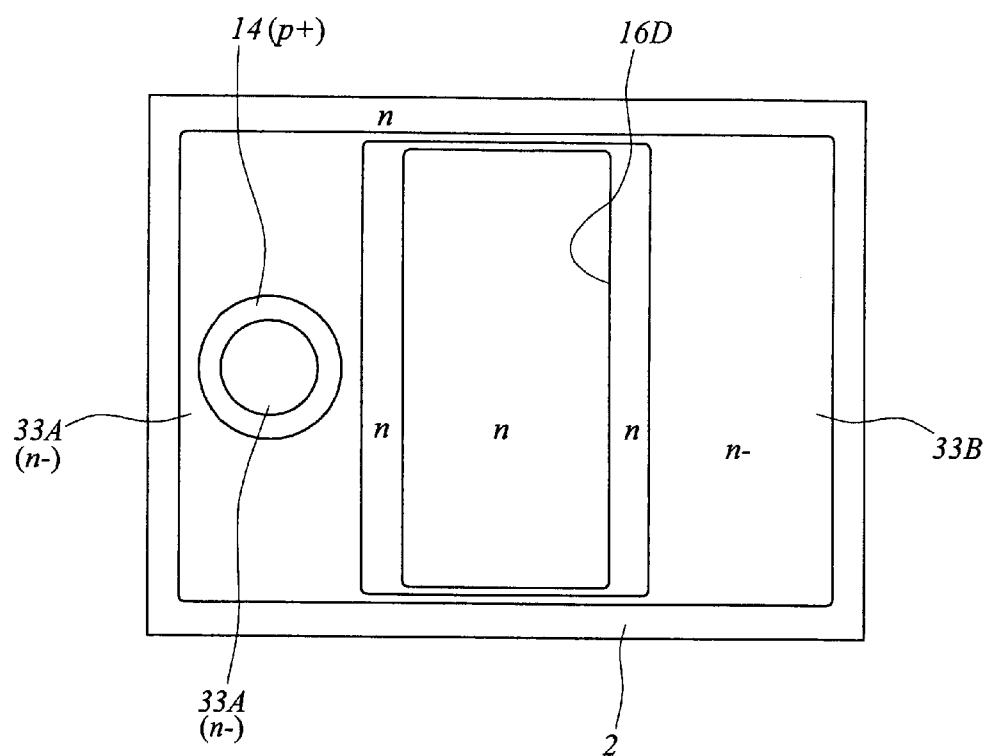
FIG. 42 is a plan view showing an essential part of the semiconductor device taken along line Z—Z of FIG. 41.

FIG. 40 is a plan view showing the Schottky barrier diode of the fourth embodiment. FIG. 41 is a cross-sectional view taken along line A—A of FIG. 40. FIG. 42 is a plan view taken along line Z—Z of FIG. 41.

The n-type low resistance layer 2 (the semiconductor layer) is formed on the main surface (element forming face) of a semiconductor substrate 1 having a p-type conductive type. N-type epitaxial layers 33A (an eighth semiconductor layer) and 33B (a ninth semiconductor layer) are formed on the top of the n-type low resistance layer 2. A p$^+$-type diffusion layer 14 (a fourth semiconductor layer) is formed in a donut shape in the n-type epitaxial layer 33A.

The 2nd passivation layer 16 (a first insulating film) is formed on each top of the n-type epitaxial layer 33A and the p$^+$-type diffusion layer 14. An anode electrode 18 (a second electrode) is formed on the top of the 2nd passivation layer 16. The anode electrode 18 is directly connected to the n-type epitaxial layer 33A and the p$^+$-type diffusion layer 14, in an opening part 16C (a first opening part) formed in the 2nd passivation film 16. The anode electrode 18 is in Schottky-contact with the n-type epitaxial layer 33A. Further, a cathode electrode 19 (a first electrode) is directly connected to the n-type low resistance layer 2, in an opening part 16D (a second opening part) formed in the 2nd passivation layer 16 of a region (a second region) between the n-type epitaxial layers 33A and 33B, and extends to the top of the n-type epitaxial layer 33B.

Electrode bumps 22 are formed over the top of the anode electrode 18 via an under bump metal 21. Electrode bumps 22 formed in a region other than the top region of the anode electrode 18 are electrically connected to the cathode electrode 19 via the under bump metal 21 over the top of the n-type epitaxial layer 33B.

Similarly to the variable capacitance diode of the first embodiment and the PIN diodes of the second embodiment, even in the fourth embodiment, the electrode bumps 22 are disposed in four corners of the main surface of the semiconductor chip on which a Schottky barrier diode is formed, and are symmetrically arranged with respect to line B—B (see FIG. 40) and line C—C (see FIG. 40). In other words, the electrode bumps 22 are symmetrically arranged in a vertical and horizontal directions on one main surface of the semiconductor chip on which the Schottky barrier diode of the fourth embodiment is formed. The four electrode bumps 22 each have the same top surface shape and the same area. Further, the heights from the back face of the semiconductor substrate 1 to the respective top surfaces of the four electrode bumps 22 are all the same.

In the Schottky barrier diode of the fourth embodiment shown in FIGS. 40 and 41, similarly to the variable capacitance diode of the first embodiment and the PIN diode of the second embodiment, no wires and leads are used. In the Schottky barrier diode of the fourth embodiment, the thickness of the semiconductor substrate 1 can be optionally processed according to specifications thereof. For this reason, the Schottky barrier diode of the fourth embodiment can be made smaller in a height direction thereof than the conventional diode.

In addition, in the Schottky barrier diode of the fourth embodiment, similarly to the variable capacitance diode of the first embodiment and the PIN diode of the second embodiment, no wires and leads are used. Therefore, it is unnecessary to consider inductance and capacitance caused in the wires and the leads. In the case of using the Schottky barrier diode of the fourth embodiment, which is mounted on the mounting board by means of facedown bonding, it is unnecessary to consider volume of a sealing material used for resin-sealing. In other words, it is possible to reduce inductance and capacitance during high-frequency operation of a high-frequency module by using the Schottky barrier diode of the fourth embodiment. This can reduce loss caused by the inductance and capacitance to enhance a high-frequency characteristic thereof within the several GHz band.

Further, in the Schottky barrier diode of the fourth embodiment, similarly to the variable capacitance diode of the first embodiment and the PIN diode of the second embodiment, the four electrode bumps 22 each having the same top surface shape and the same area are symmetrically arranged in a vertical and horizontal directions on one main surface of the semiconductor chip. This can prevent the surface tension difference of solder melted in the electrode bumps 22 from occurring when the Schottky barrier diode of the fourth embodiment is mounted on the mounting board by a self-alignment mounting method. In other words, it is possible to prevent occurrence of a phenomenon caused by the surface tension difference, the phenomenon being such that one of electrodes is removed from the mounting board.

Fifth Embodiment

A semiconductor device of a fifth embodiment is a modification of the variable capacitance diode (see FIGS. 1 to 3) explained in the first embodiment.

Figure 43:
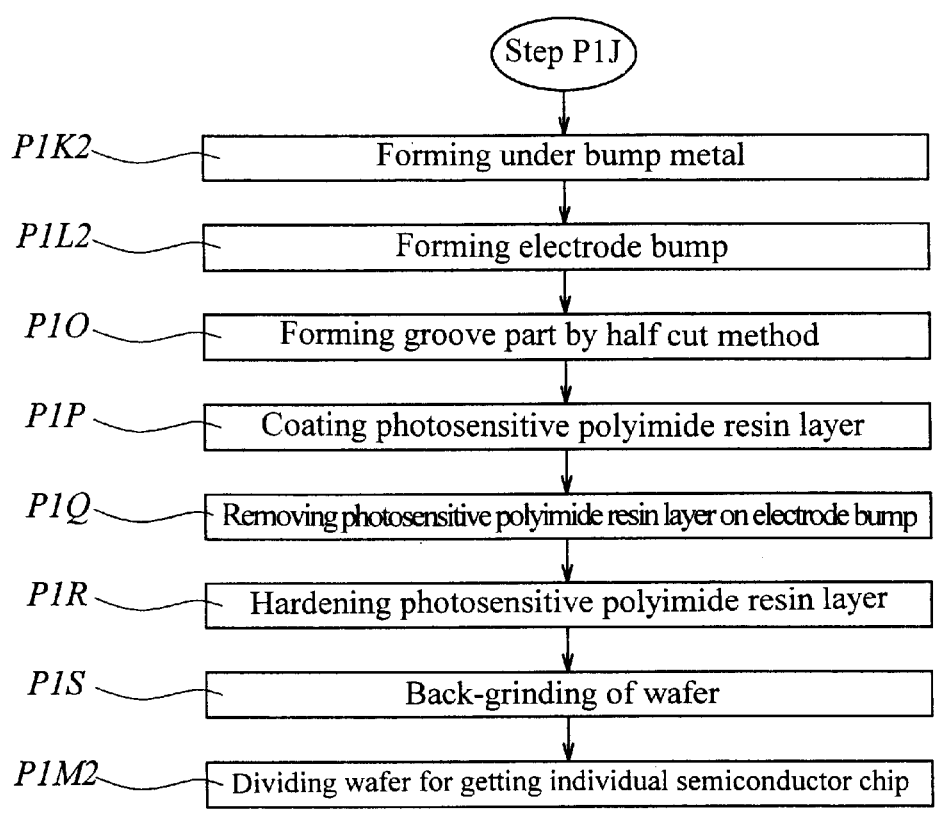
FIG. 43 is a manufacturing flowchart for explaining a manufacturing method of a semiconductor device that is another embodiment of the present invention.

FIG. 43 is a manufacturing flowchart showing one example of a manufacturing process of the variable capacitance diode of the fifth embodiment. According to the manufacturing flowchart, a manufacturing method of the variable capacitance diode of the fifth embodiment will be described hereinbelow.

Figure 44:
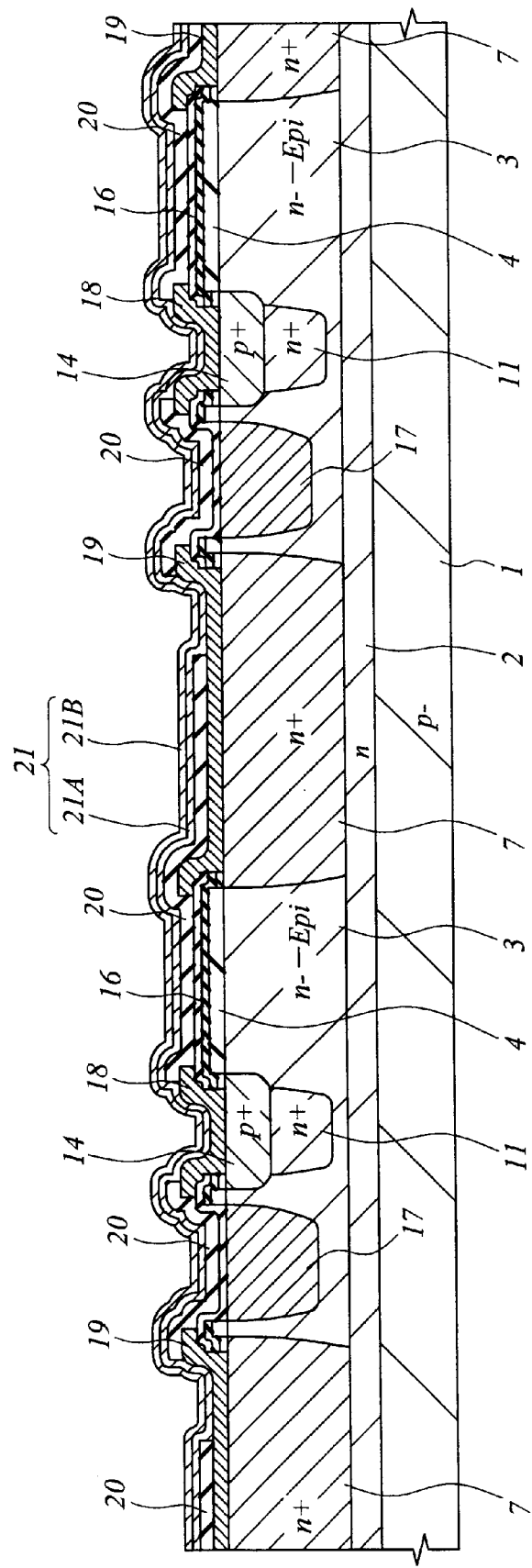
FIG. 44 is a cross-sectional view showing an essential part for explaining a manufacturing method of the semiconductor device that is another embodiment of the present invention.

The manufacturing process of the variable capacitance diode of the fifth embodiment is the same until the process (see FIG. 14) of forming the final passivation film 20 in step P1J (see FIG. 6) explained in the first embodiment. Thereafter, in step P1K2, for example, a Ti film is deposited by a sputtering method to form a 1st under bump metal 21A. Subsequently, for example, a Pd film is deposited onto the 1st under bump metal 21A by a sputtering method to form a 2nd under bump metal 21B, and thereby an under bump metal 21 is formed which comprises the 1st under bump metal 21A and the 2nd under bump metal 21B (FIG. 44). At this time, each material of the 1st under bump metal 21A and the 2nd under bump metal 21B is selected according to each material of the electrode bumps formed on a under bump metal 21 to be formed in a later step. This will be explained in a next step for forming the electrode bumps.

Figure 45:
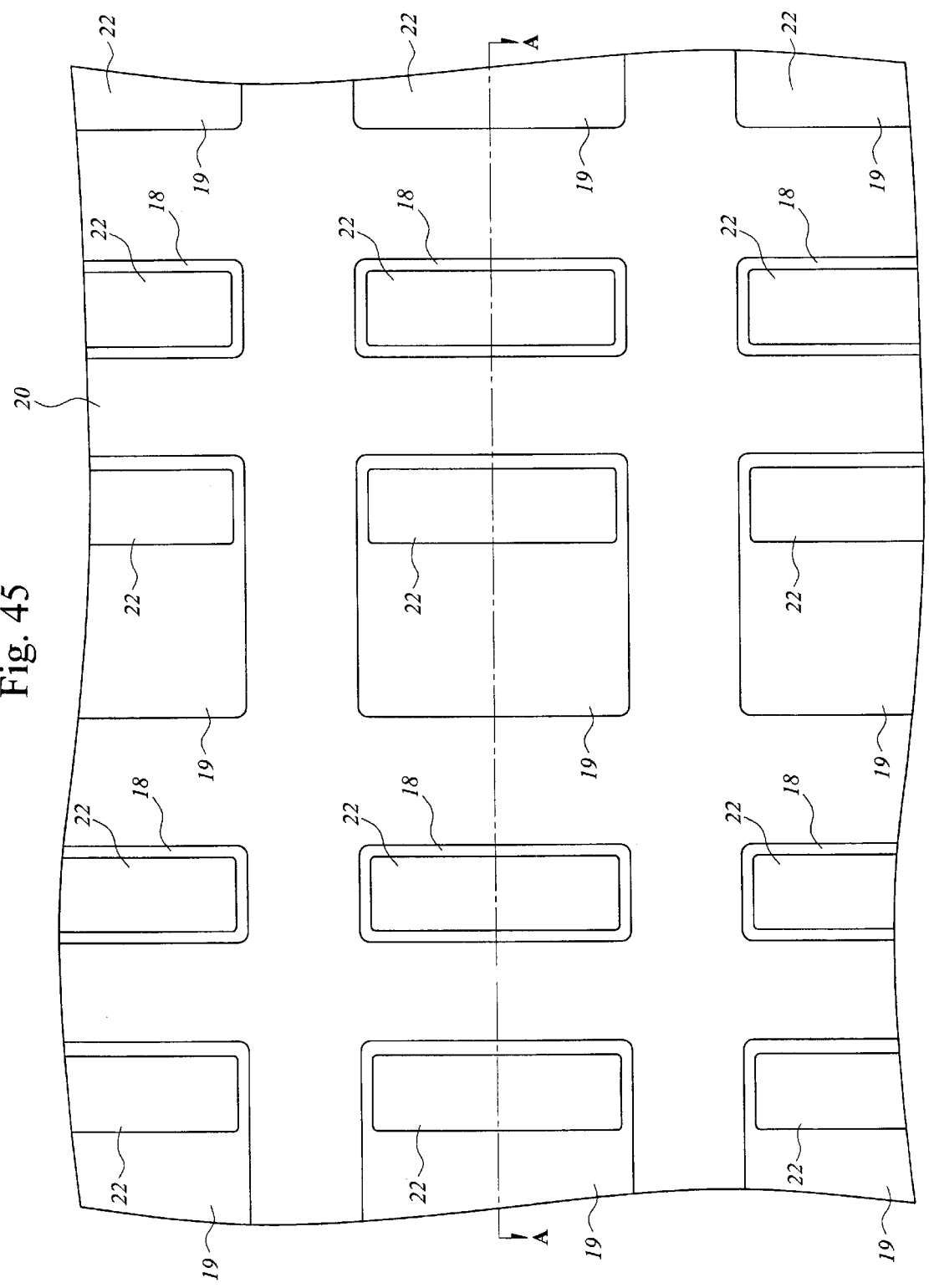
FIG. 45 is a plan view showing an essential part during a manufacturing process of the semiconductor device that is another embodiment of the present invention.
Figure 46:
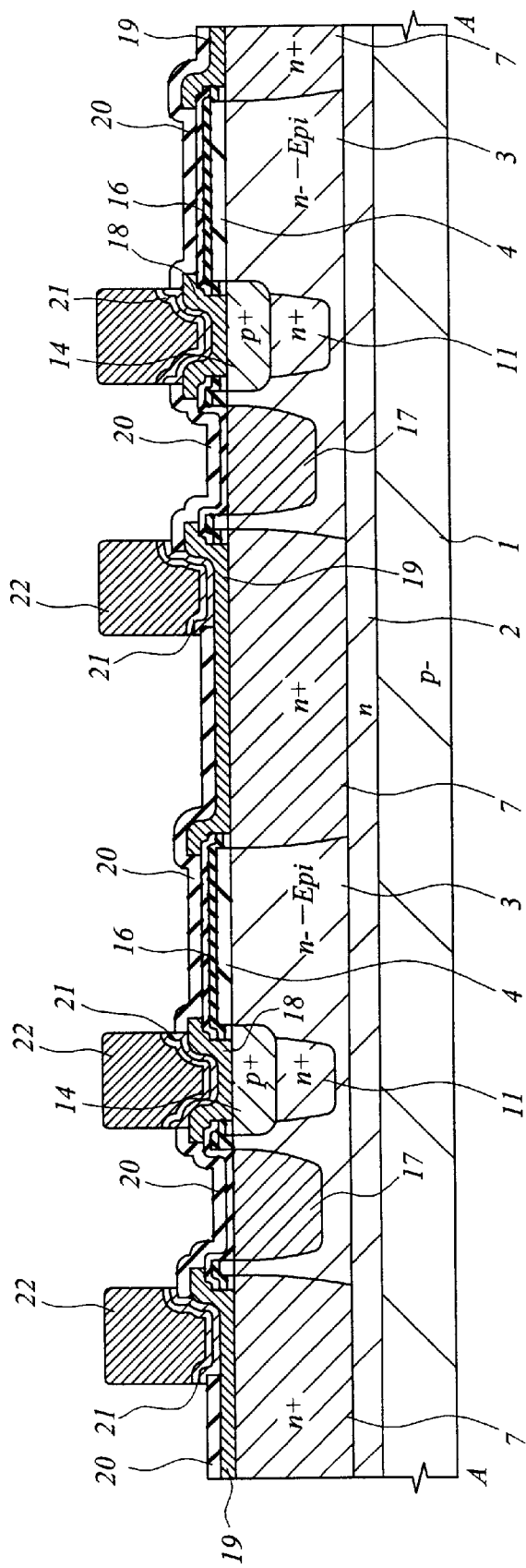
FIG. 46 is a cross-sectional view showing an essential part during a manufacturing process of the semiconductor device subsequent to FIG. 44.

A photolithograph resist layer is coated onto the under bump metal 21. By forming selectively an opening in the photolithograph resist layer, a region for forming each electrode bump is formed. Then, in step P1L2, after a copper film is deposited on the region for forming each electrode bump by a plating method, a gold film is deposited on the surface of the copper film by a plating method to form each electrode bump 22. The gold film is formed for the purpose of preventing the copper film thereunder from being oxidized. FIG. 45 is a plan view showing an essential part of a region for forming the variable capacitance diode of the fifth embodiment. FIG. 46 is a cross-sectional view taken along line A—A of FIG. 45. At this time, the electrode bumps 22 are symmetrically arranged in a vertical and horizontal directions on the main surface of a region which comes to a semiconductor chip and in which the variable capacitance diode of the fifth embodiment is formed. The two electrode bumps 22 on the main surface of the region which comes to the semiconductor chip each have the same top surface shape and the same area. The heights from the back face of the semiconductor substrate 1 to the respective top faces of the two electrode bumps 22 are all the same. A term "the same" herein includes an error such as a production error and the like caused by a manufacturing apparatus used for forming each electrode bump 22. The fifth embodiment illustrates the case of forming the two electrode bumps 22 on the main surface of the region which comes to the semiconductor chip. However, as shown in FIG. 1 of the first embodiment, the four electrode bumps 22 may be symmetrically arranged in a vertical and horizontal directions on the main surface of the region that comes to the semiconductor chip.

Each electrode bump 22 can be formed by depositing a nickel film on the region for forming each electrode bump by means of a plating method, and then by depositing a gold film or a tin (Sn) film on the surface of the nickel film by means of a plating method. In this case, the 2nd under bump metal 21B is formed by a nickel or gold film. Further, in the case where an electrode formed in a position for mounting the variable capacitance diode of the fifth embodiment is formed by solder, the electrode bumps 22 can be formed by solder.

Then, in a step similar to step P1M (see FIG. 6) explained in the first embodiment, the photolithograph resist layer located in a region other than the region in which each electrode bump 22 is formed and the under bump metal 21 are removed (FIGS. 45 and 46).

Figure 47:
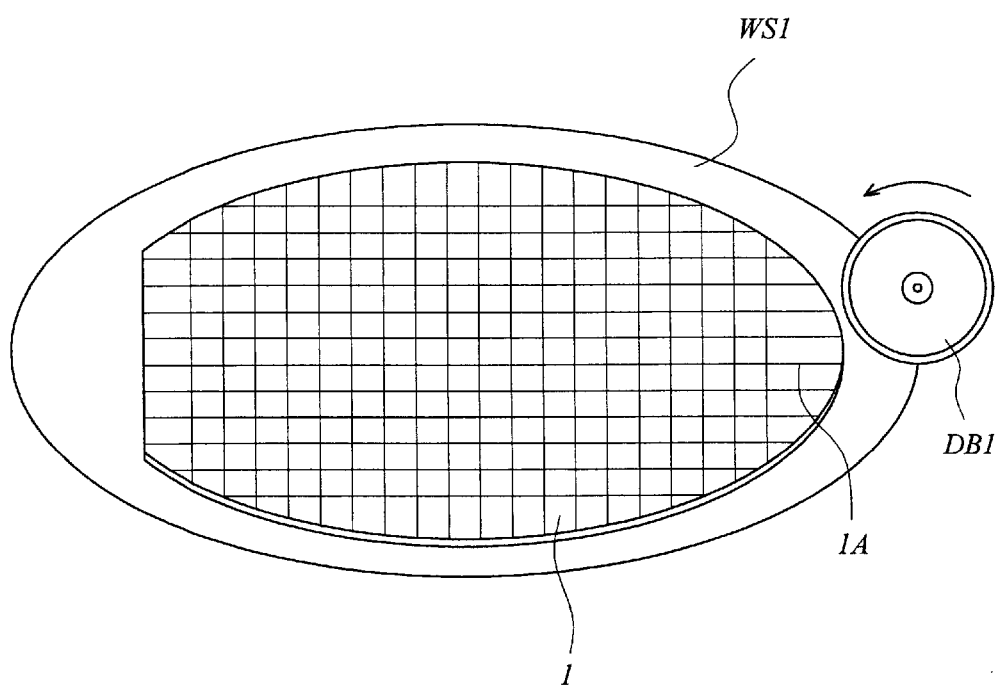
FIG. 47 is a perspective view during a manufacturing process of the semiconductor device that is another embodiment of the present invention.
Figure 48:
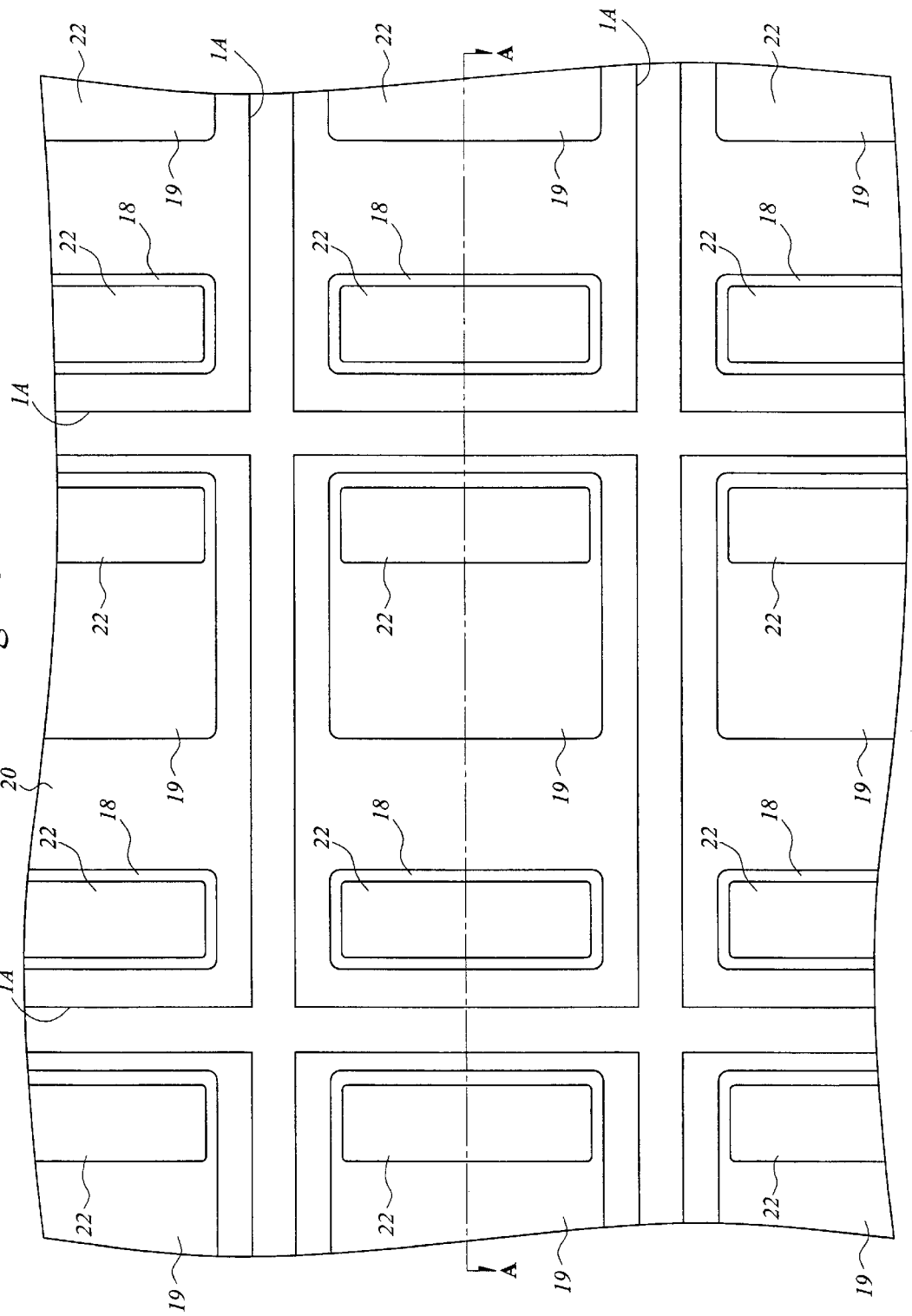
FIG. 48 is a plan view showing an essential part during a manufacturing process of the semiconductor device subsequent to FIG. 45.
Figure 49:
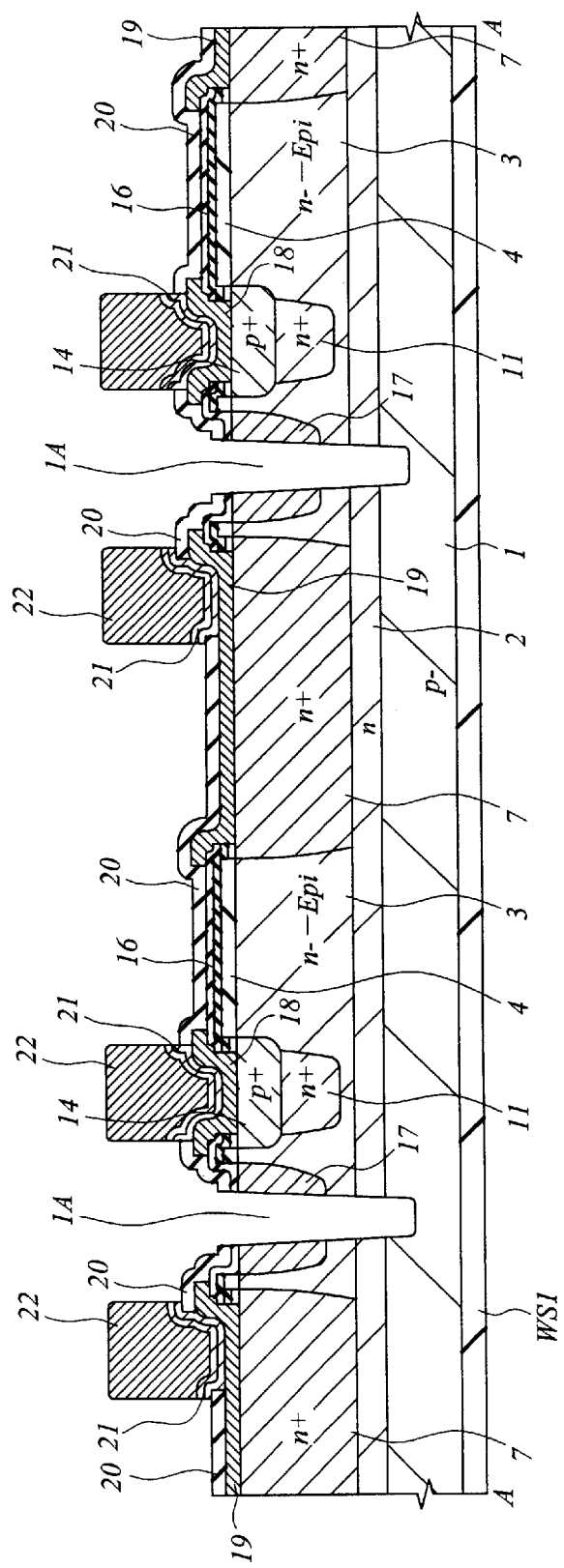
FIG. 49 is a cross-sectional view showing an essential part during a manufacturing process of the semiconductor device subsequent to FIG. 46.

Next, as shown in FIGS. 47 to 49, a wafer sheet WS1 for dicing is attached onto the back face of the semiconductor substrate 1 in a wafer state. Thereafter, a groove part (a first groove part) 1A is formed in a dividing region for dividing the semiconductor substrate 1 into individual semiconductor-chip forming regions by a half cutting method using a dicing blade DB1 (step P1O). FIG. 47 is a perspective view showing the whole of the semiconductor substrate 1 in step P1O. At this time, as the dicing blade DB1, a dicing blade having, for example, a width of about 40 to 50 $\mu$m is used. The width of the groove part 1A formed by using this is about 50 to 60 $\mu$m. The lower surface of the groove part 1A is formed to be lower than the surface of the n-type low resistance layer 2. For example, the lower surface of the groove part 1A is positioned in a place about 30 to 40 $\mu$m deeper than the surface of the n-type low resistance layer 2.

Figure 50:
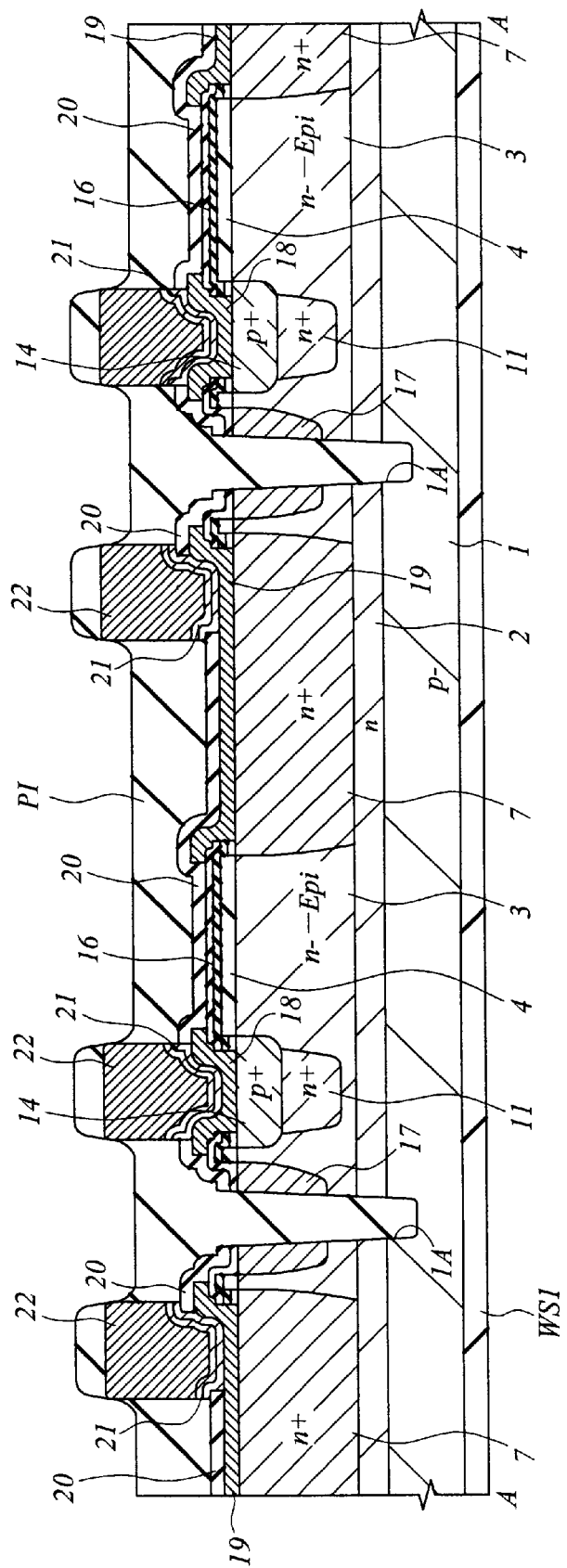
FIG. 50 is a cross-sectional view showing an essential part during a manufacturing process of the semiconductor device subsequent to FIG. 49.

Next, in step P1P, a photosensitive polyimide resin layer PI is coated over the semiconductor substrate 1 by a spin coating method, and the photosensitive polyimide resin layer (the insulating film) PI is embedded in the groove part 1A (FIG. 50). At this time, the photosensitive polyimide resin layer PI is also deposited onto each top surface of the electrode bumps 22, but each electrode bump 22 is not fully embedded in the photosensitive polyimide resin layer PI. By forming the photosensitive polyimide resin layer PI, each periphery of the electrode bumps 22 is solidified by the photosensitive polyimide resin layer PI. Therefore, at the time of mounting the variable capacitance diode of the fifth embodiment, stress acting on each electrode bump 22 can be eased. This can prevent occurrence of malfunction such as mounting failure or the like of the variable capacitance diode of the fifth embodiment.

Next, in step P1Q, such a mask that the photosensitive polyimide resin layer PI on the electrode bumps 22 is exposed is used to expose the main surface of the semiconductor substrate 1, and thereby to expose the photosensitive polyimide resin layer PI not covered with the mask. Thereafter, the photosensitive polyimide resin layer PI on the electrode bumps 22 is removed by a predetermined etching liquid.

Figure 51:
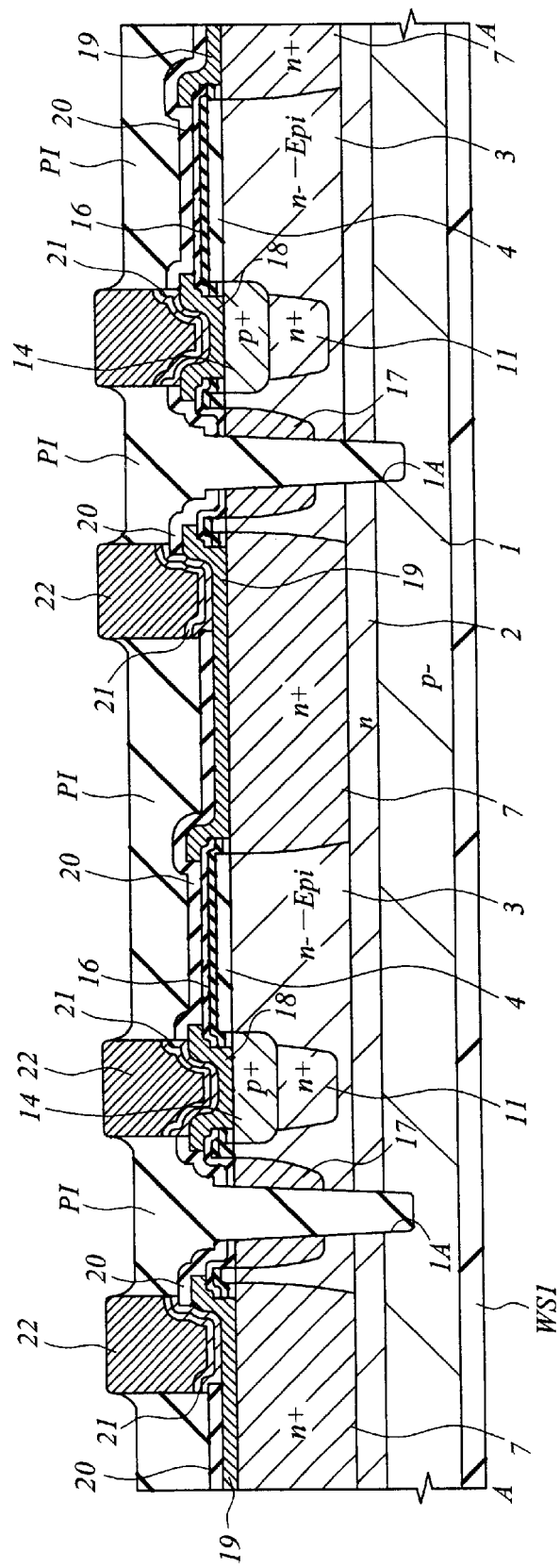
FIG. 51 is a cross-sectional view showing an essential part during a manufacturing process of the semiconductor device subsequent to FIG. 50.

In the fifth embodiment, the photosensitive polyimide resin layer PI is used, but a polyimide resin layer having no photosensitive property can be also used. In this case, after a polyimide resin layer is coated over the semiconductor substrate 1, and then the entire polyimide resin layer is cut away from the surface thereof up to a predetermined amount by, for example, an ashing method. This can remove the polyimide resin layer on each electrode bump 22, so that each electrode bump 22 cannot be fully embedded in the polyimide resin layer (FIG. 51).

Figure 52:
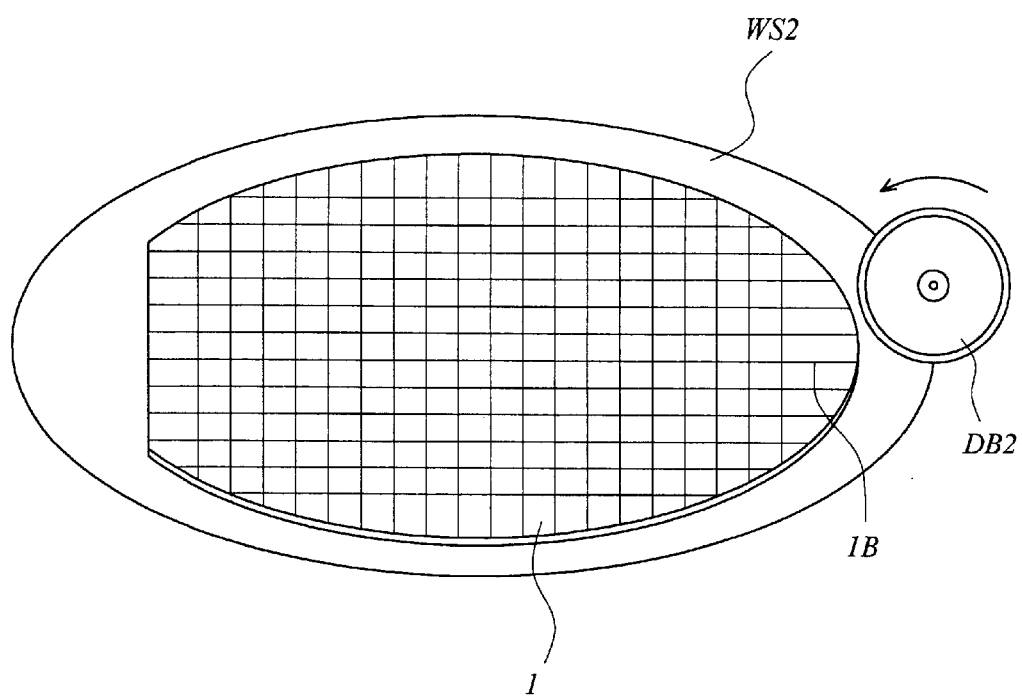
FIG. 52 is a perspective view during a manufacturing process of a semiconductor device that is another embodiment of the present invention.
Figure 53:
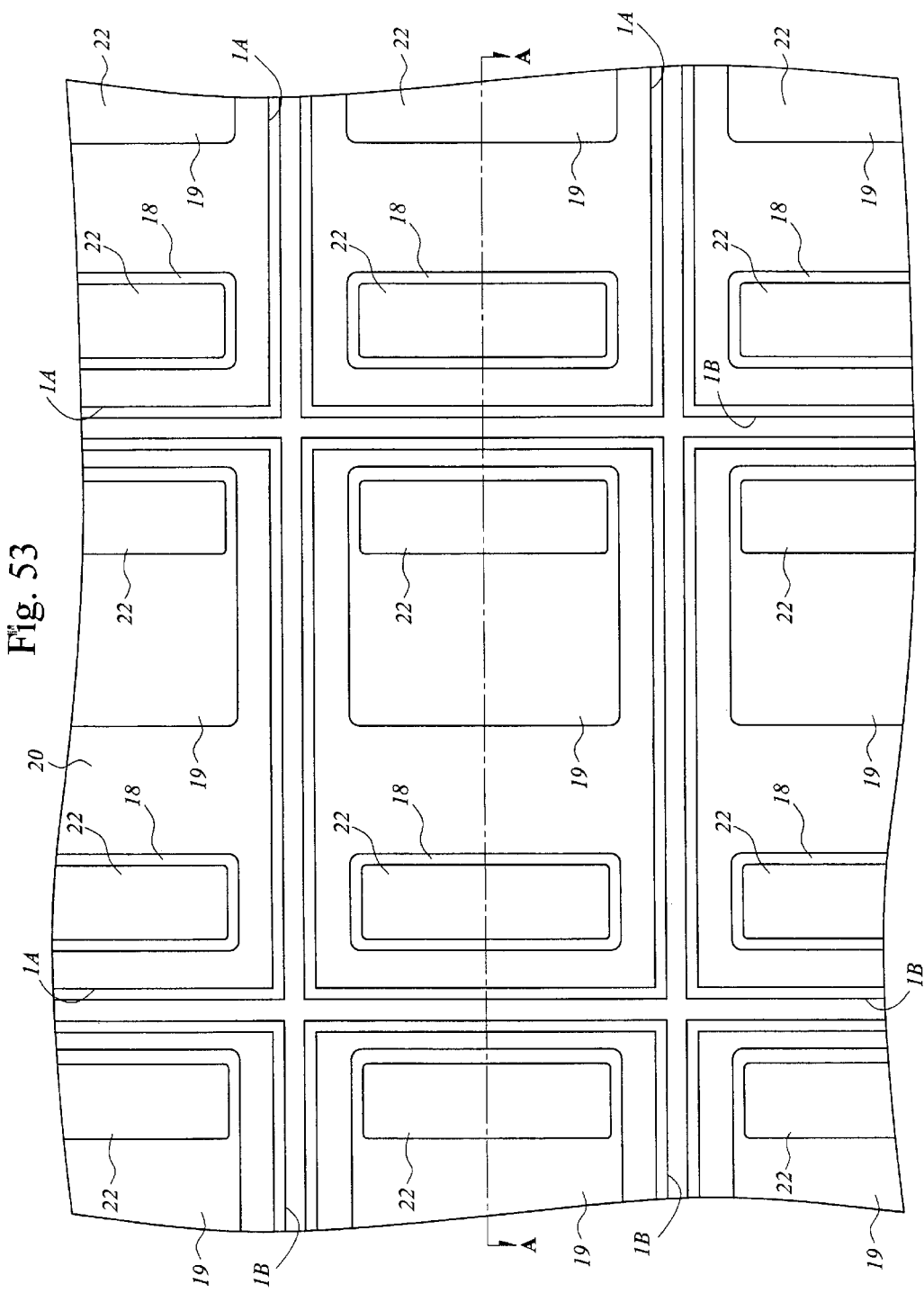
FIG. 53 is a plan view showing an essential part during a manufacturing process of the semiconductor device that is another embodiment of the present invention.
Figure 54:
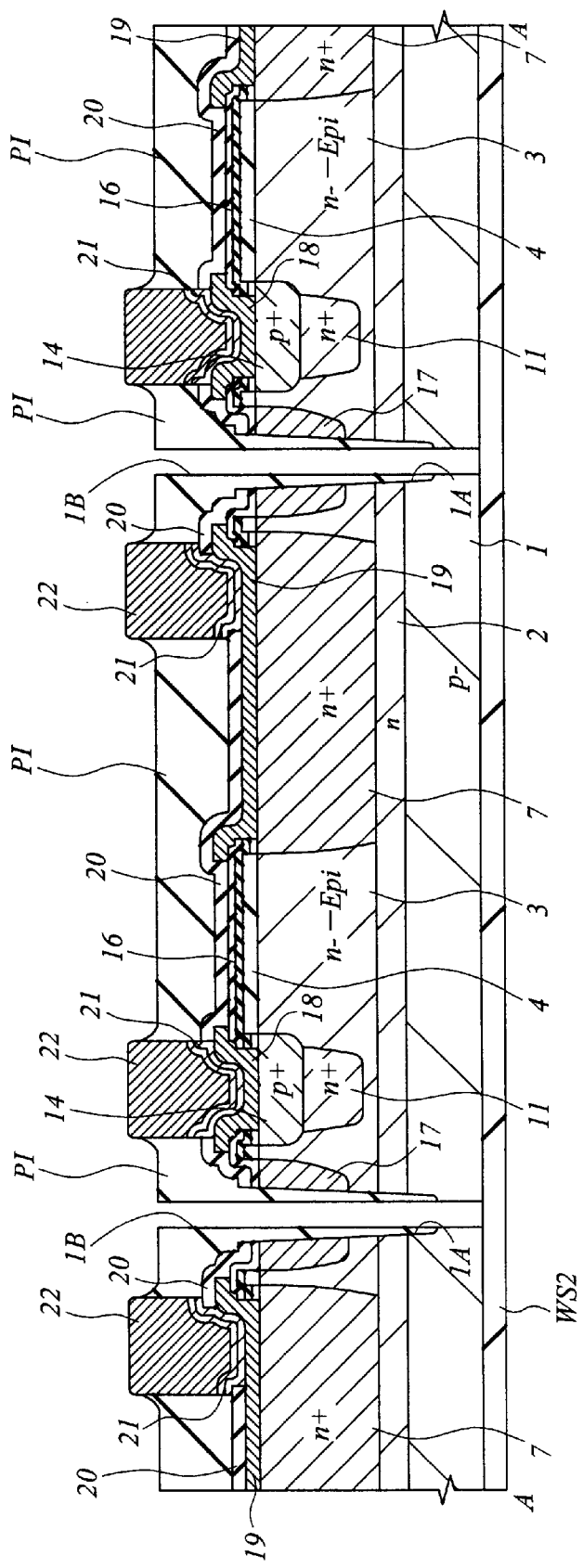
FIG. 54 is a cross-sectional view showing an essential part during a manufacturing process of the semiconductor device subsequent to FIG. 51.

As shown in FIGS. 52 to 54, in step P1R, the photosensitive polyimide resin layer PI is hardened by a thermal treatment at, for example, about 350° C. The wafer sheet WS1 is removed from the back face of the semiconductor substrate 1. Thereafter, in step P1S, the back face of the semiconductor substrate 1 is ground by, for example, a grinding method. The heights from the back face of the semiconductor substrate 1 to the respective top surfaces of the electrode bumps 22 are set at about 300 μm.

Next, a wafer sheet WS2 for dicing is attached onto the back face of the semiconductor substrate 1. Thereafter, a groove part (a second groove part) 1B reaching to the wafer sheet WS2 is formed in a dividing region for dividing the semiconductor substrate 1 into individual semiconductor-chip forming regions by means of a dicing method using a dicing blade DB2. The wafer sheet WS2 is removed from the back face of the semiconductor substrate 1, and then the semiconductor substrate 1 is divided into individual semiconductor chips to form the variable capacitance diode of the fifth embodiment (step P1M2). At this time, as the dicing blade DB2, a dicing blade having a width smaller than the above-mentioned dicing blade DB1 is used. For example, when the width of the dicing blade is about 20 μm, the width of each groove part 1B is about 30 μm. As a result, over each side face of the individual semiconductor chips, the n-type low resistance layer 2, the n⁻-type epitaxial layer 3 and the channel stopper layer 17 are covered with the photosensitive polyimide resin layer PI. This can prevent the n-type low resistance layer 2, the n⁻-type epitaxial layer 3 and the channel stopper layer 17 from being exposed from the side face of the semiconductor chip, and can prevent occurrence of such malfunction that these semiconductor layers are short-circuited in other conductive regions. Further, on the side face of the above-mentioned semiconductor chip, the photosensitive polyimide resin layer PI covers at least the whole of the n-type low resistance layer 2, the n⁻-type epitaxial layer 3 and the channel stopper layer 17. Therefore, it is possible to prevent moisture from entering into the semiconductor chip from the cut face (the groove part 1A (see FIGS. 47 to 49)) formed in step P1O (see FIG. 43) described above. This can prevent the characteristic of the variable capacitance diode of the fifth embodiment from deteriorating and thereby to enhance the reliability thereof.

According to the fifth embodiment, with the photosensitive polyimide resin layer PI, the main surface (element forming face) of the semiconductor substrate 1 is covered. Therefore, after the variable capacitance diode of the fifth embodiment is mounted on the mounting board, a gap between the variable capacitance diode and the mounting board is filled with an undercoat material, and thereby it is unnecessary to prevent contamination of the variable capacitance diode. As a result, since the undercoat material need not be prepared in a side of a user or users using the variable capacitance diode of the fifth embodiment, cost of the material required in the user side can be reduced. Moreover, since the periphery of each side face of the electrode bumps 22 is covered with the photosensitive polyimide resin layer PI, stress caused by each electrode bump 22 can be eased and reduced.

According to the fifth embodiment, before the semiconductor substrate 1 in a wafer state is divided into individual semiconductor chips, the photosensitive polyimide resin layer PI is coated. Therefore, the semiconductor chip (variable capacitance diode) can be formed with high accuracy. Further, since the photosensitive polyimide resin layer PI is coated onto the semiconductor substrate 1 in a wafer state, the manufacturing process thereof can be shortened in comparison with the case of resin-sealing the individual semiconductor chips and the use efficiency of the photosensitive polyimide resin layer PI can be enhanced.

According to the fifth embodiment, the characteristic of the individual semiconductor chips can be inspected before the semiconductor substrate 1 is divided into the individual semiconductor chips. The position of the semiconductor chip judged to be a good product by the inspection is recorded. Therefore, after the semiconductor substrate 1 is divided into the individual semiconductor chips, only the semiconductor chips that are good products can be picked up. This can simplify a mechanism for selecting the semiconductor chips that are good products, and can suppress the facility investment to the mechanism.

Figure 55:
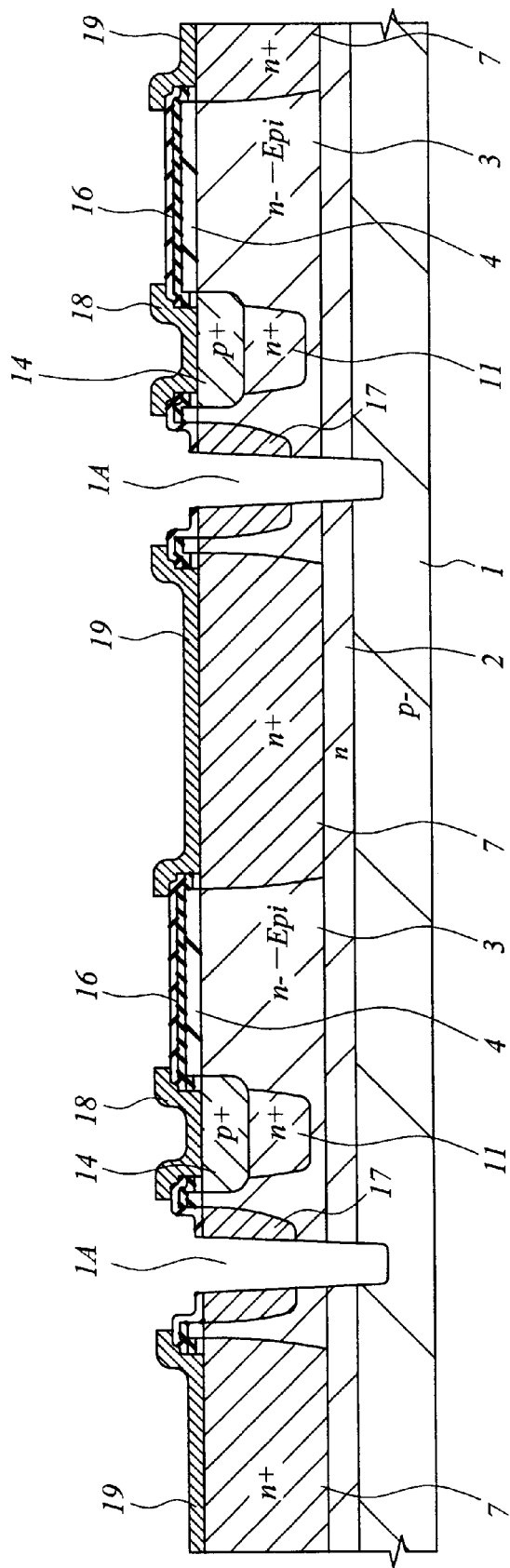
FIG. 55 is a cross-sectional view showing an essential part during a manufacturing process of the semiconductor device that is another embodiment of the present invention.

The fifth embodiment shows the case of forming the groove part 1A by a half cutting method using the dicing blade DB1 (see FIGS. 47 to 49) similarly to step P1O (see FIG. 43). However, the groove part 1A can be also formed by another method. For example, between step P1I (see FIG. 6) and step P1J (see FIG. 6) explained in the first embodiment, the groove part 1A can be formed by a wet etching method (FIG. 55). In this case, in step P1J, the final passivation film 20 (see FIG. 2 or 14) is formed on the side face and the bottom of the groove part 1A. Step P1O is thus unnecessary, but the other manufacturing processes are similar to the manufacturing process of the fifth embodiment described above.

Figure 56:
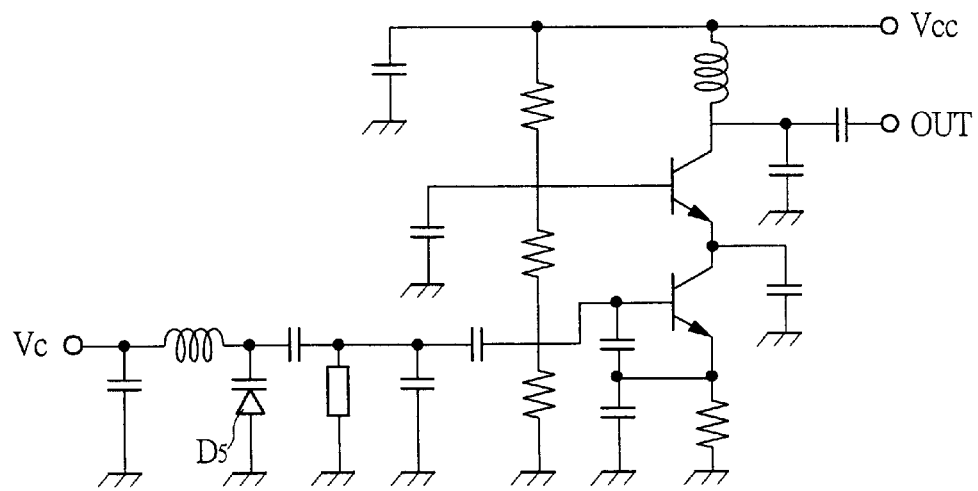
FIG. 56 is a circuit diagram of a voltage controlled oscillator constructed by using the semiconductor device manufactured by the manufacturing methods shown in FIGS. 43 to 55.
Figure 57:
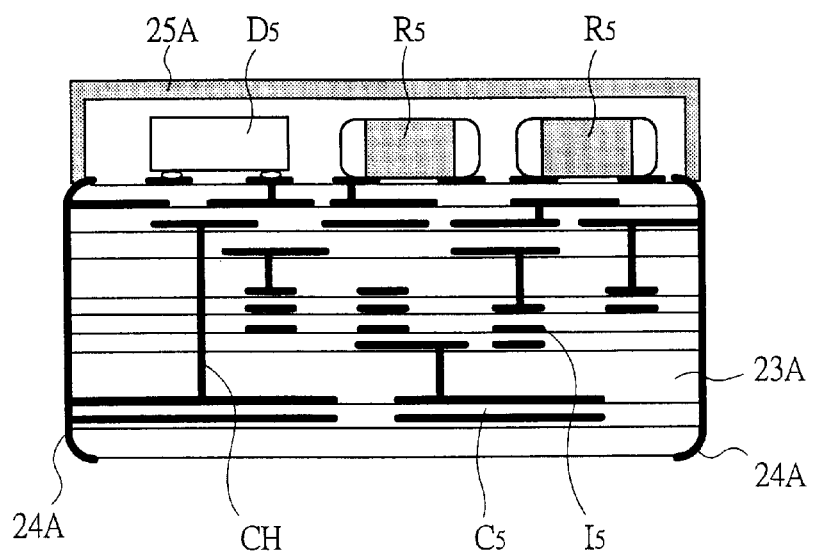
FIG. 57 is a cross-sectional view showing an essential part of a voltage controlled oscillator module in which the semiconductor device that is another embodiment of the present invention and chip resistors are mounted on a mounting board.

The variable capacitance diode of the fifth embodiment formed as described above can be applied to a voltage controlled oscillator (VCO). FIG. 56 shows one example of a circuit of a voltage controlled oscillator applying the variable capacitance diode $D_5$ of the fifth embodiment. Such a voltage controlled oscillator can be used as a voltage controlled oscillator module as shown in FIG. 57. The voltage controlled oscillator module shown in FIG. 57 is formed by mounting a variable capacitance diode $D_5$ and a chip resistance $R_5$ onto the mounting surface of a mounting board 23A laminating an insulating film. Elements such as a capacitor $C_5$ and an inductor $I_5$ and the like are formed inside the mounting board 23A. These elements are electrically connected to the variable capacitance diode $D_5$, the chip resistance $R_5$ and an electrode terminal 24A, via a wiring line formed on the surface and in the inside (in a contact hole CH) of the mounting board 23A. The mounting surface of such a mounting board 23A is covered with a shielding case 25A.

Even in the variable capacitance diode $D_5$ of the fifth embodiment, similarly to the variable capacitance diode $D_2$ of the first embodiment (see FIG. 5), the height thereof can be the resistance $R_5$. This can reduce in a height direction the size of the voltage controlled oscillator module shown in FIG. 57.

Figure 58:
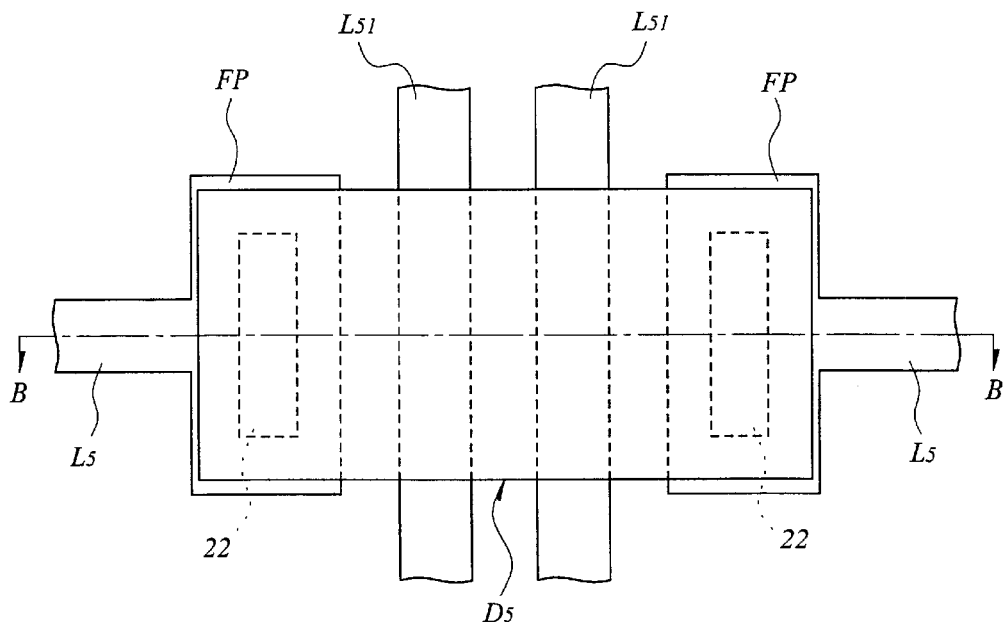
FIG. 58 is a plan view showing an essential part when the semiconductor device that is another embodiment of the present invention is mounted on the mounting board.
Figure 59:
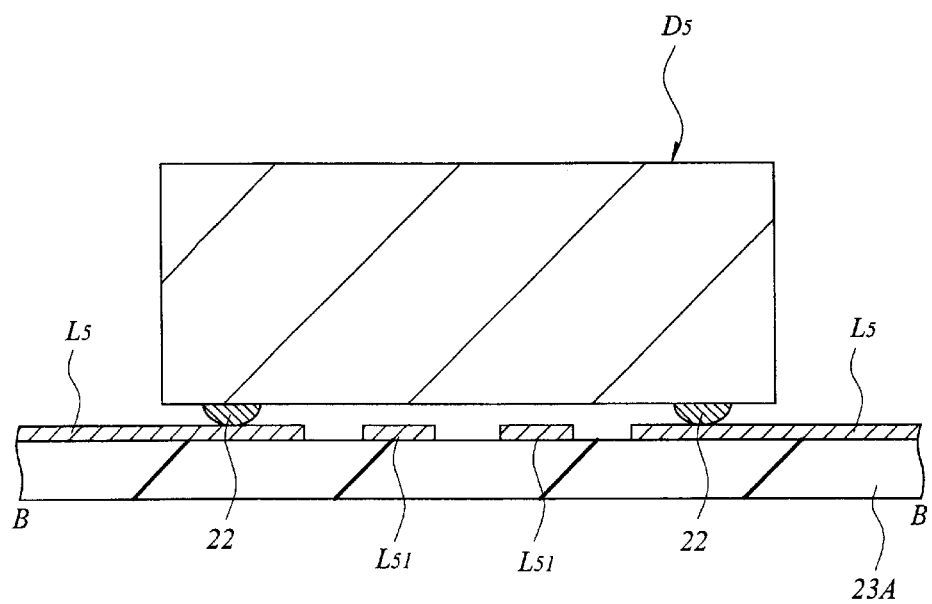
FIG. 59 is a cross-sectional view showing an essential part when the semiconductor device that is to another embodiment of the present invention is mounted on a mounting board.

FIG. 58 shows enlargement of the periphery of the mounting region of the variable capacitance diode $D_5$ of the voltage controlled oscillator module shown in FIG. 57. FIG. 59 is a cross-sectional view taken along line B—B of FIG. 58. As shown in FIGS. 58 and 59, the variable capacitance diode $D_5$ is facedown bonded by connecting a footprint FP to the electrode bump 22. The footprint FP is a part of a wiring line $L_5$ formed on the surface of the mounting board 23A, and is provided on the end portion of the wiring line $L_5$. As described above, in the fifth embodiment, a wiring line $L_{51}$ that is a part of a wiring line constituting a voltage controlled oscillator is formed on the variable capacitance diode $D_5$ and the surface of the mounting board 23A to arrange the wiring line efficiently. Accordingly, as shown in FIG. 57, the voltage controlled oscillator module can be made smaller. Further, a resin is filled as underfill between the variable capacitance diode $D_5$ and the mounting board 23A thereunder. Therefore, it is possible to prevent each electrode bump 22 of the variable capacitance diode $D_5$ and each wiring line $L_5$ on the surface of the mounting board 23A, from being short-circuited, and thereby to improve the reliability of the above-mentioned module.

Sixth Embodiment

A semiconductor device of a sixth embodiment is a modification of the PIN diode (see FIGS. 17 to 19) having been explained in the second embodiment.

Figure 60:
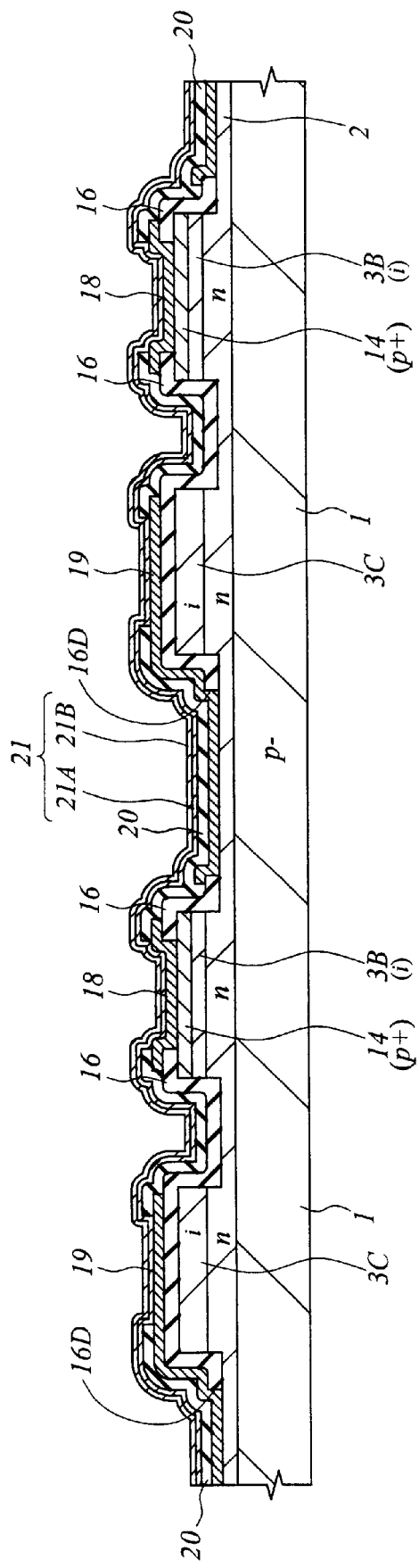
FIG. 60 is a cross-sectional view showing an essential part for explaining a manufacturing method of a semiconductor device that is another embodiment of the present invention.

A manufacturing process of the variable capacitance diode of the sixth embodiment is similar until the step of forming the final passivation film 20 (see FIG. 27) of step P2H (see FIG. 21) explained in the second embodiment. Thereafter, in a step similar to step P1K2 (see FIG. 43) explained in the fifth embodiment, a 1st under bump metal 21A and a 2nd under bump metal 21B are formed to form an under bump metal 21 comprising the 1st under bump metal 21A and the 2nd under bump metal 21B (FIG. 60).

Figure 61:
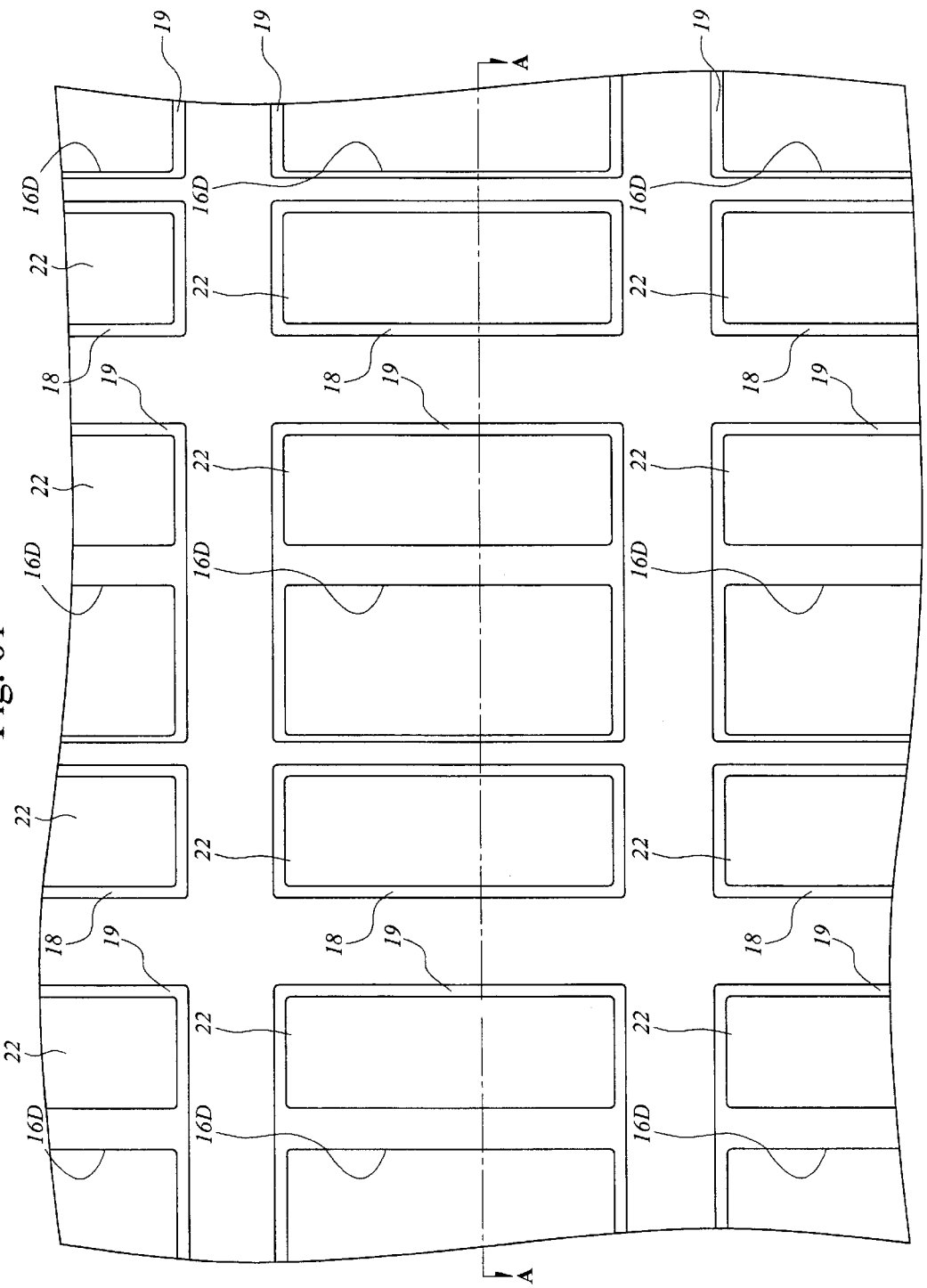
FIG. 61 is a plan view showing an essential part during a manufacturing process of a semiconductor device that is another embodiment of the present invention.
Figure 62:
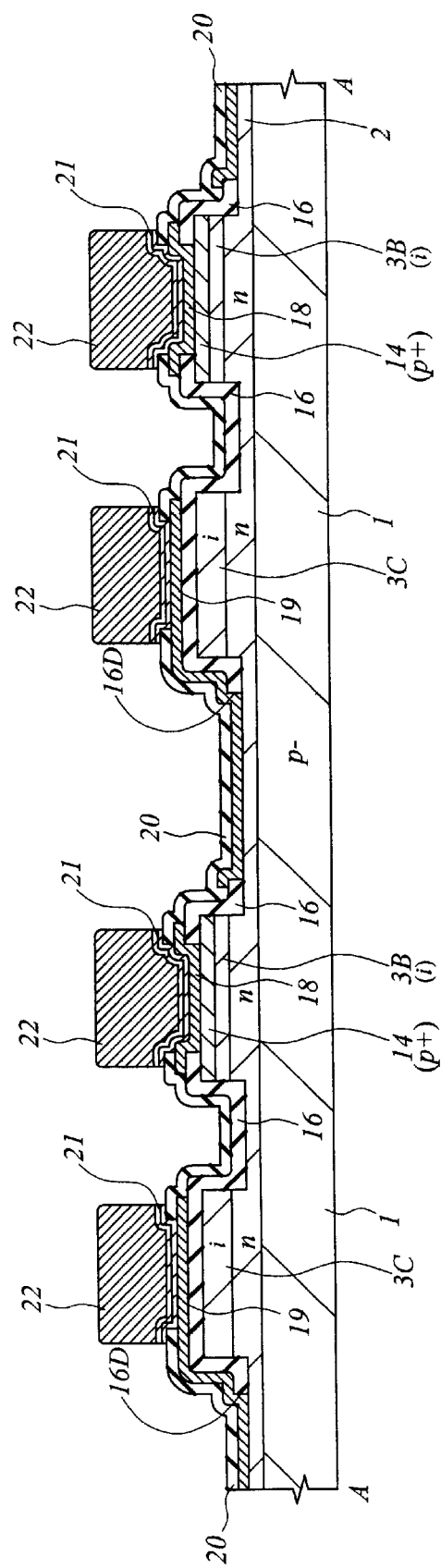
FIG. 62 is a cross-sectional view showing an essential part during a manufacturing process of the semiconductor device subsequent to FIG. 60.

Next, in a step similar to step P1L2 (see FIG. 43) explained in the fifth embodiment, two electrode bumps 22 are formed on the main surface of a region that comes to a semiconductor chip. As shown in FIG. 17 of the second embodiment, four electrode bumps 22 may be symmetrically arranged in a vertical and horizontal directions on the main surface of the region that comes to the semiconductor chip. In a step similar to step P1M (see FIG. 6) explained in the first embodiment, the under bump metal 21 located in a region other than the region on which electrode bumps 22 is formed is removed (see FIGS. 61 and 62).

Figure 63:
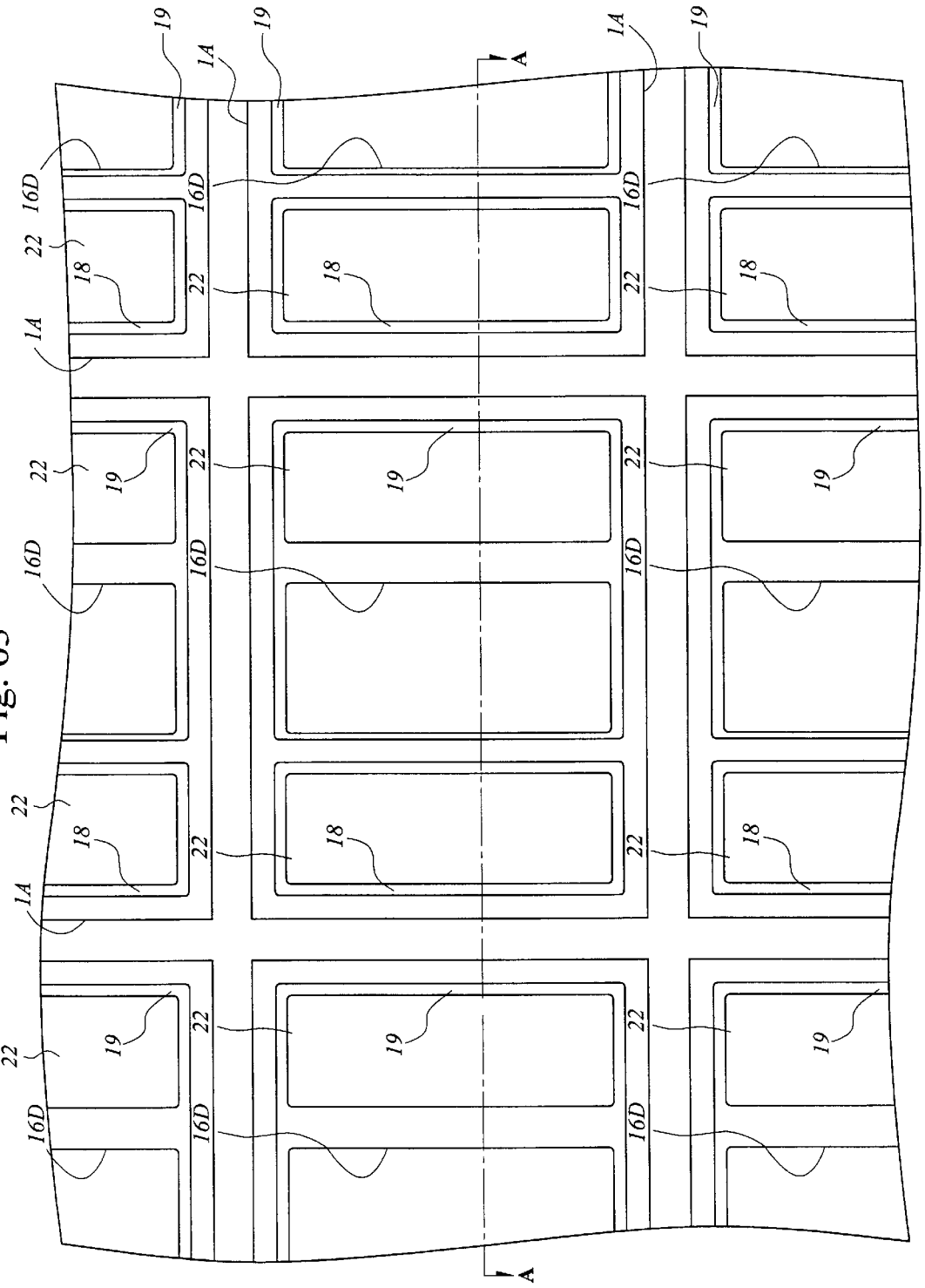
FIG. 63 is a plan view showing an essential part during a manufacturing process of the semiconductor device subsequent to FIG. 61.
Figure 64:
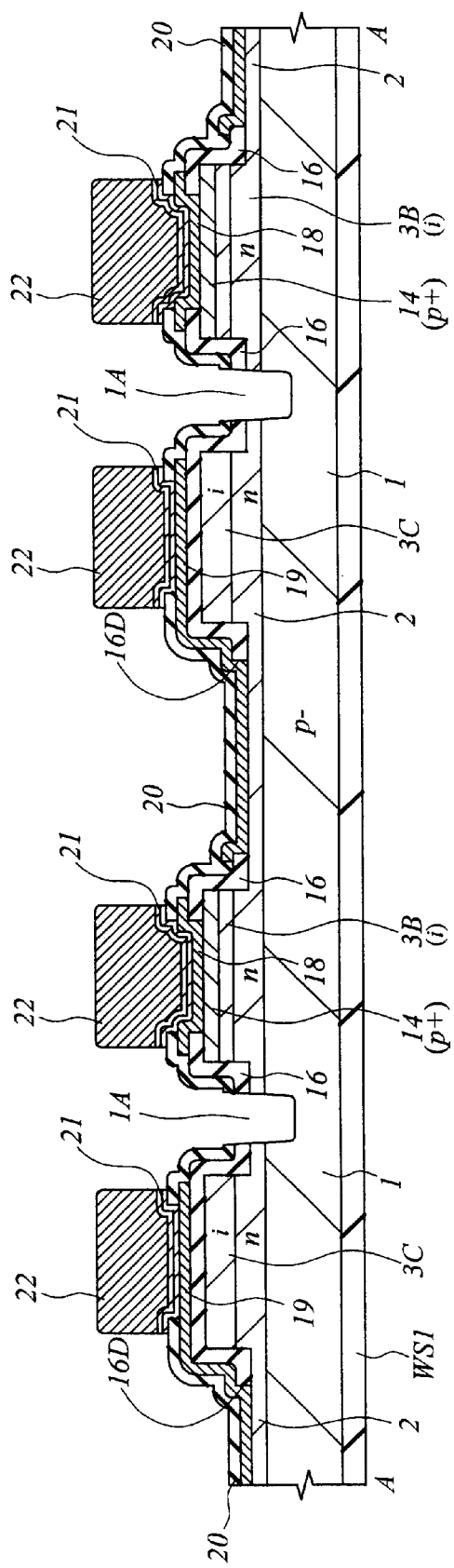
FIG. 64 is a cross-sectional view showing an essential part during a manufacturing process of the semiconductor device subsequent to FIG. 62.

Next, in a step similar to step P1O (see FIG. 43) explained in the fifth embodiment, after a wafer sheet WS1 for dicing is attached onto the back face of a semiconductor substrate 1 in a wafer state, a groove part 1A is formed in a dividing region for dividing the semiconductor substrate 1 into individual semiconductor-chip forming regions by a half cutting method using a dicing blade (see FIGS. 63 and 64). At this time, the lower surface of the groove part 1A is formed to be lower than the n-type low resistance layer 2. For example, the lower surface of the groove part 1A is positioned in a place about 30 to 40 µm deeper than the n-type low resistance layer 2.

Figure 65:
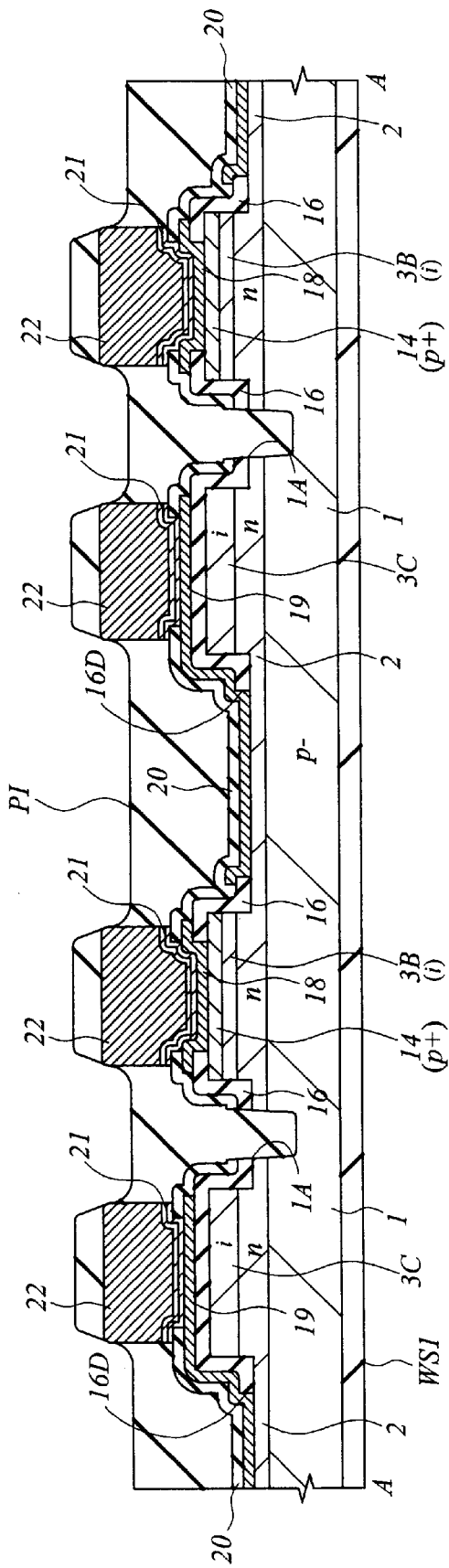
FIG. 65 is a cross-sectional view showing an essential part during a manufacturing process of the semiconductor device subsequent to FIG. 64.
Figure 66:
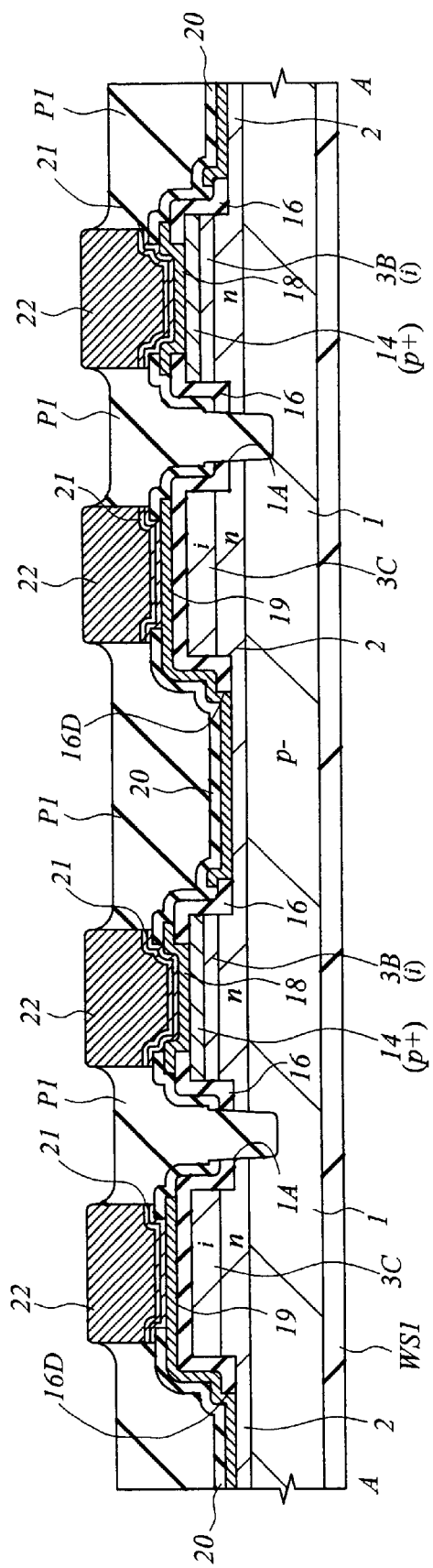
FIG. 66 is a cross-sectional view showing an essential part during a manufacturing process of the semiconductor device subsequent to FIG. 65.

Next, in a step similar to step P1P (see FIG. 43) explained in the fifth embodiment, a photosensitive polyimide resin layer PI is coated over the semiconductor substrate 1, and thereby the groove part 1A is embedded in the photosensitive polyimide resin layer PI (FIG. 65). In a step similar to step P1Q (see FIG. 43) explained in the fifth embodiment, such a mask that the photosensitive polyimide resin layer PI on the electrode bumps 22 is exposed is used to expose the main surface of the semiconductor substrate 1, and thereby the photosensitive polyimide resin layer PI not covered with the mask is exposed. Then the photosensitive polyimide resin layer PI on the electrode bump 22 is removed by a predetermined etching liquid (FIG. 66). The sixth embodiment also illustrates that the photosensitive polyimide resin layer PI is used similarly to the fifth embodiment. However, a polymide resin layer having no photosensitive property can be also used.

Then, in a step similar to step P1R (see FIG. 43) explained in the fifth embodiment, the photosensitive polyimide resin layer PI is hardened. The wafer sheet WS1 is removed from the back face of the semiconductor substrate 1. Thereafter, the back face of the semiconductor substrate 1 is ground by, for example, a grinding method, and the heights from the back face of the semiconductor substrate 1 to the respective top faces of the electrode bumps 22 are set at about 300 µm.

Figure 67:
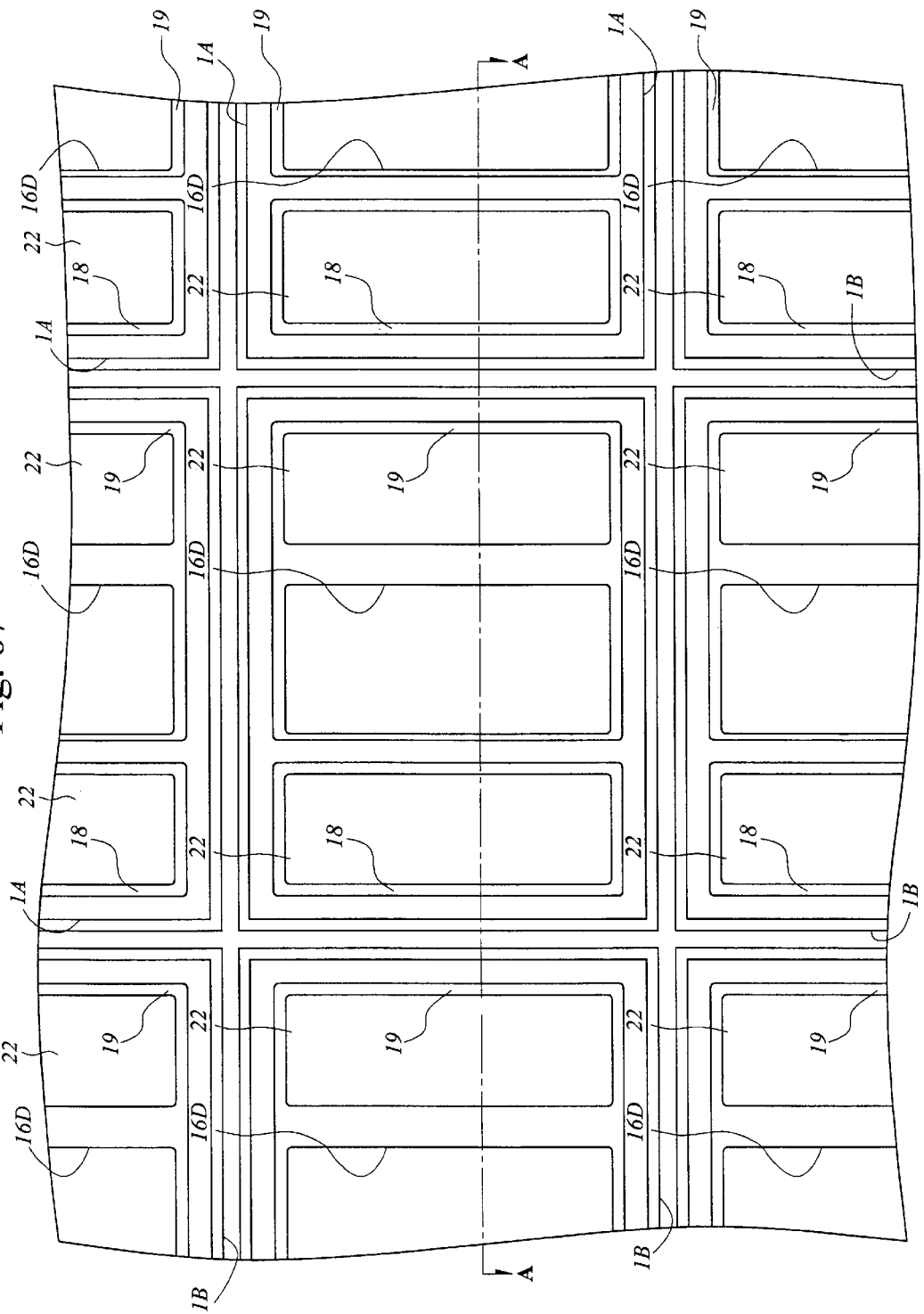
FIG. 67 is a plan view showing an essential part during a manufacturing process of a semiconductor device that is another embodiment of the present invention.
Figure 68:
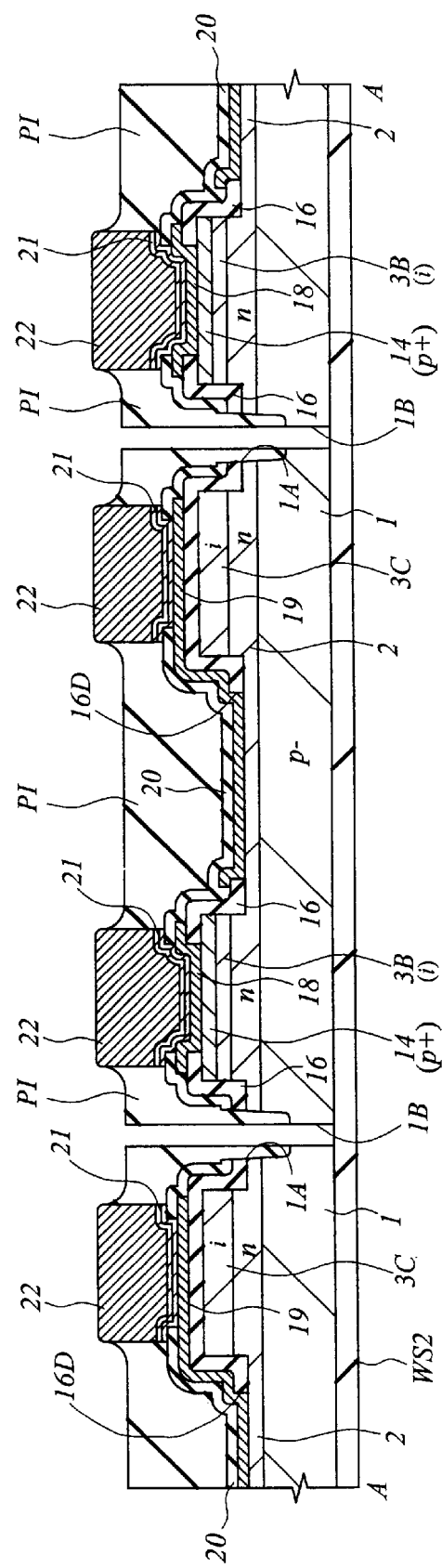
FIG. 68 is a cross-sectional view showing an essential part during a manufacturing process of the semiconductor device subsequent to FIG. 66.

Next, a wafer sheet WS2 for dicing is attached onto the back face of the semiconductor substrate 1. Thereafter, in a step similar to step P1M2 (see FIG. 43) explained in the fifth embodiment, a groove part 1B reaching to the wafer sheet WS2 is formed in a dividing region for dividing the semiconductor substrate 1 into individual semiconductor-chip forming regions by means of a dicing method. The dicing blade used at this time has a width smaller than the dicing blade used for forming the above-mentioned groove part 1A. As a result, on each side face of the individual semiconductor chips, the n-type low resistance layer 2 is covered with the photosensitive polyimide resin layer PI. This can prevent the n-type low resistance layer 2 from being exposed from each side face of the semiconductor chips, and can prevent occurrence of such malfunction that the n-type low resistance layer 2 is short-circuited in other conductive regions. Further, on each side face of the semiconductor chips, the photosensitive polyimide resin layer PI covers at least the whole of the n-type low resistance layer 2. Therefore, it is possible to prevent moisture from entering into each semiconductor chips from the groove part 1A (see FIGS. 63 and 64). This can prevent the characteristic of the PIN diode of the sixth embodiment from deteriorating to improve the reliability (FIGS. 67 and 68). The wafer sheet WS2 is removed from the back face of the semiconductor substrate 1 to divide the semiconductor substrate 1 into individual semiconductor chips, and thereby the PIN diode of the sixth embodiment is formed.

Figure 69:
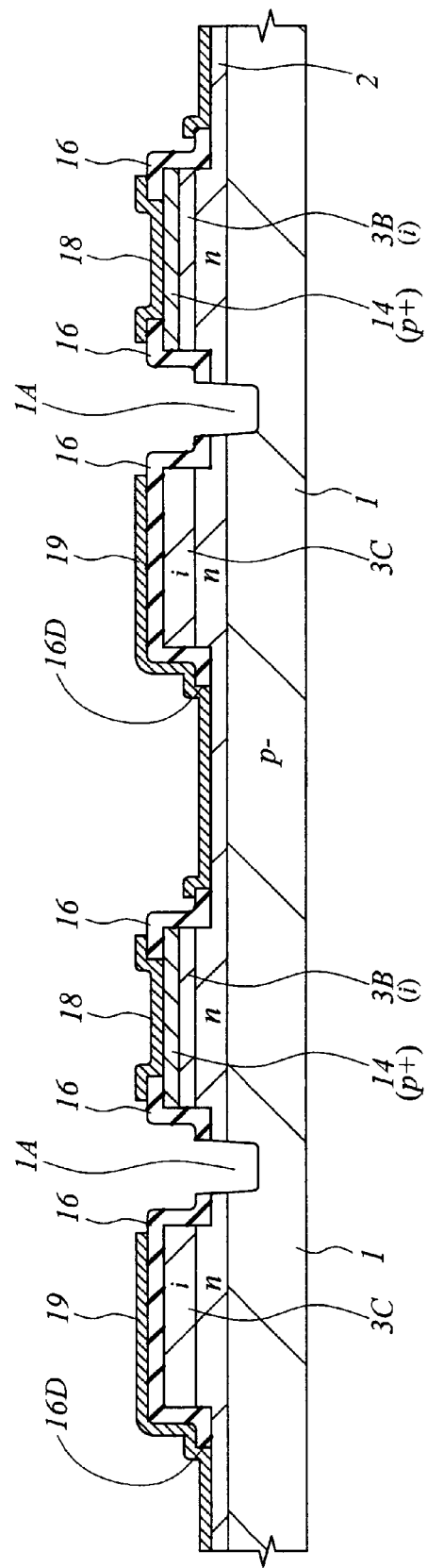
FIG. 69 is a cross-sectional view showing an essential part during a manufacturing process of the semiconductor device that is another embodiment of the present invention.

The sixth embodiment illustrates the case of forming the groove part 1A by a half cutting method (see FIGS. 63 and 64). However, a wet etching method as shown in the fifth embodiment can be also used. In this case, the groove part 1A can be formed by a wet etching method between step P2G (see FIG. 21) and step P2H (see FIG. 21) explained in the second embodiment (FIG. 69). In this case, in step P2H, the final passivation film 20 (see FIG. 18 or 27) is formed on the side face and the bottom of the groove part 1A. The step of forming the groove part 1A by a half cutting method is thus unnecessary. However, the other manufacturing processes are similar to the manufacturing process of the fifth embodiment.

The above-mentioned sixth embodiment can obtain the same effect as the above-mentioned fifth embodiment.

Seventh Embodiment

A semiconductor device of a seventh embodiment is a modification of the PIN diode (see FIGS. 29 to 33) explained in the third embodiment and the PIN diode (see FIGS. 67 and 69) explained in the sixth embodiment.

Figure 70:
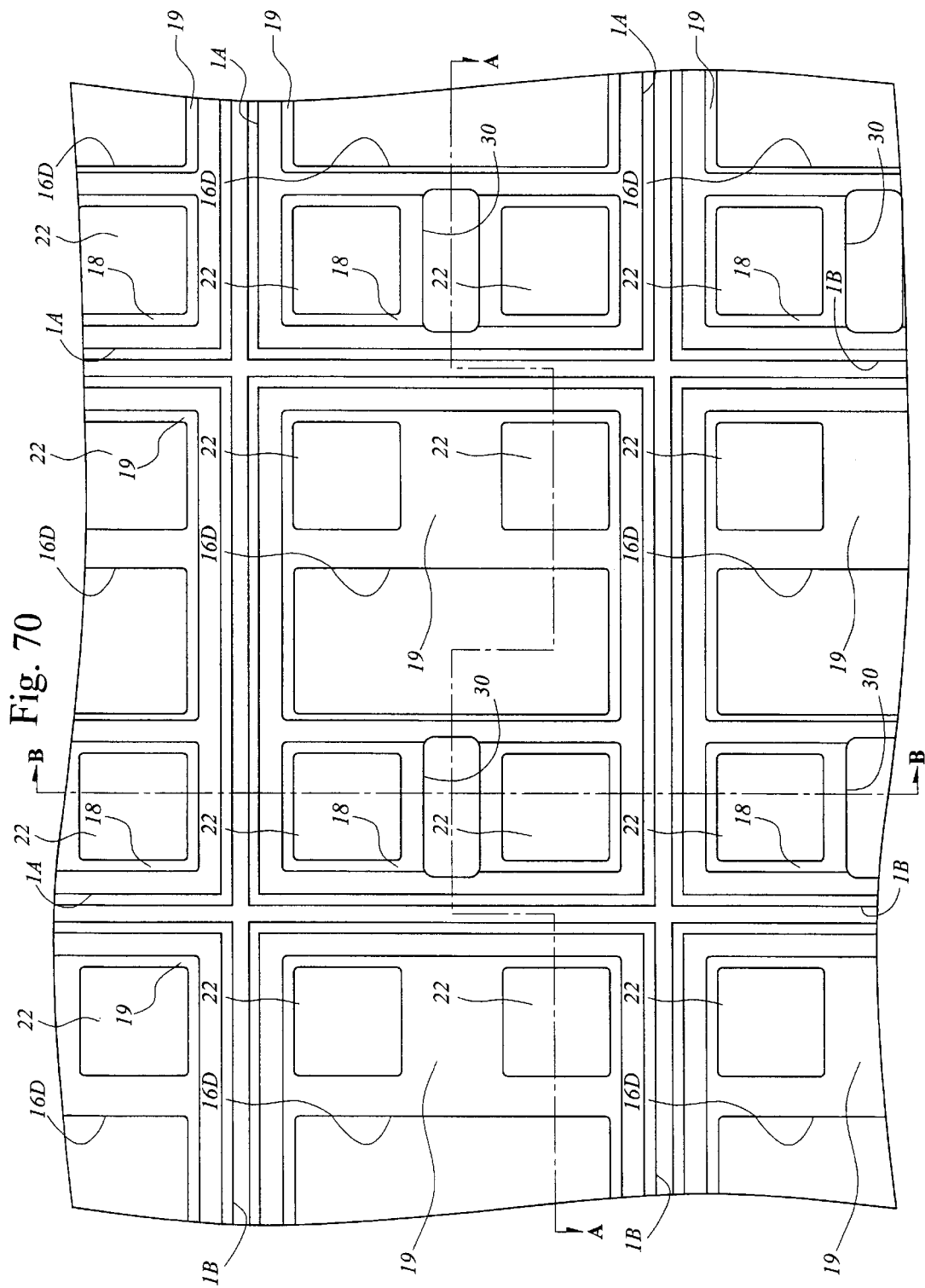
FIG. 70 is a plan view showing an essential part of a semiconductor device that is a seventh embodiment of the present invention.
Figure 71:
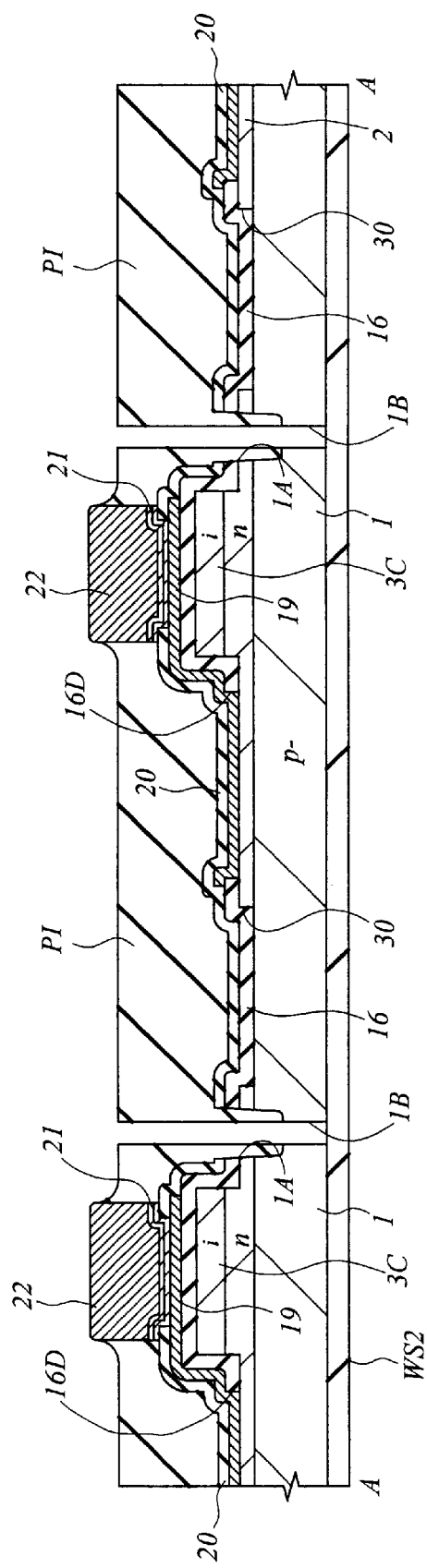
FIG. 71 is a cross-sectional view showing an essential part of the semiconductor device taken along line A—A of FIG. 70.
Figure 72:
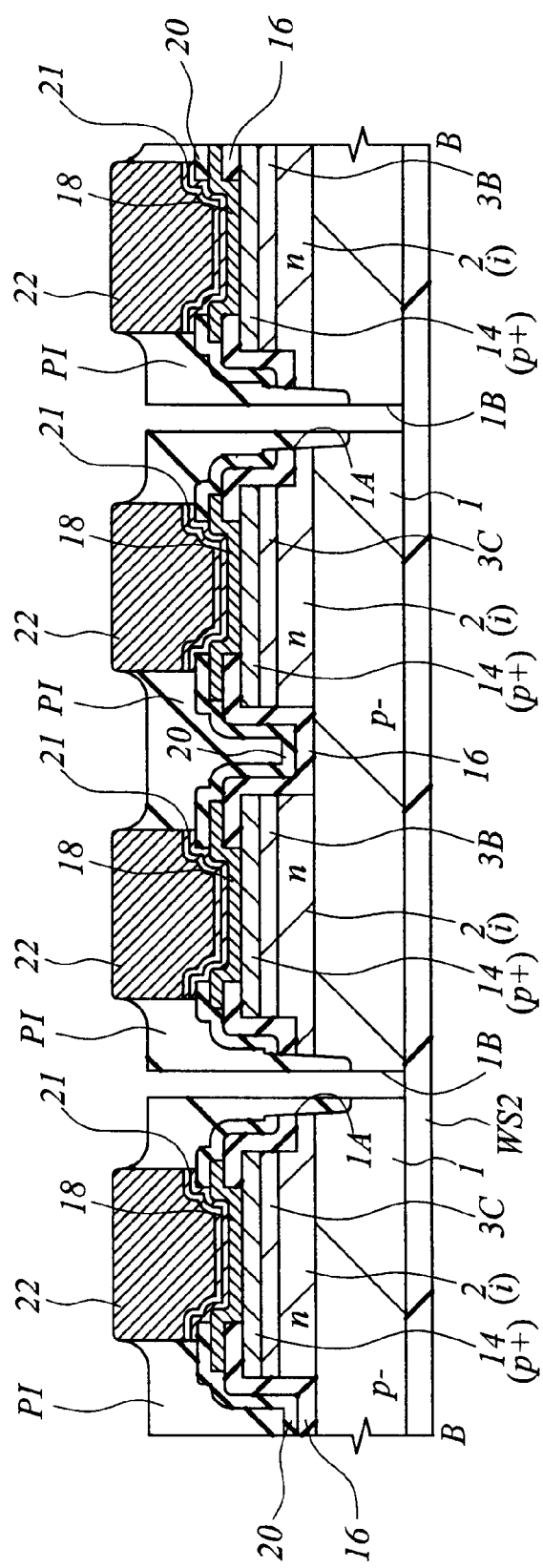
FIG. 72 is a cross-sectional view showing an essential part of the semiconductor device taken along line B—B of FIG. 70.

FIG. 70 shows a plan view showing the PIN diode of the seventh embodiment. FIG. 71 is a cross-sectional view taken along line A—A of FIG. 70. FIG. 72 is a cross-sectional view taken along line B—B of FIG. 70.

In the PIN diode of the seventh embodiment, similarly to the PIN diode of the third embodiment, an n-type low resistance layer 2, an intrinsic epitaxial layer 3B and a $p^+$-type diffusion layer 14 forming a pin junction (PIN diode element) are electrically separated by a groove 30. Thereby, two PIN diode elements can be formed in a package having the same size as the package of the PIN diode of the sixth embodiment.

In the PIN diode of the seventh embodiment, similarly to the PIN diode of the sixth embodiment, on each side face of the semiconductor chips, the n-type low resistance layer 2 is covered with a photosensitive polyimide resin layer PI. For this reason, the PIN diode of the seventh embodiment can obtain the same effect as the sixth embodiment.

Figure 73:
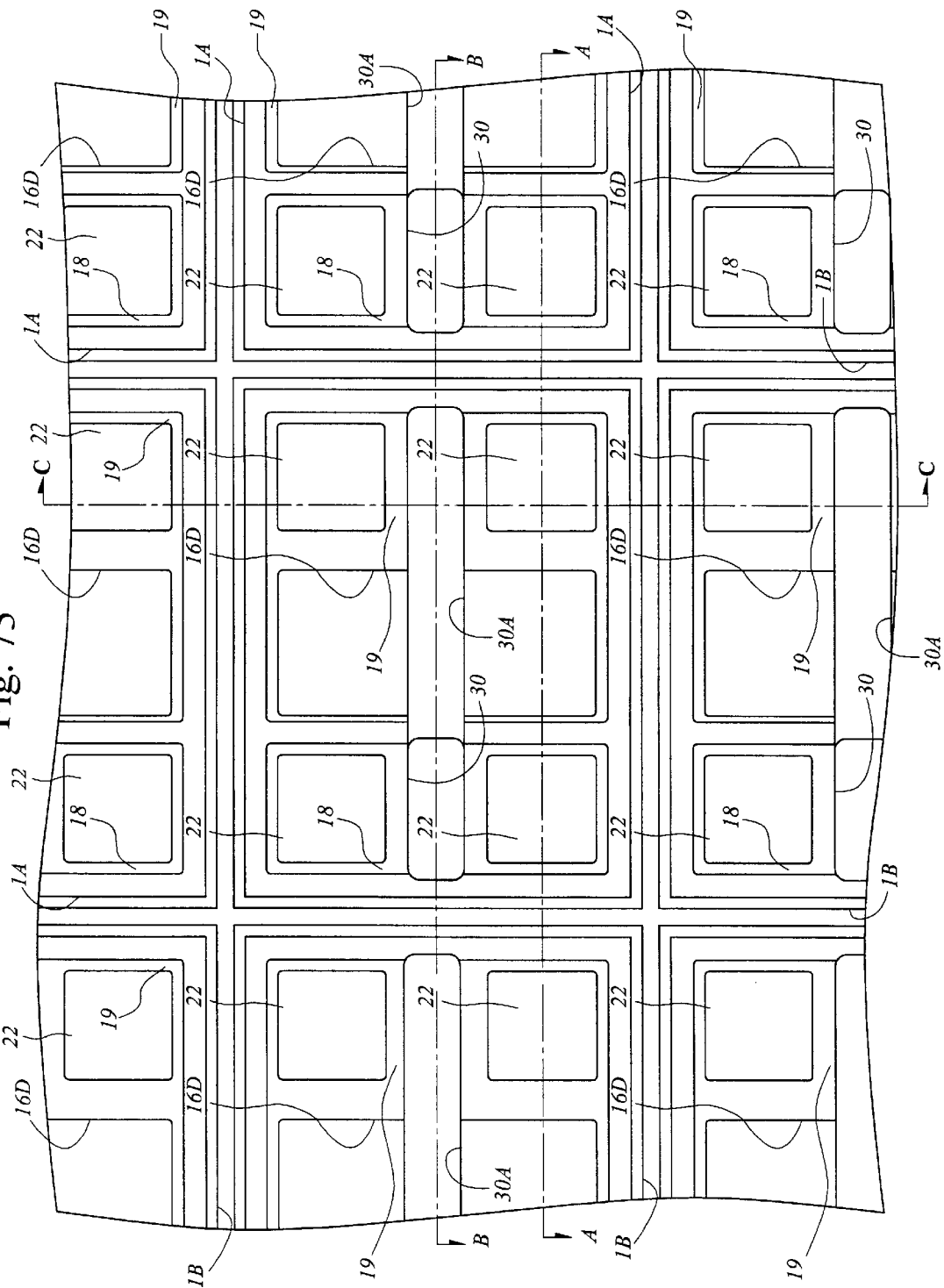
FIG. 73 is a plan view showing an essential part of another semiconductor device that is the seventh embodiment of the present invention.
Figure 74:
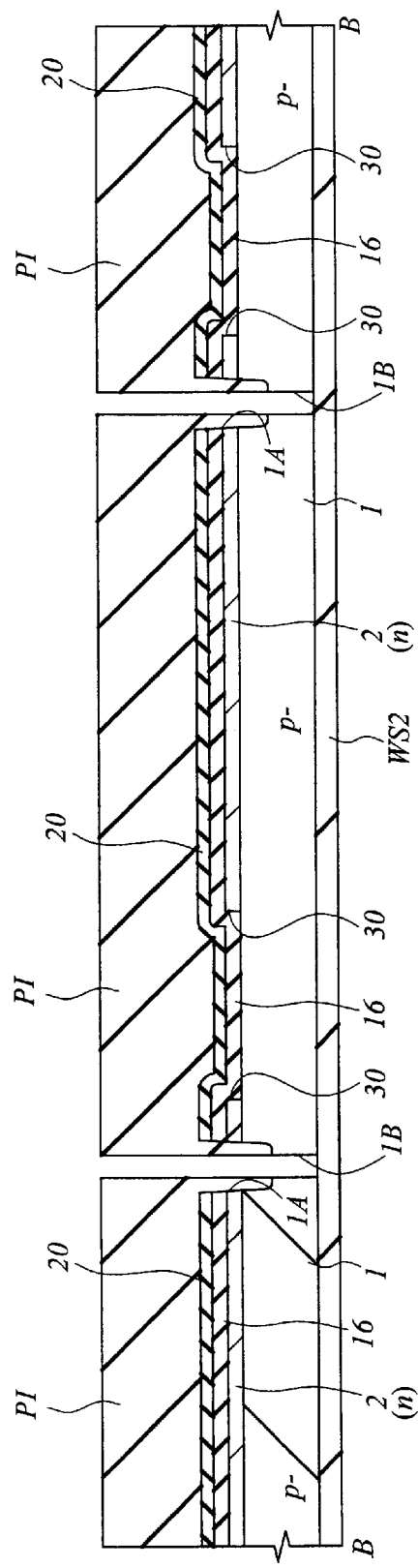
FIG. 74 is a cross-sectional view showing an essential part of the semiconductor device taken along line B—B of FIG. 73.
Figure 75:
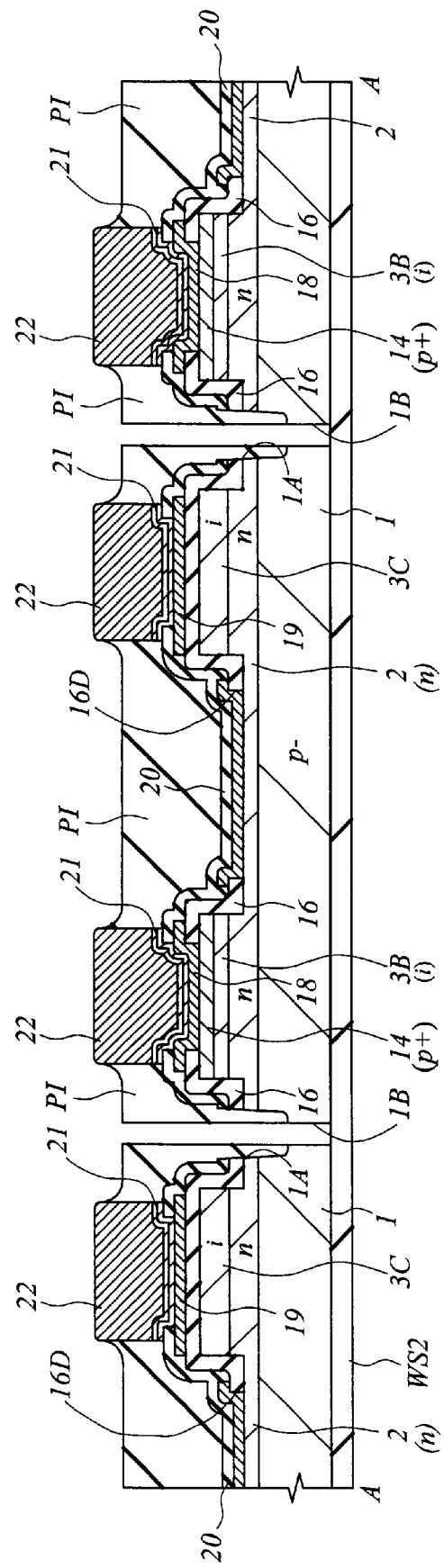
FIG. 75 is a cross-sectional view showing an essential part of the semiconductor device taken along line A—A of FIG. 73.
Figure 76:
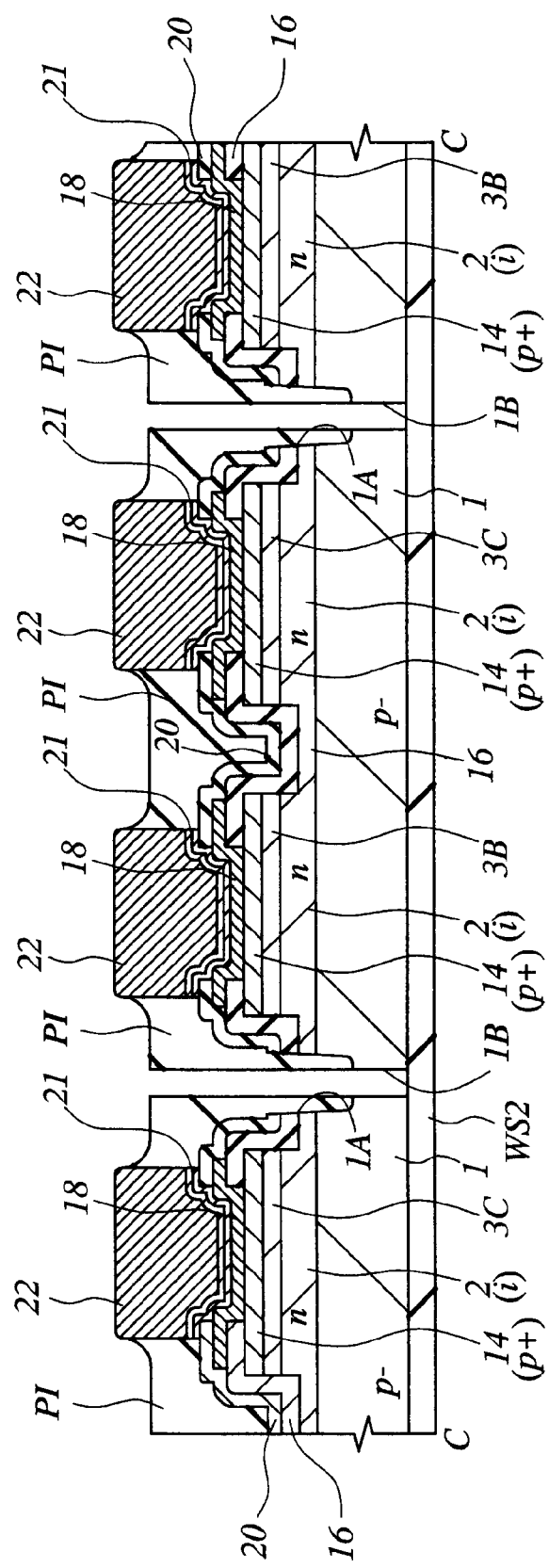
FIG. 76 is a cross-sectional view showing an essential part of the semiconductor device taken along line C—C of FIG. 73.

Even in the seventh embodiment, similarly to the third embodiment, three PIN diode elements can be formed in one package. FIG. 73 is a plan view showing one example of the case of forming three PIN diode elements. FIG. 74 is a cross-sectional view taken along line B—B of FIG. 73. FIG. 75 is a cross-sectional view taken along line A—A of FIG 73. FIG. 76 is a cross-sectional view taken along line C—C of FIG. 73. Also in the seventh embodiment, a cathode electrode 19 in FIG. 70 is divided into two by a groove 30A, in which one of them is an anode electrode 19A. PIN diode elements are formed in the lower portion of the anode electrode 19A to form three PIN diode elements in one package.

The seventh embodiment as described above can also obtain the same effect as the fifth and sixth embodiments.

Eighth Embodiment

A semiconductor device of an eighth embodiment is a modification of the Schottky barrier diode (see FIGS. 40 to 42) explained in the fourth embodiment.

Figure 77:
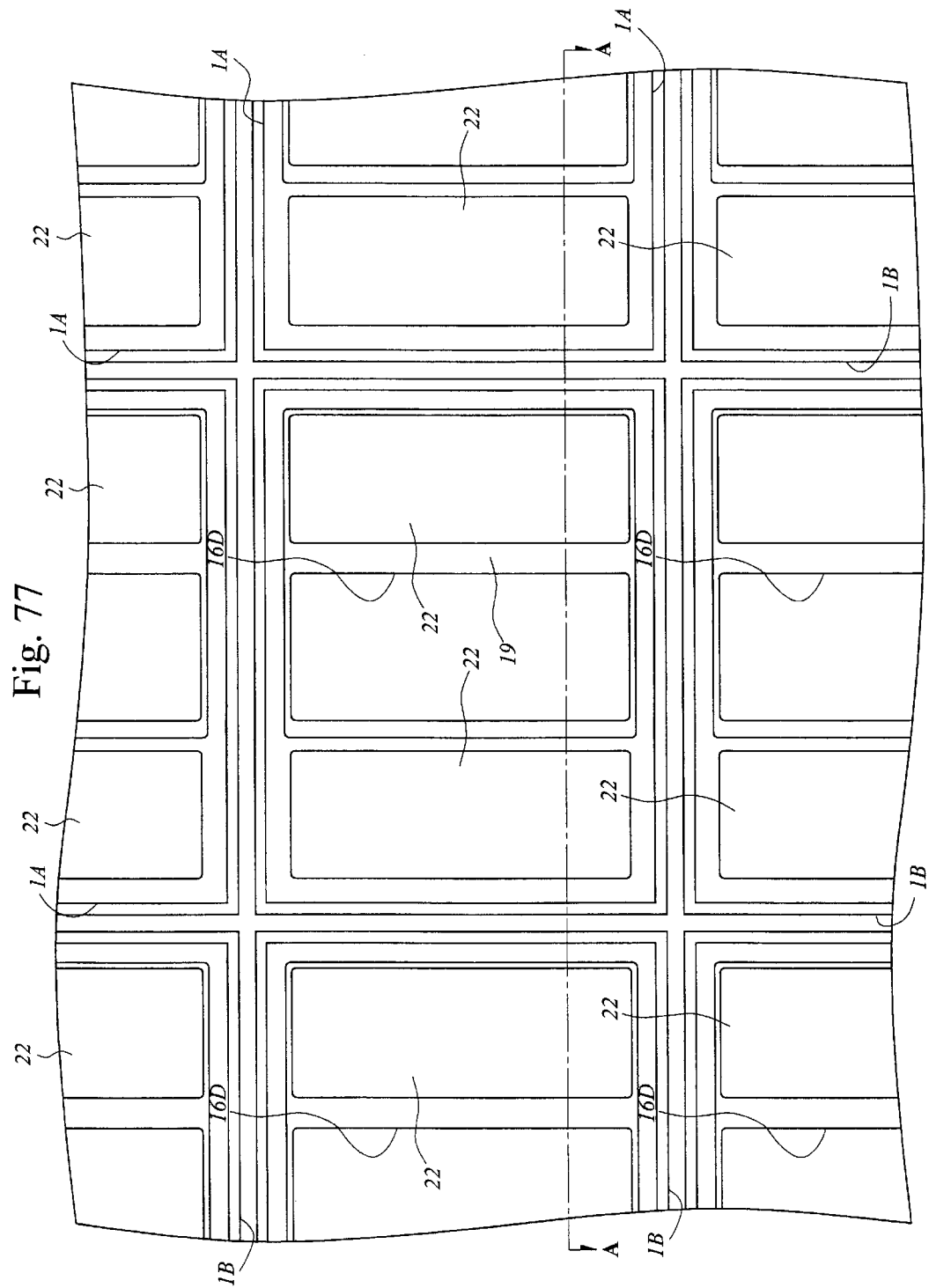
FIG. 77 is a plan view showing an essential part during a manufacturing process of the semiconductor device that is another embodiment of the present invention.
Figure 78:
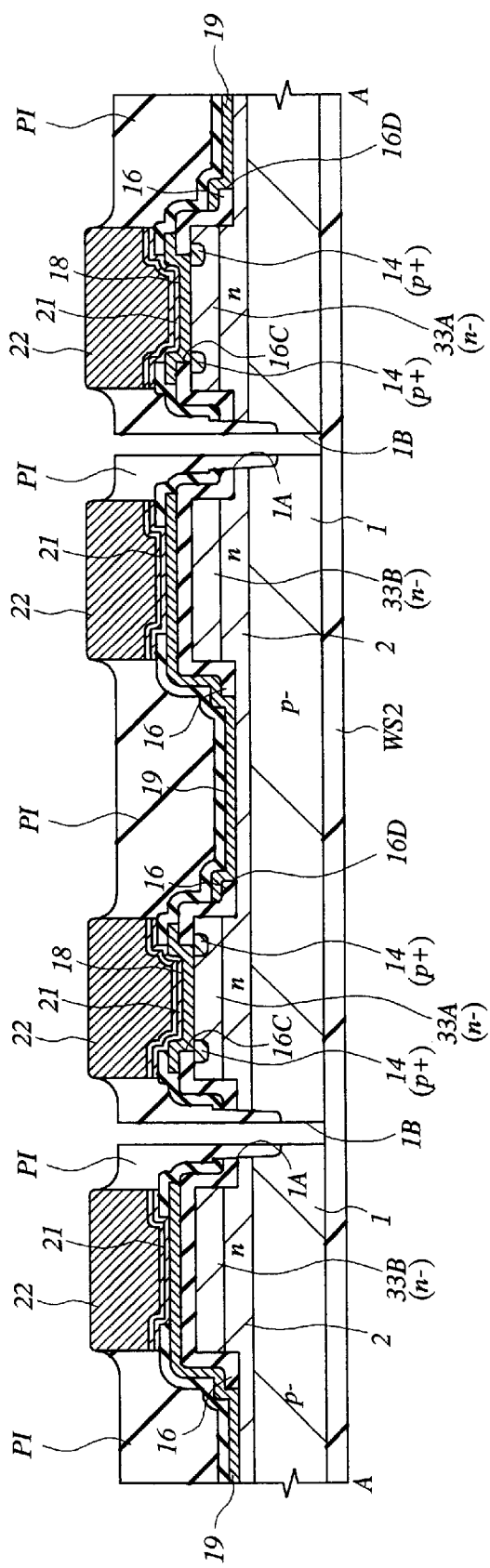
FIG. 78 is a cross-sectional view showing an essential part of the semiconductor device taken along line A—A of FIG. 77.

FIG. 77 is a plan view showing the Schottky barrier diode of the eighth embodiment. FIG. 78 is a cross-sectional view taken along line A—A of FIG. 77.

As shown in FIGS. 77 and 78, the Schottky barrier diode of the eighth embodiment has a groove part 1A formed similarly to the groove part 1A (see FIGS. 47 to 49) shown in the fifth embodiment, in the Schottky barrier diode of the fourth embodiment, wherein the groove part 1A is embedded in a photosensitive polyimide resin layer PI. Thus, a groove part 1B similar to the groove part 1B (see FIGS. 52 to 54) shown in the fifth embodiment along the groove part 1A is formed, and the semiconductor substrate 1 is divided into individual semiconductor chips. On each side face of the individual semiconductor chips after division, an n-type low resistance layer 2 is covered with the photosensitive polyimide resin layer PI. This can prevent the n-type low resistance layer 2 from being exposed from each side face of the semiconductor chips and can prevent occurrence of such malfunction that the n-type low resistance layer 2 is short-circuited in other conductive regions. Further, even on each side face of the semiconductor chips, the photosensitive polyimide resin layer PI covers at least the whole of the n-type low resistance layer 2. Therefore, it is possible to prevent moisture from entering into each semiconductor chip from the groove part 1A (see FIGS. 77 to 78) This can prevent the characteristic of the Schottky barrier diode of the eighth embodiment from deteriorating to thereby enhance the reliability.

The eighth embodiment as described above can also obtain the same effect as the fifth, sixth and seventh embodiments.

The inventions that have been made by the present inventors are concretely described based on the embodiments of the invention. However, the present invention is not limited to the above-mentioned embodiments, and, needless to say, various modifications thereof can be made without departing from the gist thereof.

For example, the method for forming a electrode bump in the embodiments may be applied to two terminal elements other than the diode. By using one of the electrode bumps as a dummy electrode in three terminal elements such as a transistor, mounting failure can be prevented.

As described in the embodiments, the method of: forming a groove part in a dividing region of a semiconductor substrate in a wafer state; coating a resin film onto the semiconductor substrate to embed the groove part in the resin film; and dividing the semiconductor substrate along the dividing region and thereby obtaining individual semiconductor chips, is not limited to the method for manufacturing a CSP type diode, and can be applied to other methods for manufacturing a CSP type semiconductor device. Therefore, the method can be applied without being affected by sizes of the semiconductor substrate and semiconductor chip.

The effects obtained by the representative inventions among the inventions disclosed in this application will be briefly described as follows.

(1) A lead for connecting a semiconductor chip of a diode, and a wire for electrically connecting a front electrode of the semiconductor chip and the lead can be omitted. Therefore, it is possible to make a package of a semiconductor device small.

(2) A pair of leads, and a wire for electrically connecting the front electrode of the semiconductor chip and the lead can be omitted. Therefore, it is possible to eliminate inductance and capacitance caused by them, and to improve a high-frequency characteristic of the semiconductor device.

(3) An area of a cathode electrode within a range of a reduced size of the semiconductor chip can be larger than that of an anode electrode, and a high-frequency resistance thereof can be reduced. Therefore, the high-frequency characteristic of the semiconductor device can further be improved.

(4) Difference of surface tension caused by solder melted in respective electrode bumps can be prevented from occurring at the time of mounting the semiconductor device. Therefore, it is possible to prevent occurrence of mounting failure due to a phenomenon caused by the surface tension difference, the phenomenon being such that the electrode of the semiconductor device is removed.

(5) On the side face of the semiconductor chip, a resin film covers at least the whole of the n-type semiconductor layer. Therefore, it is possible to prevent moisture from entering into the semiconductor chip from the side face of the semiconductor chip. This can prevent the characteristic of the semiconductor device from deteriorating.

(6) Since the periphery of a electrode bump is covered with a resin film, stress to the electrode bump caused at mounting can be eased.

What is claimed is:

1. A semiconductor device constituting a diode having a cathode electrode and an anode electrode on one main surface of a semiconductor substrate, wherein a plurality of electrode bumps each connected to said cathode electrode and said anode electrode is provided on said one main surface, and said plurality of electrode bumps is symmetrically arranged in the one main surface of said semiconductor substrate.

2. The semiconductor device according to claim 1, wherein said plurality of electrode bumps is symmetrically arranged in the one main surface of said semiconductor substrate and in a vertical and horizontal directions of said one main surface.

3. A semiconductor device constituting a diode having a cathode electrode and an anode electrode on one main surface of a semiconductor substrate, wherein a plurality of electrode bumps each connected to said cathode electrode and said anode electrode is provided on the said one main surface, and said plurality of electrode bumps is arranged in four corners of the one main surface of said semiconductor substrate.

4. A semiconductor device constituting a diode which has a semiconductor substrate having one main surface and the other main surface opposite to the one main surface, and an anode electrode and a cathode electrode formed over said one main surface, wherein said semiconductor substrate has an intrinsic epitaxial layer and an n-type semiconductor layer positioned under said epitaxial layer;

said anode electrode is connected to a high-density $p^+$-type region selectively formed in said epitaxial layer;

said cathode electrode has one portion connected to said n-type semiconductor layer exposed by selectively removing said epitaxial layer; and said cathode electrode has a plane area larger than said anode electrode.

5. A semiconductor device constituting a diode which has a semiconductor substrate having one main surface and the other main surface opposite to the one main surface, and an anode electrode and a cathode electrode formed over said one main surface, wherein said semiconductor substrate has a first conductive type epitaxial layer and a first conductive type semiconductor layer positioned under said epitaxial layer;

said cathode electrode has one portion connected to said first conductive type semiconductor layer exposed by selectively removing said epitaxial layer;

said cathode electrode has the other portion extending onto said epitaxial layer; and said anode electrode is selectively connected to one portion of said epitaxial layer to which said cathode electrode does not extend to thereby construct a Schottky barrier.

6. A semiconductor device constituting a diode having a cathode electrode and an anode electrode on one main surface of a semiconductor substrate, wherein said cathode electrode has a plane area larger than said anode electrode;

a plurality of electrode bumps each connected to said cathode electrode and said anode electrode is provided; and said one main surface except for the top of said electrode bump and at least one part of the side face of said semiconductor substrate are covered with an insulating film.

7. A semiconductor device constituting a diode which has a semiconductor substrate having one main surface and the other main surface opposite to the one main surface, and an anode electrode and a cathode electrode formed over said one main surface, wherein said semiconductor substrate has a first conductive type epitaxial layer, and a first conductive type high-density region formed in said epitaxial layer and extending from said one main surface to said other main surface, and a second conductive type high-density region selectively formed in said epitaxial layer and separated from said first conductive type high-density region;

said cathode electrode is connected to said first conductive type high-density region;

said anode electrode is connected to said second conductive type high-density region;

electrode bumps are each connected to said cathode electrode and said anode electrode; and said one main surface except for each top of said electrode bumps and at least the epitaxial layer exposed from the side face of said semiconductor substrate is covered with an insulating film.

8. The semiconductor device according to claim 7, wherein a part of each of said electrode bumps protrudes from the surface of said insulating film.

9. A semiconductor device constituting a diode which has a semiconductor substrate having one main surface and the other main surface opposite to the one main surface, and an anode electrode and a cathode electrode formed over said one main surface, wherein said semiconductor substrate has an intrinsic epitaxial layer and an n-type semiconductor layer positioned under said epitaxial layer;

said anode electrode is connected to a high-density $p^+$-type region selectively formed in said epitaxial layer;

said cathode electrode is connected to said n-type semiconductor layer exposed by selectively removing said epitaxial layer;

said cathode electrode has a plane area larger than said anode electrode; electrode bumps are each connected to said anode electrode and said cathode electrode; and said one main surface except for each top of said electrode bumps and at least said n-type semiconductor layer exposed from the side face of said semiconductor substrate are covered with an insulating film.

10. The semiconductor device according to claim 9, wherein a part of each of said electrode bumps protrudes from the surface of said insulating film.

11. A semiconductor device constituting a diode which has a semiconductor substrate having one main surface and the other main surface opposite to the one main surface, and an anode electrode and a cathode electrode formed over said one main surface, wherein said semiconductor substrate has a first conductive type epitaxial layer and a first conductive type semiconductor layer positioned under said epitaxial layer;

said cathode electrode has one portion connected to said first conductive type semiconductor layer exposed by selectively removing said epitaxial layer;

said cathode electrode has other portion extending onto said epitaxial layer;

said anode electrode is selectively connected to a portion of said epitaxial layer onto which said cathode electrode does not extend to thereby construct a Schottky barrier;

electrode bumps are each connected to said anode electrode and said cathode electrode; and said one main surface except for each top of said electrode bumps and at least said first conductive type semiconductor layer exposed from the side face of said semiconductor substrate are covered with an insulating film.

12. The semiconductor device according to claim 11, wherein a part of each of said electrode bumps protrudes from the surface of said insulating film.

13. A semiconductor device constituting a diode which has a semiconductor substrate having one main surface and the other main surface opposite to the one main surface, and an anode electrode and a cathode electrode formed over said one main surface.

wherein said semiconductor substrate has a first conductive type epitaxial layer, and a first conductive type high-density region selectively formed in said epitaxial layer and extending from said one main surface, and a second conductive type high-density region selectively formed in said first conductive type epitaxial layer and away from said first conductive type high-density region;

said cathode electrode is connected to said first conductive type high-density region in said one main surface;

said anode electrode is connected to said second conductive type high-density region in said one main surface; and further said cathode electrode has a plane area larger than said anode electrode.

14. The semiconductor device according to claim 13, wherein a cathode region connected to said cathode electrode has a plans area larger than an anode region connected to said anode electrode.

15. The semiconductor device according to claim 14, wherein a contact area of said cathode electrode and said cathode region is larger than that of said anode electrode and said anode region.

16. A semiconductor device constituting a diode having a cathode electrode and an anode electrode on one main surface of a semiconductor substrate, wherein said cathode electrode has a plane area larger than said anode electrode, and a contact area of said cathode electrode and a cathode region is larger than that of said anode electrode and an anode region.

17. A semiconductor device constituting a diode which has a semiconductor substrate having one main surface and the other main surface opposite to the one main surface, an anode electrode and a cathode electrode formed over said one main surface, wherein said semiconductor substrate has a first conductive type epitaxial layer and a first conductive type high-density region which is selectively formed in said epitaxial layer and which reaches to said one main surface, and a second conductive type high-density region selectively formed in said first conductive type epitaxial layer and away from said first conductive type high-density region;

said cathode electrode is connected to said first conductive type high-density region in said one main surface;

said anode electrode is connected to said second conductive type high-density region in said one main surface; and further an interval between said first conductive type high-density region and said second conductive type high-density region is larger than the thickness of said epitaxial layer.

18. A semiconductor device constituting a diode which has a semiconductor substrate having one main surface and the other main surface opposite to the one main surface, and an anode electrode and a cathode electrode formed over said one main surface.

wherein said semiconductor substrate has a first conductive type epitaxial layer, and a first conductive type high-density region formed in said epitaxial layer and extending from said one main surface to said other main surface and a second conductive type high-density region selectively formed in said epitaxial layer and away from said first conductive type high-density region;

said cathode electrode is connected to said first conductive type high-density region;

said anode electrode is connected to said second conductive type high-density region;

electrode bumps are each connected to said cathode electrode and said anode electrode; and said cathode electrode has a plane area larger than said anode electrode.

19. The semiconductor device according to claim 18, wherein a cathode region connected to said cathode electrode has a plane area larger than an anode region connected to said anode electrode.

20. The semiconductor device according to claim 19, wherein a contact area of said cathode electrode and said cathode region is larger than that of said anode electrode and said anode region.

* * * * *